United States Patent [19]
Ishigaki et al.

[11] Patent Number: 5,471,085
[45] Date of Patent: Nov. 28, 1995

[54] SEMICONDUCTOR DEVICE WITH POLYCRYSTALLINE SILICON EMITTER CONDUCTIVE LAYER

[75] Inventors: Yoshiyuki Ishigaki; Hiroki Honda; Kimiharu Uga; Masahiro Ishida, all of Hyogo, Japan

[73] Assignee: Mitsubishi Denki Kabushiki Kaisha, Tokyo, Japan

[21] Appl. No.: 310,526

[22] Filed: Sep. 22, 1994

[30] Foreign Application Priority Data

Oct. 4, 1993 [JP] Japan ..................... 5-248355

[51] Int. Cl.$^6$ .................................. H01L 29/72
[52] U.S. Cl. .............. 257/370; 257/587; 257/588; 257/591; 257/755
[58] Field of Search .................. 257/370, 377, 257/587, 588, 591, 754, 755

[56] References Cited

U.S. PATENT DOCUMENTS

| | | | |
|---|---|---|---|
| 4,299,024 | 11/1981 | Piotrowski | 257/555 X |
| 4,927,776 | 5/1990 | Soejima | 257/588 X |
| 5,150,184 | 9/1992 | Eklund | 257/588 X |
| 5,258,644 | 11/1993 | Tamba et al. | 257/588 X |

FOREIGN PATENT DOCUMENTS

| | | |
|---|---|---|
| 2-1160 | 1/1990 | Japan . |
| 2-105464 | 4/1990 | Japan . |
| 3-201528 | 9/1991 | Japan . |
| 4-152531 | 5/1992 | Japan . |
| 4-278576 | 10/1992 | Japan . |

OTHER PUBLICATIONS

"Shallow Junction Materializes in Both of Bipolar an DPMOS. We Fix our Aim Achieveing 0.5 μm", Hyakuse et al., Nikkei Micro Device, Feb., 1990, pp. 70–76.

"Bipolar Transistor Design for Low Process–Temperature 0.5 μm BiCMOS", M. Norishima et al., IEDM 89, pp. 237–240, 1989.

"Dopant Redistribution in Dual Gate W–Polycidecmos and its Improvement by RTA", H. Hayashida et al., Digest of Technical Papers, VLSI Technology, pp. 29–30, 1989.

Primary Examiner—William Mintel
Attorney, Agent, or Firm—Lowe, Price, LeBlanc & Becker

[57] ABSTRACT

An $n^+$ buried layer is formed on a surface of $p^-$ semiconductor substrate. An $n-$ epitaxial growth layer and an $n^+$ diffusion layer are formed on a surface of $n^+$ buried layer. A $p^-$ base region and $p^+$ external base region adjoining to each other are formed on a surface of an $n^-$ epitaxial growth layer. An $n^+$ emitter region is formed at a surface of $p^-$ base region. An emitter electrode is formed adjacently to $n^+$ emitter region. The emitter electrode is made of polycrystalline silicon doped with phosphorus at a concentration from $1 \times 10^{20} \text{cm}^{-3}$ to $6 \times 10^{20} \text{cm}^{-3}$.

5 Claims, 46 Drawing Sheets r : RESISTANCE OF FLAT PORTION
R : RESISTANCE OF STEPPED PORTION+CONTACT
    RESISTANCE(DIRECT CONTACT RESISTANCE)
— MEMORY CELL GROUND LINE 5,471,085

SEMICONDUCTOR DEVICE WITH POLYCRYSTALLINE SILICON EMITTER CONDUCTIVE LAYER

BACKGROUND OF THE INVENTION

1. Field of the Invention

The present invention relates to a semiconductor device and a method of manufacturing the same, and in particular to a semiconductor device including bipolar transistors and a method of manufacturing the same.

2. Description of the Background Art

In recent years, performance of industrial equipments such as computers has been remarkably improved. A Bi-CMOS (Bipolar Complementary Metal Oxide Semiconductor) structure in which a bipolar transistor and a CMOS transistor are formed on the same semiconductor substrate has attracted the attention from the aspect of complying with the aforementioned remarkable performance. The Bi-CMOS structure can achieve high-speed operation from of the bipolar transistor, and high integration and low power consumption feature of the CMOS transistor.

A conventional semiconductor is below particularly in connection with the structure of Bi-CMOS structure including bipolar transistors.

FIG. 62 is a cross section schematically showing a structure of the conventional semiconductor device. Referring to FIG. 62, the Bi-CMOS structure has a bipolar transistor region 510, an nMOS transistor region 520 and a pMOS transistor region 540.

In bipolar transistor region 510, an n⁺ buried layer 503 is formed on a surface of a p⁻ semiconductor substrate 501. An n⁻ epitaxial growth layer 505 and an n⁺ diffusion layer 513 for leading out a collector are formed on the surface of n buried layer 503.

A p base region 507 and a p⁺ external base region 511 adjoining to each other are formed on the surface of n⁻ epitaxial growth layer 505. An n emitter region 509 is formed on p⁻ base region 507.

A first interlayer insulating film 563 is formed over the surface of bipolar transistor 510. First interlayer insulating film 563 is provided with a contact hole 563a reaching n⁺ emitter region 509. An emitter electrode 515 is formed on the surface of first interlayer insulating film 563 and is in contact with n⁺ emitter region 509 through contact hole 563a. Emitter electrode 515 is made of polycrystalline silicon doped with arsenic (As).

Emitter electrode 515 is covered with a second interlayer insulating film 565 formed on the surface of first interlayer insulating film 563. Second interlayer insulating film 565 is provided with a contact hole 565a reaching emitter electrode 515. A conductive layer 571a is in contact with emitter electrode 515 through contact hole 565a.

First and second interlayer insulating films 563 and 565 are provided with contact holes 565b and 565c, which reach p⁺ external base region 511 and n⁺ diffusion layer 513, respectively. Conductive layers 571b and 571c are in contact with p⁺ external base region 511 and n⁺ diffusion region 513 through contact holes 565b and 565c, respectively.

In nMOS transistor region 520, a p⁻ well region 523 is formed on the surface of p⁻ semiconductor substrate 501. A plurality of nMOS transistors 530 are formed on the surface of p⁻ well region 523.

Each nMOS transistor 530 includes a pair of n-type source/drain regions 525, a gate oxide film 527 and a gate electrode 529.

Each pair of n-type source/drain regions 525 are formed on p⁻ well region 523 with a predetermined space between each other. n-type source/drain region 525 has an LDD (Lightly Doped Drain) structure formed of a relatively lightly doped n- impurity region 525a and a relatively heavily doped n⁺ impurity region 525b. A gate electrode 529 is formed on a region between paired n-type source/drain regions 525 with a gate oxide film 527 therebetween.

The nMOS transistor 530 is covered with first interlayer insulating film 563. First interlayer insulating film 563 is provided with an aperture 563b which reaches one of paired source/drain regions 525. An interconnection layer 535 is formed on first interlayer insulating film 563 and is in contact with n-type source/drain region 525 through aperture 563b. Interconnection layer 535 is made of polycrystalline silicon doped with arsenic.

The surface of interconnection layer 535 is covered with second interlayer insulating film 565, which is provided with a contact hole 565d reaching interconnection layer 535. A conductive layer 571d is in contact with interconnection layer 535 through contact hole 565d.

First and second interlayer insulating films 563 and 565 are provided with a contact hole 565e reaching n-type source/drain region 525. A conductive layer 571e is in contact with n-type source/drain region 525 through contact hole 565e.

In pMOS transistor region 540, an n⁺ buried layer 541 is formed on the surface of p⁻ semiconductor substrate 501. An n⁻ well region 543 is formed on the surface of n⁺ buried layer 541. A pMOS transistor 550 is formed on the surface of n⁻ well region 543.

The pMOS transistor 550 has a pair of p⁺ source/drain regions 545, a gate oxide film 547 and a gate electrode 549.

A pair of p⁺ source/drain regions 545 are formed on the surface of n- well region 543 with a predetermined space between each other. Gate electrode 549 is formed on a region between paired p⁺ source/drain regions 545 with a gate oxide film 547 therebetween.

pMOS transistor 550 is covered with first and second interlayer insulating films 563 and 565. First and second interlayer insulating films 563 and 565 are provided with contact holes 565f reaching paired p⁺ source/drain regions 545. Conductive layers 571f are in contact with p⁻ source/drain regions 545 through contact holes 565f.

Element isolating oxide films 561 are provided for electrically isolating regions 510, 520 and 540 and others from each other.

A method of manufacturing the conventional semiconductor device is described below.

FIGS. 63 to 83 are schematic cross sections showing a process of manufacturing the conventional semiconductor device in accordance with the order of process steps. Referring first to FIG. 63, a silicon oxide film 581 is formed on the whole surface of p⁻ semiconductor substrate 501, for example, by thermal oxidation. Thereafter, silicon oxide film 581 is patterned into a predetermined configuration. Using silicon oxide film 581 thus patterned as a mask, impurity such as antimony (Sb) is implanted into p⁻ semiconductor substrate 501. Then, heat treatment at about 1100° C. is executed for about 2 hours, whereby n⁺ layers 503a and 541a are formed on the surface of p⁻ semiconductor substrate 501. Thereafter, silicon oxide film 581 is removed.

Referring to FIG. 64, n⁻ epitaxial growth layer 505 is formed on the whole surface of p⁻ semiconductor substrate 501. Thereby, such a structure is completed that n⁺ buried layers 503 and 541 are buried between p⁻ semiconductor substrate 501 and an n⁻ epitaxial growth layer 505.

Referring to FIG. 65, an n-type impurity such as phosphorus (P) is introduced into n⁻ epitaxial growth layer 543 located above n⁺ buried layer 541 and then is diffused. Thereby, n⁻ well region 543 is formed above n⁺ buried layer 541. p-type impurity such as boron (B) is introduced into a predetermined region in n- epitaxial growth layer 505 and then is diffused. Thereby, p⁻ well region 523 is formed.

Referring to FIG. 66, element isolating oxide films 561 are formed at predetermined regions, for example, by an LOCOS (Local Oxidation of Silicon) method.

Referring to FIG. 67, a silicon oxide film (SiO₂) 583 and a silicon nitride film (Si₃N₄) 585, which have apertures at predetermined regions and are 300 Å and 1000 Å in thickness, respectively, are formed by deposition successively on the whole surface. Using silicon oxide film 583 and silicon nitride film 585 as a mask, the structure is exposed to an atmosphere containing, e.g., POCl₃. Thereby, phosphorus is diffused into n⁻ epitaxial growth layer 505 to form n⁺ diffusion layer 513 for leading the collector. Thereafter, silicon nitride film 585 and silicon oxide film 583 are successively removed.

Referring to FIG. 68, a thermal oxidation film 527a is formed on the whole surface by thermal oxidation. Then, an LPCVD (Low Pressure Chemical Vapor Deposition) method is used to form a polycrystalline silicon film 529a and a silicon oxide film 531a each having a thickness of about 2000 Å by successive deposition. The silicon oxide film 531a and polycrystalline silicon film 529a are patterned into a predetermined configuration by photolithography and etching.

Referring to FIG. 69, gate electrodes 529 and 549 having the predetermined configuration are formed by the aforementioned patterning.

Referring to FIG. 70, photoresist 591a is applied to the whole surface, and then is exposed and developed. Thereby, a resist pattern 591a exposing the nMOS transistor region is formed. Using resist pattern 591a and gate electrode 529 as a mask, n-type impurity is implanted to form relatively lightly doped n⁻ impurity region 525a on the surface of p⁻ well region 523. Thereafter, resist pattern 591a is removed.

Referring to FIG. 71, a silicon oxide film 533a is formed over the whole surface. Thereafter, anisotropic etching is effected on silicon oxide film 533a.

Referring to FIG. 72, by the aforementioned anisotropic etching, side wall oxide films 533 and 553 covering side walls of gate electrodes 529 and 549 are formed. This anisotropic etching removes thin silicon oxide film 527a at a lower level, whereby gate oxide films 527 and 547 are formed.

Referring to FIG. 73, photoresist 591b is applied to the whole surface, and is exposed and developed. Thereby, resist pattern 591b exposing the nMOS transistor region is formed. Using resist pattern 591b, gate electrodes 529 and side wall oxide films 533 as a mask, n-type impurity is implanted. This implantation forms relatively heavily doped n⁺ impurity regions 525b on the surface of p⁻ well region. The n⁻ impurity regions 525a and n⁺ impurity regions 525b form n-type source/drain regions 525 having a LDD structure. Thereby, nMOS transistors 530 are formed. Thereafter, resist pattern 591 is removed.

Referring to FIG. 74, photoresist 591c is applied to the whole surface, and is exposed and developed to form resist pattern 591c which exposes the pMOS transistor region and a predetermined region of the bipolar transistor. Using resist pattern 591c as a mask, p-type impurity is implanted into n⁻ well region 543 and n⁻ epitaxial growth layer 505. This implantation forms p⁺ source/drain regions 545 at the pMOS transistor region and also forms p⁺ external base region 511 at the bipolar transistor region. Thereby, pMOS transistor 550 is formed. Thereafter, resist pattern 591c is removed.

Referring to FIG. 75, photoresist 591d is applied to the whole surface, and is exposed and developed to form resist pattern 591d which exposes a predetermined region of the bipolar transistor. Using resist pattern 591d as a mask, p-type impurity is implanted into n⁻ epitaxial growth layer 505. By this implantation and others, p⁻ base region 507 adjoining to p⁺ external base region 511 are formed. Thereafter, resist pattern 591d is removed.

Referring to FIG. 76, first interlayer insulating film 563 made of, e.g., a silicon oxide film is formed on the whole surface. The surface of first interlayer insulating film 563 has an unevenness reflecting a difference in level of lower layers.

Referring to FIG. 77, photoresist 591e is applied to the whole surface, and is exposed and developed to form resist pattern 591e having a predetermined configuration. Using this resist pattern 591e as a mask, processing such as RIE (Reactive Ion Etching) is effected on the first interlayer insulating film 563. In first interlayer insulating film 563, the aforementioned processing such as RIE forms emitter aperture 563a which partially exposes the surface of p⁺ base region 507, and also forms aperture 563b which exposes n-type source/drain region 525. Thereafter, resist pattern 591e is removed.

Referring to FIG. 78, the LPCVD method is executed to form polycrystalline silicon film 515a on the whole surface of first interlayer insulating film 563.

Referring to FIG. 79, arsenic is implanted into the whole surface of polycrystalline silicon film 515a. Thereafter, RTA (Rapid Thermal Annealing) or the like is executed to effect high temperature thermal treatment thereon, for example, at a temperature of about 1050° C. for about 30 seconds. Thereby, arsenic is uniformly diffused into doped polycrystalline silicon film 515b, and is also diffused into n⁻ epitaxial growth layer 505, so that n⁺emitter region 509 is formed.

Referring to FIG. 80, doped polycrystalline silicon film 515b is patterned into a predetermined configuration by photolithography and etching. This forms emitter electrode 515 connected to n⁺ emitter region 509 through emitter aperture 563a, and interconnection layer 535 connected to n-type source/drain region 525 through aperture 563b.

Referring to FIG. 81, second interlayer insulating film 565 is formed on the whole surface of first interlayer insulating film 563 to cover emitter electrode 515 and interconnection layer 535. Photoresist 591f is applied to the whole surface of second interlayer insulating film 565, and is exposed and developed. Resist pattern 591f thus formed and having a predetermined configuration is used as a mask for effecting anisotropic etching. This etching forms contact holes 565a, 565b, 565c, 565d, 565e and 565f. Thereafter, resist pattern 591f is removed.

Referring to FIG. 82, conductive layers 571a, 571b, 571c, 571d, 571e and 571f are formed, which are in contact with conductive regions or others exposed at the bottoms through contact holes 565a, 565b, 565c, 565d, 565e and 591f, respectively.

In the conventional method of manufacturing the semiconductor device described above, it is necessary to carry out heat treatment by RTA in the process shown in FIG. 79. According to the RTA, wafer only is thermally processed at a high temperature by lamp heating. The heat treatment by the RTA is required because of the following reason.

In the conventional method of manufacturing the semiconductor device, emitter electrode 515 and interconnection layer 535 shown in FIG. 62 are formed by patterning the polycrystalline silicon film into which impurity is ion-implanted.

More specifically, at the process shown in FIGS. 78 and 79, impurity is ion-implanted into polycrystalline silicon film 515a. The impurity is injected from above the substrate and perpendicularly into the substrate. Therefore, non-implanted regions in which an impurity has not been implanted are formed along the side walls of aperture 563b and emitter aperture 563a in doped polycrystalline silicon film 515b within regions $S_1$ and $S_2$ in FIG. 79.

FIG. 83 is an enlarged fragmentary cross section showing region $S_1$ in FIG. 79 for explaining the fact that there is generated the non-implanted regions. Referring to FIG. 83, the side wall of aperture 563b has a height $H_2$ from the surface of p⁻ well region 523. This height $H_2$ is much larger than a thickness $T_p$ of doped polycrystalline silicon film 515a. Therefore, it is very difficult to ion-implant the impurity into portions along the side walls.

In particular, in the MOS transistor region, a gate part portion must be formed on the substrate. Therefore, height $H_2$ of side wall of first interlayer insulating film 563 is large due to a height $H_1$ of the gate portion (i.e., gate oxide film 527, gate electrode 529 and insulating film 531). Meanwhile, in the bipolar transistor region, a gate electrode is not necessary. Therefore, height $H_2$ of side wall of aperture 563b formed in the MOS transistor region is larger than the height of side wall of emitter aperture formed in the bipolar transistor region within region $S_2$ in FIG. 79. As is apparent from the above, impurity is hardly implanted into the portion of polycrystalline silicon film 515a along the high side wall of aperture 563b.

When the sidewall has the non-implanted region, a so-called non-diffusion region 515a, i.e., region into which impurity is not diffused, is formed at the sidewall of doped polycrystalline silicon film 563b as shown in FIG. 84, unless high temperature heat treatment such as RTA is not effected.

Interconnection layer 515b generally has the interconnection resistance as shown in FIG. 85. The interconnection resistance is represented as combination of resistances of portions other than that within aperture 563b (which will be referred to as "resistances of flat portions"), resistances of the side wall of aperture 563b and a resistance of a contact portion (boundary surface) between aperture 563b and source/drain region 525. Therefore, if non-diffusion region 515a is formed, the resistance of the sidewall increases, so that the interconnection resistance of interconnection layer 515b locally increases.

In order to prevent increase of the interconnection resistance, it is necessary to uniformly diffuse the impurity for preventing generation of the non-diffusion region. Therefore, the high temperature heat treatment by RTA is required so as to uniformly diffuse the impurity up to the sidewall of aperture 563b as shown in FIG. 84.

The conventional method of manufacturing the semiconductor device requires the heat treatment by RTA as described above.

Due to the heat treatment by RTA, the conventional semiconductor device and the method of manufacturing the same have the following problems: (1) the degree of integration cannot be improved; and (2) the interconnection resistance of the emitter electrode and others can be reduced. These problems are described below in greater detail.

(1) The degree of integration.

Elimination of the heat treatment is essential in order to improve the degree of integration and the performance of the conventional semiconductor device according to a scaling rule. The same is especially true with respect to the MOS transistor.

Referring to FIG. 86, the heat treatment by RTA is executed for uniform diffusion of impurity into doped polycrystalline silicon film 515b as described above. The high temperature heat treatment, however, causes n⁺ impurity region 525b to spread in a depth direction indicated by arrows $J_1$ and a width direction indicated by arrows $J_2$. Thus, a so-called shallow junction cannot be formed.

In such case, n⁺ source/drain regions 525b spread as shown by dotted line in the figure, so that punch-through is likely to occur. Since n⁻ impurity regions 525a are taken into n⁺ impurity regions 525b, it is difficult to reduce a hot electron effect.

In order to achieve the high integration, a gate length $L_{G1}$ of gate electrode 529 may be reduced, in which case a distance between adjoining n⁺ source/drain regions 525b decreases. Therefore, heat treatment by RTA will promote the disadvantageous punch-though and impair a characteristic relating to resistance against hot electrons. Therefore, gate length $L_{G1}$ of gate electrode 529 cannot be reduced, which makes it difficult to improve the degree of integration. As described above, the conventional method of manufacturing the semiconductor device cannot sufficiently improve the degree of integration because it requires the high temperature heat treatment such as RTA.

(2) The interconnection resistance of the emitter electrode and others.

Generally, if arsenic and phosphorus are introduced into polycrystalline silicon, segregation of arsenic at grain boundaries in the polycrystalline silicon is more likely than phosphorus. Therefore, if arsenic and phosphorus are individually introduced at the same concentration into the polycrystalline silicon, a concentration of carriers (activated impurity in grains) of arsenic would be lower than that of phosphorus by a degree corresponding to the segregation of arsenic at the grain boundaries.

FIG. 87 shows a relationship between an annealing temperature and a carrier concentration in the case where phosphorus and arsenic are individually introduced into polycrystalline silicon at a concentration of $2 \times 10^{19}$ cm⁻³. As is seen from FIG. 87, in the case where arsenic and phosphorus are individually implanted to attain the same concentration, the concentration of carriers of phosphorus is higher than that of arsenic regardless of the annealing temperature. If these are introduced to have the same concentration, therefore, phosphorus can achieve a lower resistance. From a viewpoint of the low resistance, therefore, polycrystalline silicon doped with phosphorus is more suitable to the interconnection layer than that doped with arsenic.

FIG. 88 shows a relationship between an impurity concentration and a resistivity when phosphorus and arsenic are individually introduced into polycrystalline silicon. In the case of arsenic shown in FIG. 88, the resistivity is saturated and will no longer lower when the concentration attains $2 \times 10^{20}$ cm⁻³ or more. Meanwhile, in the case of phosphorus, the resistivity lowers even at the concentration higher than the aforementioned value. As can be seen also from this result, polycrystalline silicon doped with phosphorus is more suitable to the interconnection layer than polycrystalline silicon doped with arsenic from the viewpoint of low resistance.

However, phosphorus is diffused more rapidly than arsenic. Therefore, if polycrystalline silicon 515b were doped with phosphorus at the conventional manufacturing step shown in FIG. 79, and then RTA were effected to form emitter region 509 in FIG. 80, emitter region 509 would spread excessively, in which case an intended base width might not be obtained.

FIG. 89 shows a reason by which the intended base width cannot be obtained if the polycrystalline silicon is doped with phosphorus. Referring to FIG. 89, high temperature heat treatment promotes diffusion of phosphorus from emitter electrode 515 toward $p^-$ base region 507 in a direction indicated by arrow J. Thereby, $n^+$ emitter region 509 is formed deep, resulting in reduction of a width $W_2$ of $p^-$ base region 507 immediately under $n^+$ emitter region 509. If width $W_2$ of $p^-$ base region 507 is small, a collector-emitter breakdown voltage of the npn bipolar transistor decreases.

In view of the reduction of the breakdown voltage, it has been difficult to introduce phosphorus at a high concentration into emitter electrode 515. In the conventional semiconductor device, therefore, the phosphorus concentration cannot be larger than $1\times10^{20}$ $cm^{-3}$ if phosphorus is introduced into emitter electrode 515. Although it is preferable to introduce phosphorus from the viewpoint of the interconnection resistance, the concentration of phosphorus cannot be high because of the aforementioned reason, so that it is impossible to reduce the interconnection resistance of emitter electrode 515 in the prior art.

Consequently, according to the conventional semiconductor device and the method of manufacturing the same, it is impossible to further reduce the overall interconnection resistance of the emitter electrode while maintaining a good breakdown voltage characteristic.

SUMMARY OF THE INVENTION

An object of the invention is to provide a method of manufacturing a semiconductor device of which degree of integration can be easily improved.

Another object of the invention is to provide a semiconductor device, in which interconnection resistances of an emitter electrode and others are reduced, as well as a method of manufacturing the same.

A method of manufacturing a semiconductor device of the invention includes the following steps.

First, a collector impurity region of a first conductivity type is formed on a main surface of a semiconductor substrate. A base impurity region of a second conductivity type is formed on the main surface of the semiconductor substrate within the collector impurity region. An emitter impurity region of the first conductivity type is formed at the main surface of the semiconductor substrate with the base impurity region. A vapor deposition method is carried out to form polycrystalline silicon which is doped with phosphorus and is in contact with the emitter impurity region.

According to the method of manufacturing the semiconductor device of the invention, the polycrystalline silicon doped with the phosphorus is formed by the vapor deposition method. Thus, the phosphorus is introduced into the polycrystalline silicon simultaneously with the formation thereof by the vapor deposition method. According to this method, the phosphorus is uniformly introduced into the polycrystalline silicon. Therefore, it is possible to eliminate a heat treatment at a high temperature by RTA which has been required for uniform diffusion of the impurity into the polycrystalline silicon. Owing to elimination of the heat treatment by the RTA, it is possible to prevent spreading of $n^+$ impurity region forming an LDD structure particularly in an MOS transistor. Therefore, it is possible to prevent problems such as punch through and deterioration of characteristics relating to a resistance against hot electrons in the MOS transistor. Accordingly, sizes of various portions such as a gate length of the MOS transistor can be reduced, which facilitates increase of a degree of integration.

Since it is possible to eliminate the heat treatment by RTA, it is naturally possible to prevent diffusion of impurity from an emitter electrode into a base impurity region, which may be caused during the heat treatment. Such a problem can also be prevented that the emitter impurity region is formed deep in the base impurity region due to the above diffusion and thereby a width of the base impurity region is reduced. Accordingly, even if a concentration of the phosphorus in the emitter electrode is increased, a collector-emitter breakdown voltage of a bipolar transistor does not deteriorate, and a good breakdown voltage characteristic can be maintained. Therefore, an interconnection resistance of the emitter electrode can be reduced while maintaining a good breakdown voltage characteristic.

A semiconductor device according to the invention includes a semiconductor substrate, a collector impurity region of a first conductivity type, a base impurity region of a second conductivity type, an emitter impurity region of the first conductivity type, and a conductive layer. The semiconductor substrate has a main surface. The collector impurity region of the first conductivity type is formed at the main surface of the semiconductor substrate. The base impurity region of the second conductivity type is formed at the main surface of the semiconductor substrate within the base impurity region of the second conductivity type. The emitter impurity region of the first conductivity type is formed at the main surface of the semiconductor substrate with the base impurity region. The conductive layer is in contact with the emitter impurity region. The conductive layer contains polycrystalline silicon into which phosphorus is introduced at a concentration not less than $1\times10^{20}$ $cm^{-3}$.

The semiconductor device according to the above aspect of the invention, the concentration of the phosphorus can be increased. Therefore, the concentration of the phosphorus which is introduced substantially uniformly into the emitter electrode can be at least $1\times10^{20}$ $cm^{-3}$ which cannot be attained by the prior art, and thereby the interconnection resistance of the emitter electrode can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Embodiment 1

Figure 1:
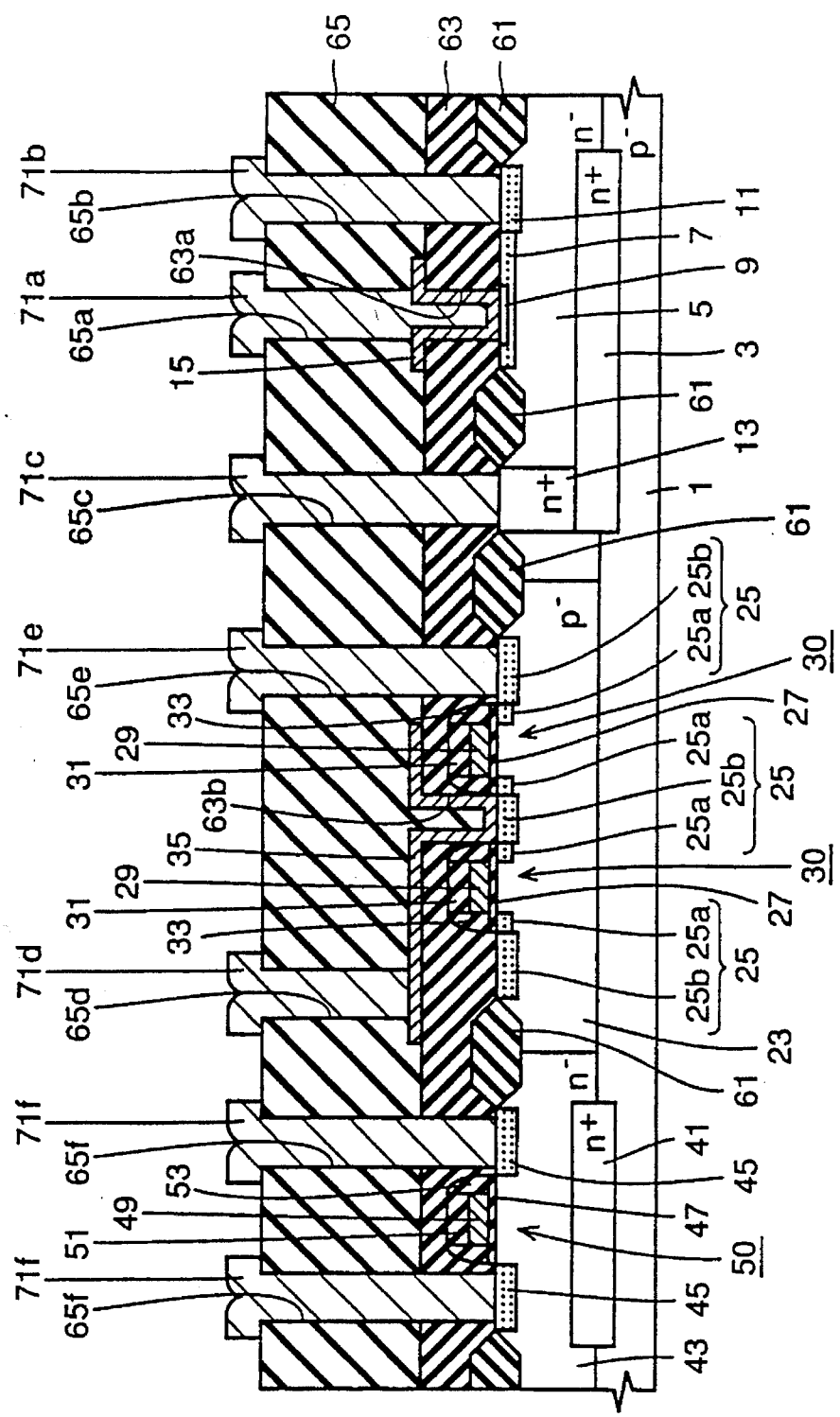
FIG. 1 is a schematic cross section showing a structure of a semiconductor device of a first embodiment of the invention.

Referring to FIG. 1, a Bi-CMOS structure has a bipolar transistor region 10, an nMOS transistor region 20 and a pMOS transistor region 40, all of which are formed on a common semiconductor substrate.

In bipolar transistor region 10, an n$^+$ buried layer 3 is formed on a surface of a p$^-$ semiconductor substrate 1 made of silicon doped with impurity. The p$^-$ semiconductor substrate 1 is doped with p-type impurity at a concentration from $1\times10^{15}$ to $5\times10^{15}$ cm$^{-3}$. The n$^+$ buried layer 3 is doped with n-type impurity at a concentration of about $5\times10^{20}$ cm$^{-3}$. On the surface of n$^+$ buried layer 3, there are formed an n$^-$ epitaxial growth layer 5 and an n$^+$ diffusion layer 13 for leading a collector. The n$^-$ epitaxial growth layer 5 is doped with n-type impurity at a concentration of about $1\times10^{16}$ cm$^{-3}$. The n$^+$ diffusion layer 13 is doped with n-type impurity at a concentration from about $5\times10^{20}$ to about $1\times10^{21}$ cm$^{-3}$.

A p$^-$ base region 7 and a p$^+$ external base region 11 adjoining to each other are formed on the surface of n$^-$ epitaxial growth layer 5. The p$^-$ base region 7 is doped with p-type impurity at a concentration of $1\times10^{17}$ to $1\times10^{20}$ cm$^{-3}$. p$^+$ external base region 11 is doped with p-type impurity at a concentration from $5\times10^{20}$ to $1\times10^{20}$ cm$^{-3}$. An n$^+$ emitter region 9 is formed at a surface of p$^-$ base region 7. The n$^+$ emitter region 9 is doped with n-type impurity at a concentration of $5\times10^{20}$ to $1\times10^{21}$ cm$^{-3}$.

A first interlayer insulating film 63 having a flattened top surface is formed over the surface of bipolar transistor region 10. First interlayer insulating film 63 is provided with an emitter aperture 63a reaching n$^+$ emitter region 9. An emitter electrode 15 is formed on first interlayer insulating film 63 and is in contact with n$^+$ emitter region 9 through emitter aperture 63a.

Emitter electrode 15 is made of polycrystalline silicon doped with phosphorus at a concentration in a range of from $1\times10^{21}$ cm$^{-3}$ to $6\times10^{20}$ cm$^{-3}$.

Emitter electrode 15 is covered with a second interlayer insulating film 65 formed on first interlayer insulating film 63. Second interlayer insulating film 65 is provided with a contact hole 65a reaching emitter electrode 15. A conductive layer 71a is formed on second interlayer insulating film 65 and is in contact with emitter electrode 15 through contact hole 65a.

First and second interlayer insulating films 63 and 65 are provided with a contact hole 65b reaching p$^+$ external base region 11 and a contact hole 65c reaching n$^+$ diffusion layer 13. Conductive layers 71b and 71c are in contact with p$^-$ external base region 11 and n$^+$ diffusion layer 13 through contact holes 65b and 65c, respectively.

In nMOS transistor region 20, a p$^-$ well region 23 is formed on the surface of p$^-$ semiconductor substrate 1. The p$^-$ well region 23 is doped with p-type impurity at a concentration of about $1\times10^{16}$ cm$^{-3}$. The nMOS transistors 30 are formed on the surface of p$^-$ well region 23.

Each nMOS transistor 30 has a pair of n-type source/drain regions 25, a gate oxide film 27 and a gate electrode 29.

Each of paired n-type source/drain regions 25 has an LDD structure formed of two layers, i.e., a lightly doped n$^-$ impurity region 25a and a heavily doped n$^+$ impurity region 25b. The n$^-$ impurity region 25a is doped with n-type impurity at a concentration of about $1\times10^{18}$ cm$^{-3}$. The n$^+$ impurity region 25b is doped with n-type impurity at a concentration from $5\times10^{20}$ to $1\times10^{21}$ cm$^{-3}$. A gate electrode 29 is formed on a region between paired source/drain regions 25 with a gate oxide film 27 therebetween.

An insulating film 31 made of a silicon oxide film is formed on the surface of each gate electrode 29. A side wall of gate electrode 29 is covered with a side wall oxide film 33.

The nMOS transistor region 20 is covered with first interlayer insulating film 63 having a flattened top surface. First interlayer insulating film 63 is provided with an aperture 63b which reaches one of paired n-type source/drain regions 25. An interconnection layer 35 is formed on first interlayer insulating film 63 and is in contact with n-type source/drain regions 25 through aperture 63b.

Interconnection layer 35 is made of polycrystalline silicon doped with phosphorus at a concentration from $1\times10^{20}$ cm$^{-3}$ to $6\times10^{20}$ cm$^{-3}$.

The surface of interconnection layer 35 is covered with a second interlayer insulating film 65 formed on the surface of first interlayer insulating film 63. Second interlayer insulating film 65 is provided with a contact hole 65d reaching a surface of a portion of interconnection layer 35. A conductive layer 71d is in contact with interconnection layer 35 through contact hole 65d.

First and second interlayer insulating films 63 and 65 are provided with a contact hole 65e reaching the other of paired n-type source/drain regions 25. A conductive layer 71e is in contact with n-type source/drain region 25 via contact hole 65e.

In pMOS transistor region 40, an n$^+$ buried layer 41 is formed on the surface of p$^-$ silicon substrate 1. The n$^+$ buried layer 41 is doped with n-type impurity at a concentration of about $5\times10^{20}$ cm$^{-3}$. The n$^-$ well region 43 is formed on the surface of n$^+$ buried layer 41. The n$^-$ well region 43 is doped with n-type impurity at a concentration of about $1\times10^{16}$ cm$^{-3}$. A pMOS transistor 50 is formed on the surface of n$^-$ well region 43.

The pMOS transistor 50 has a pair of p$^-$ source/drain regions 45, a gate oxide film 47 and a gate electrode 49.

Paired source/drain regions 45 are formed on the surface of n$^-$ well region 43 and are spaced by a predetermined distance from each other. The p$^-$ source/drain regions 45 are doped with p-type impurity at a concentration from $5\times10^{20}$ to $1\times10^{21}$ cm$^{-3}$. A gate electrode 49 is formed on a region between paired source/drain regions 45 with a gate oxide film 47 therebetween.

An insulating film 51 made of a silicon oxide film is formed on the surface of gate electrode 49. A side wall of gate electrode 49 is covered with a sidewall oxide film 53.

The surface of pMOS transistor region 40 is covered with first interlayer insulating film 63 having the flattened top surface. Second interlayer insulating film 65 is formed on the surface of first interlayer insulating film 63. First and second interlayer insulating films 63 and 65 are provided with contact holes 65f reaching paired p$^+$ source/drain regions 45. A conductive layer 71f is in contact with each of p$^+$ source/drain regions 45 through contact hole 65f.

Element isolating oxide films 61 are provided for electrically isolating respective regions 10, 20 and 40, and others from each other.

A method of manufacturing the semiconductor device of the first embodiment of the invention will be described below.

Figure 2:
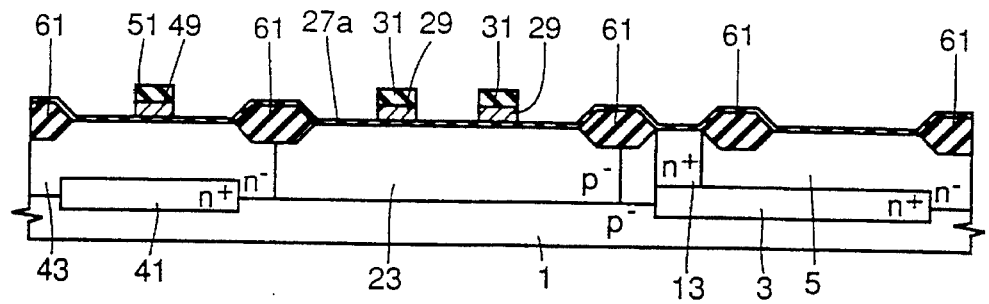
FIGS. 2 to 16 are schematic cross sections showing a process of manufacturing the semiconductor device of the first embodiment of the invention in accordance with the order of process steps.
Figure 69:
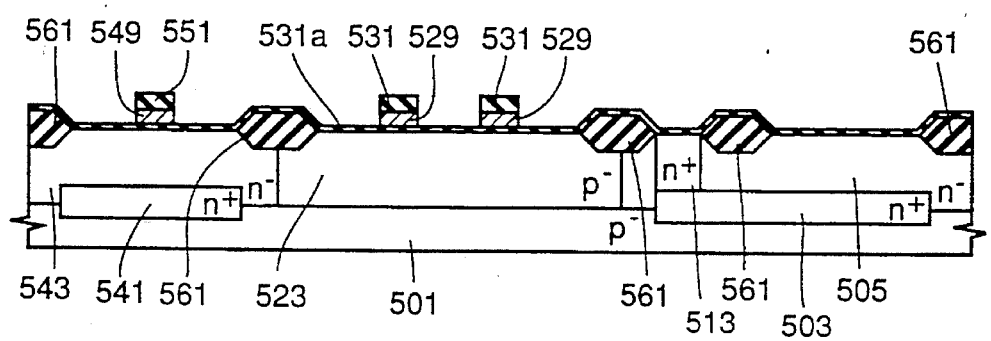
Figure 70:
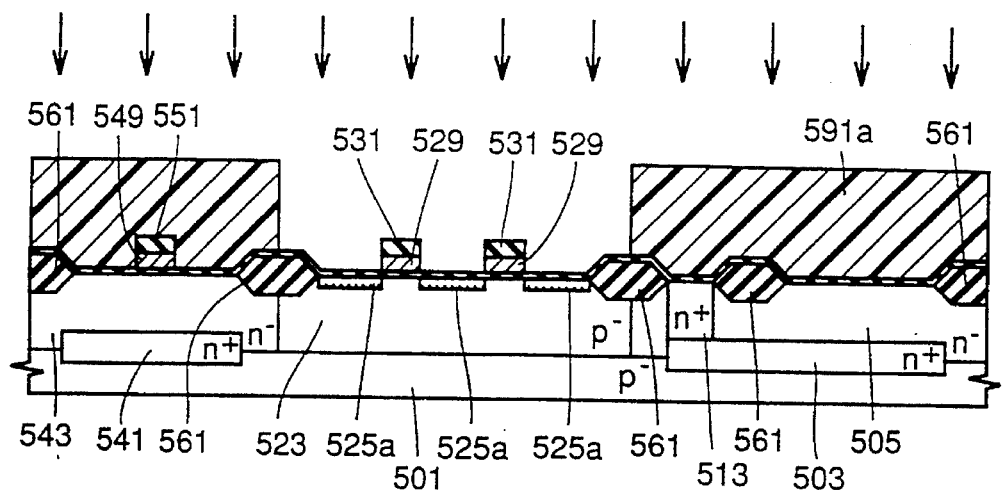
Figure 71:
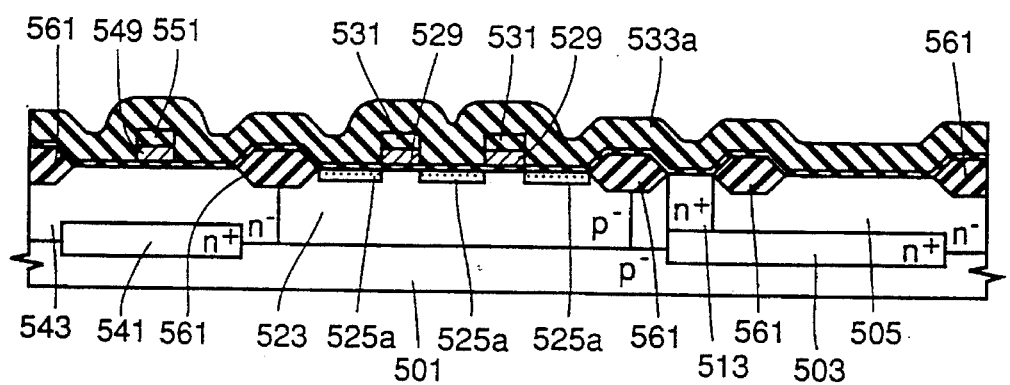
Figure 72:
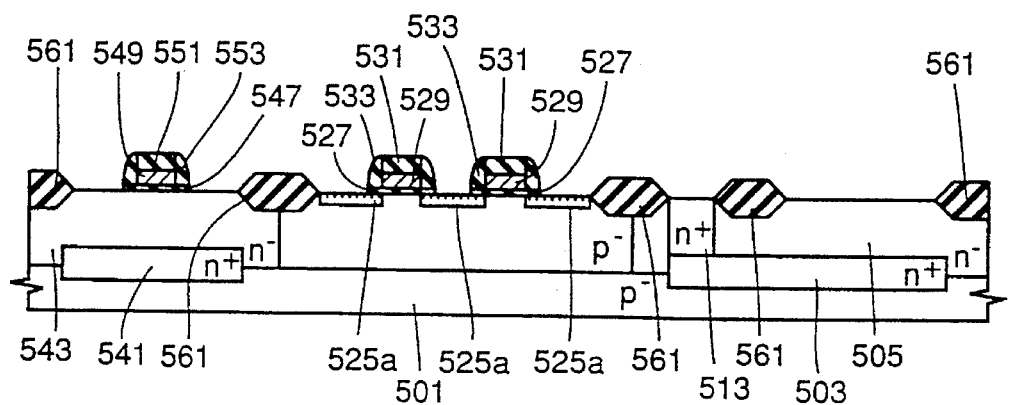
Figure 73:
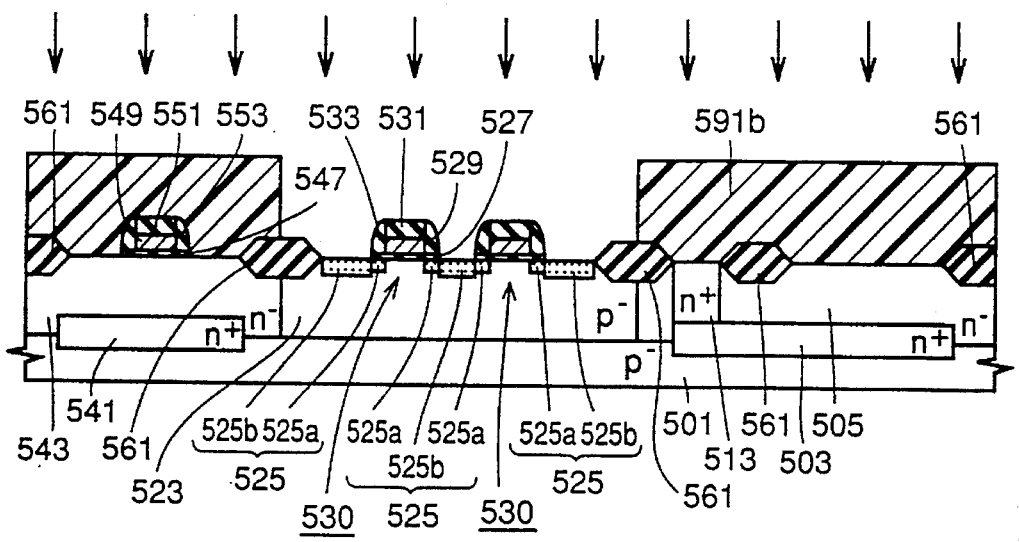
Figure 74:
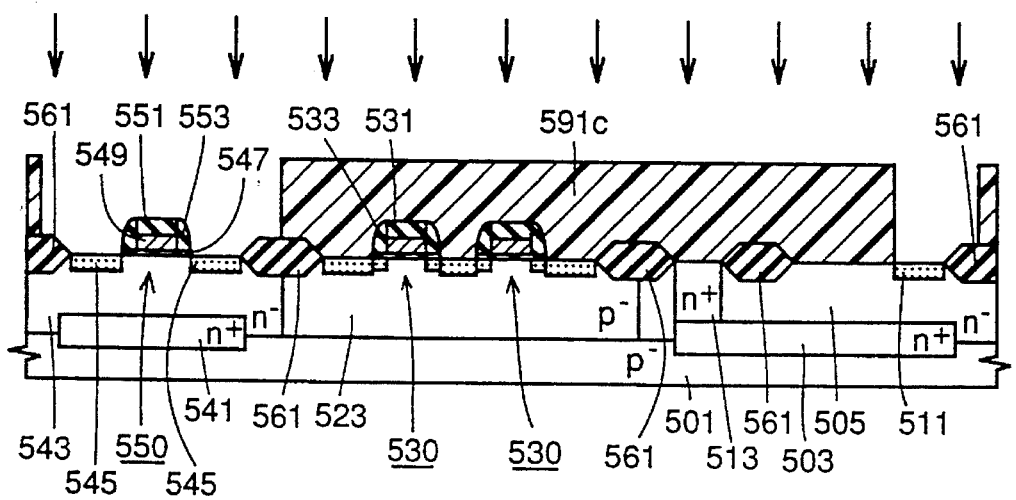
Figure 75:
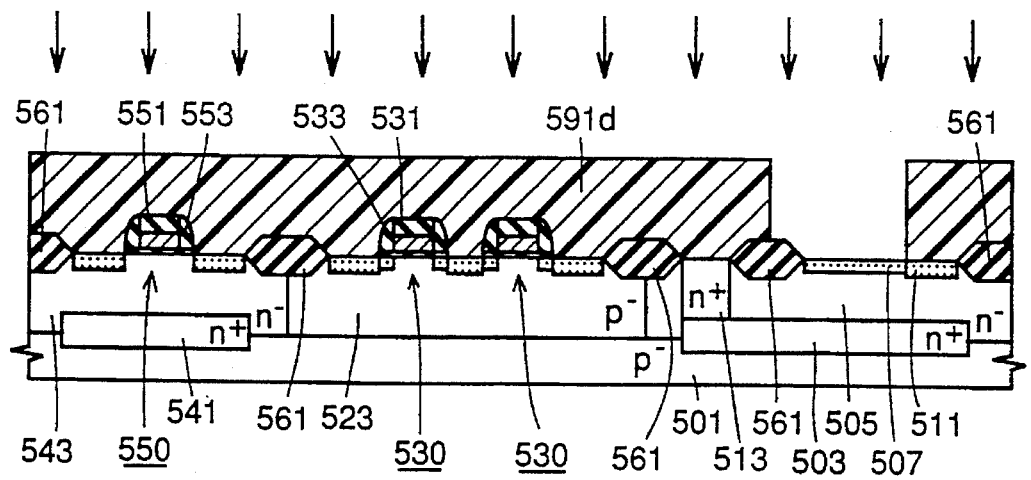
Figure 76:
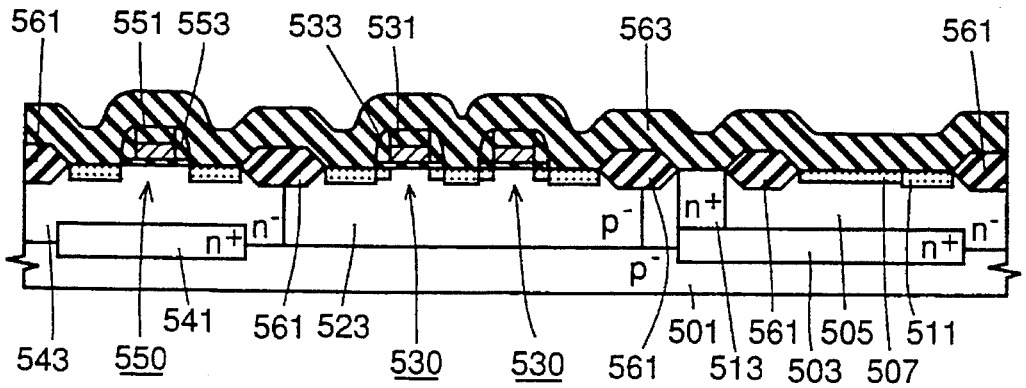
Figure 77:
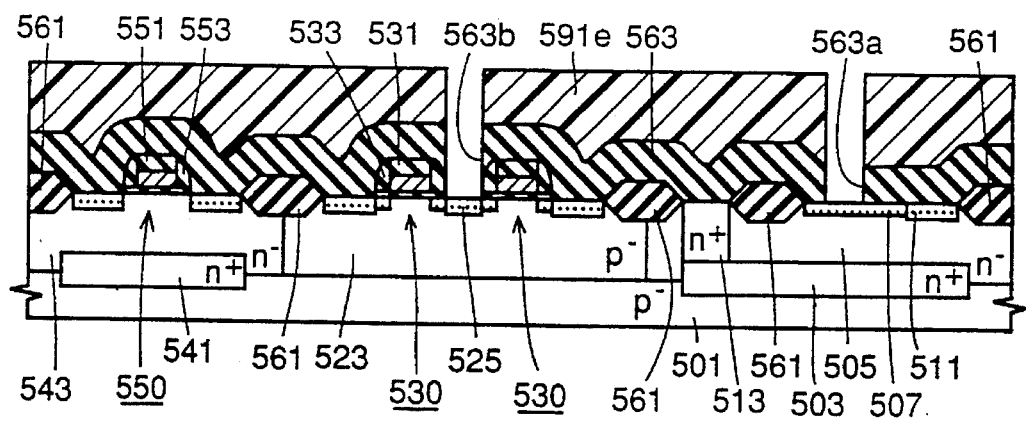
Figure 78:
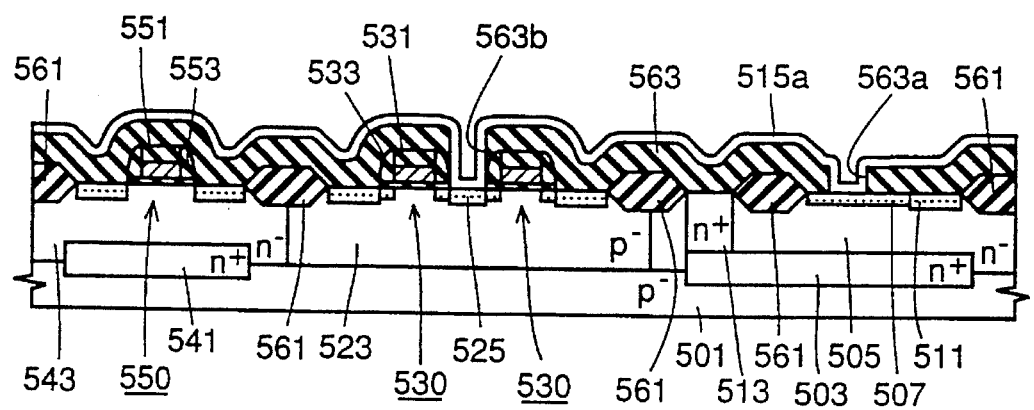
Figure 79:
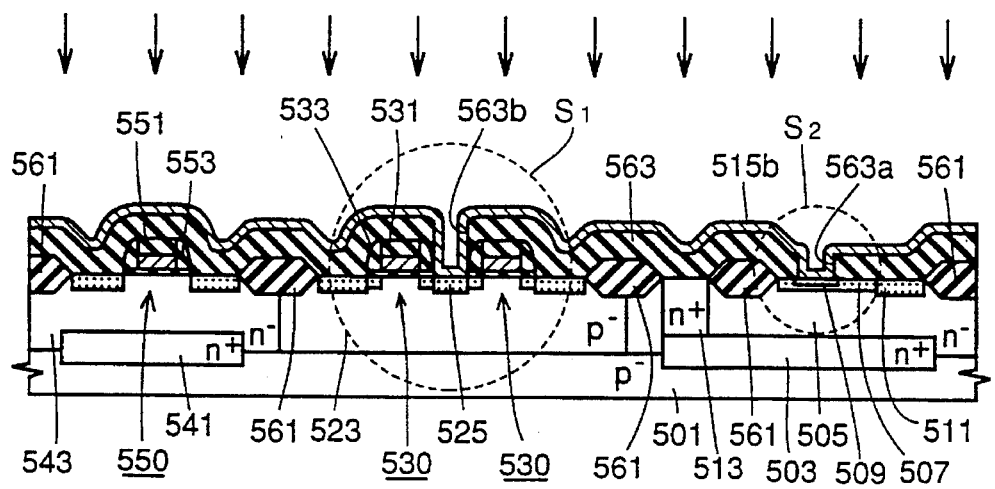
Figure 80:
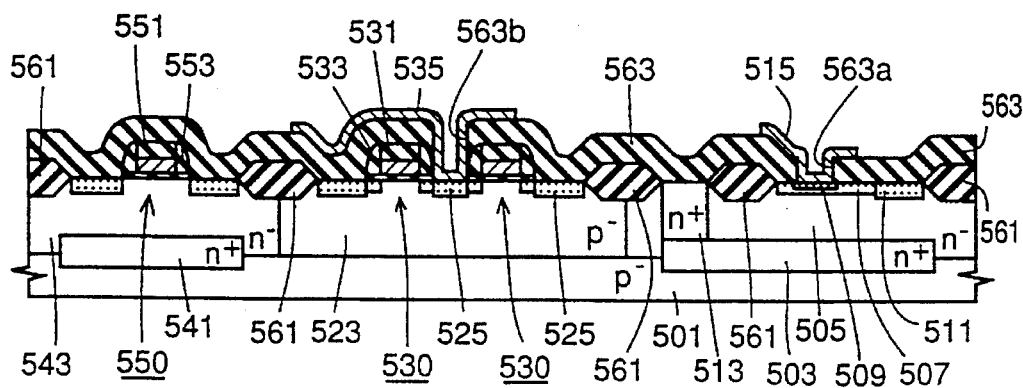
Figure 81:
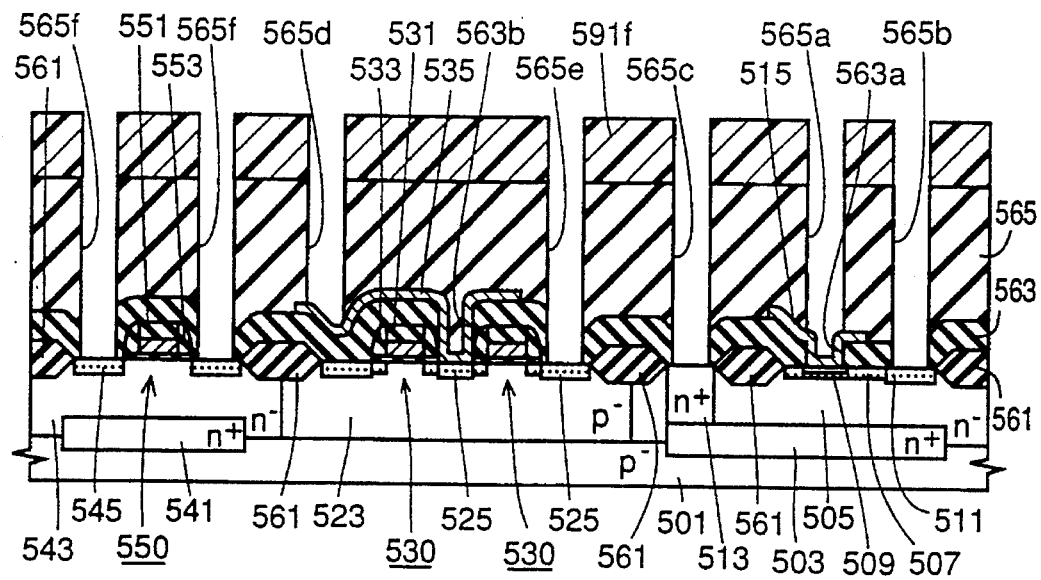
Figure 82:
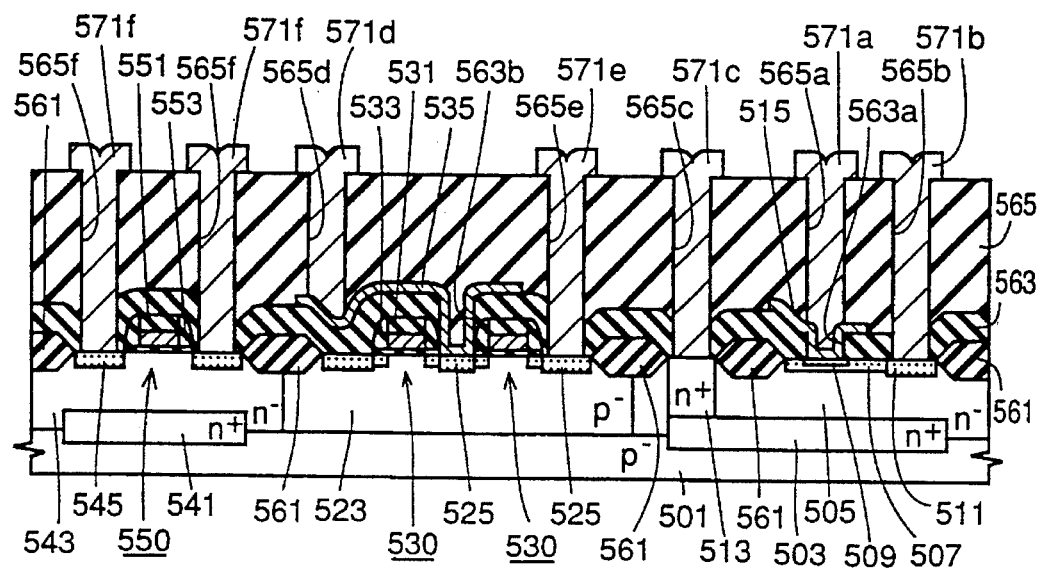
Figure 83:
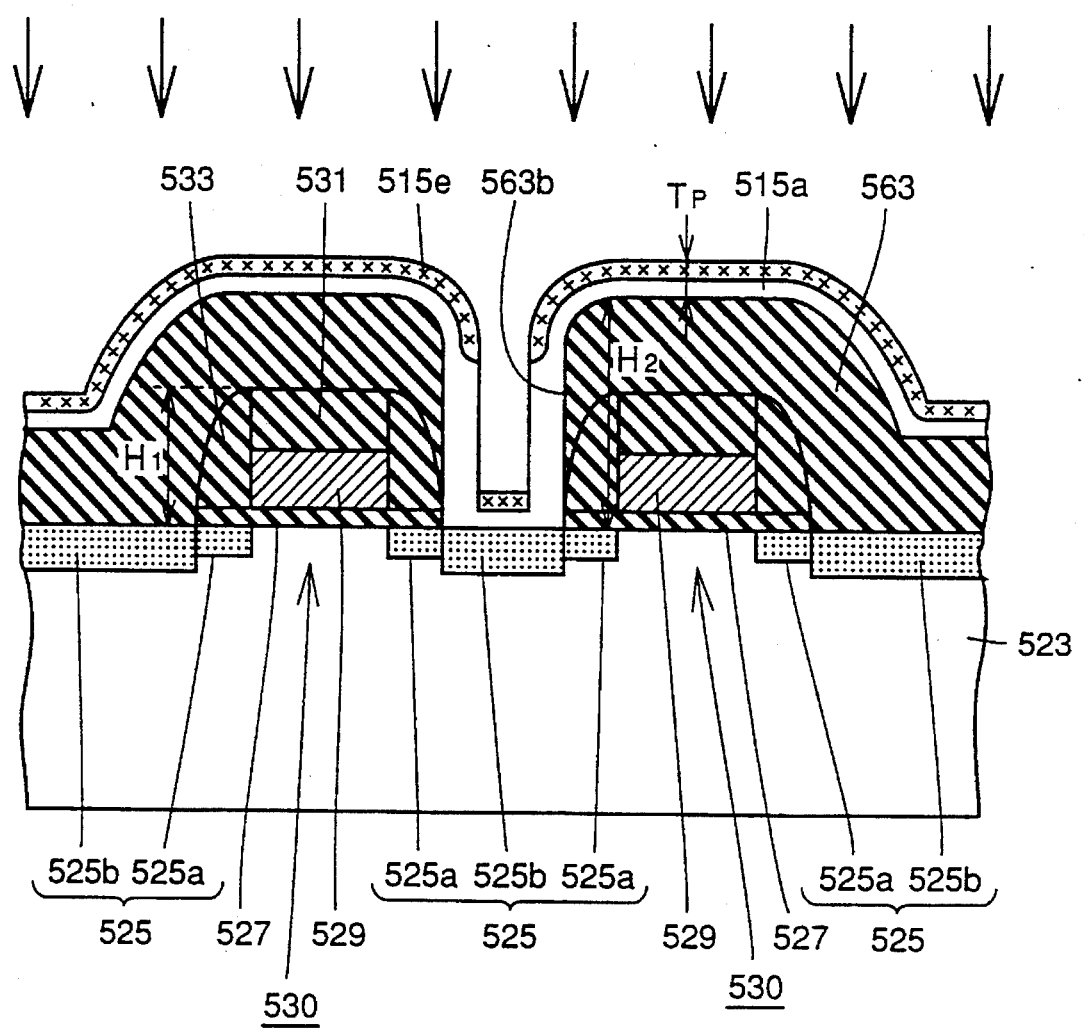
FIG. 83 is an enlarged fragmentary cross section showing a region $S_1$ in FIG. 79 for explaining the fact that a non-implanted region is generated.
Figure 84:
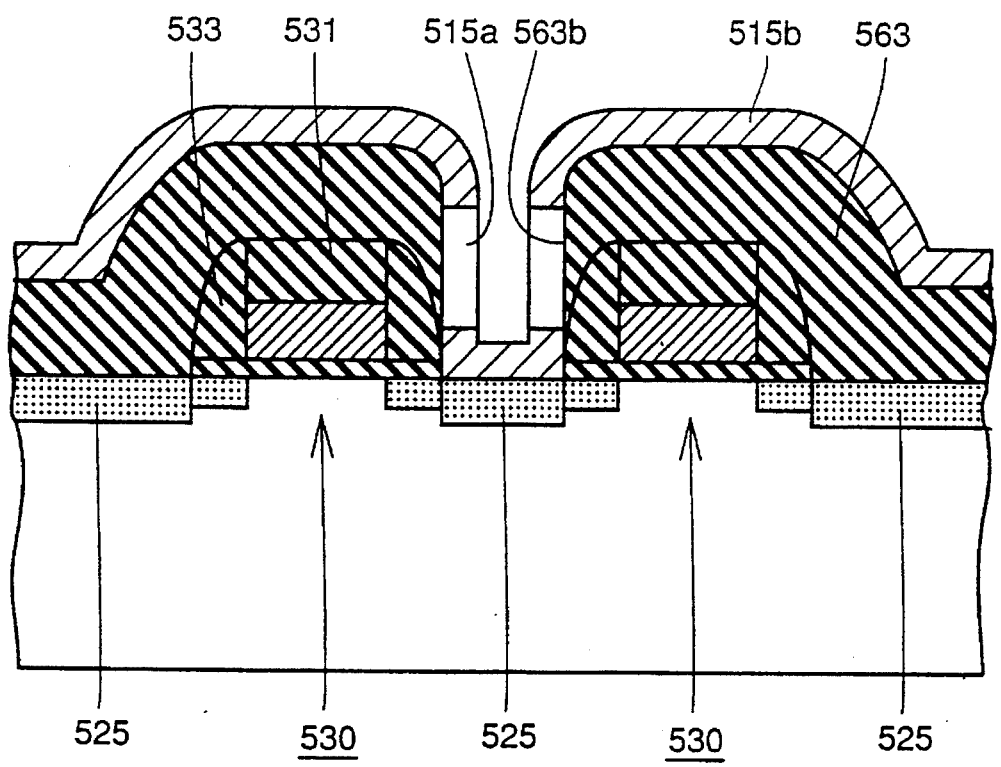
FIG. 84 is an enlarged fragmentary cross section showing a region $S_1$ in FIG. 79 for explaining the fact that the non-implanted region is generated.
Figure 85:
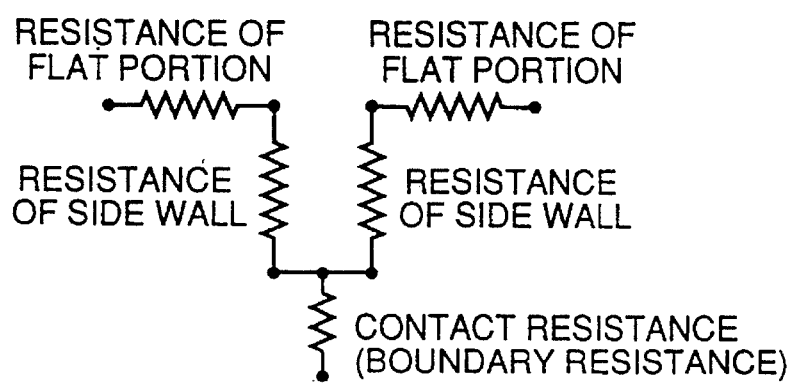
FIG. 85 schematically shows resistances of various portions generated due to a polycrystalline silicon film doped with phosphorus.
Figure 86:
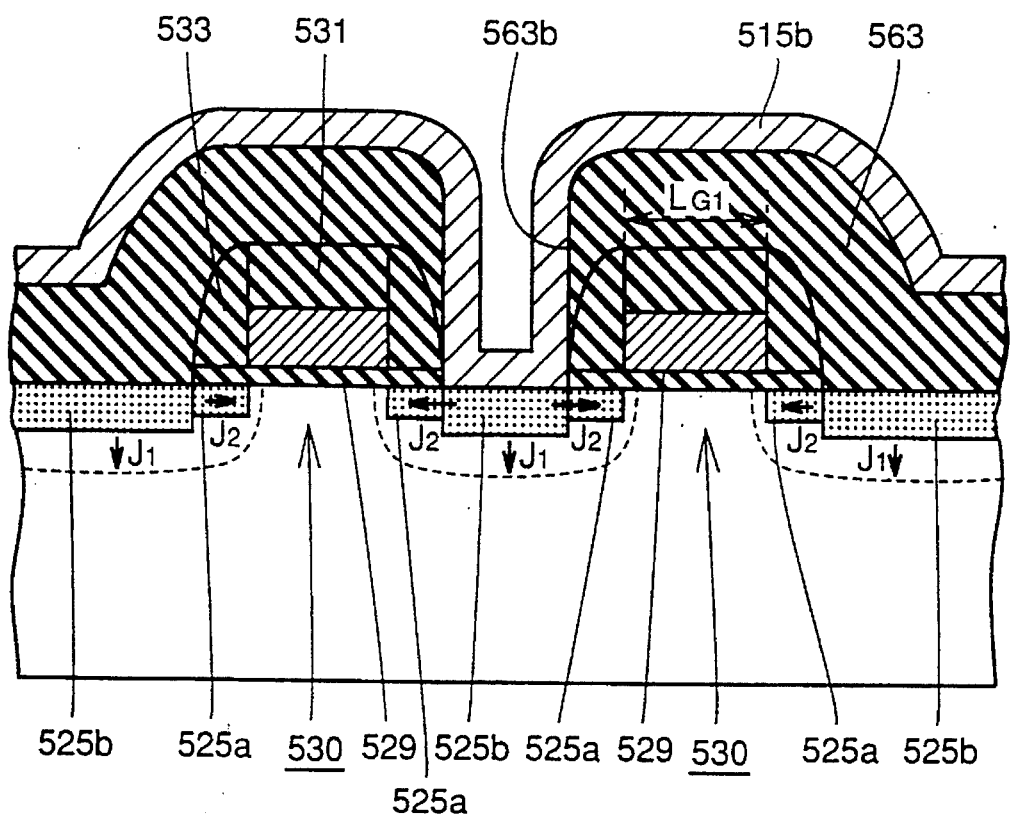
FIG. 86 is a schematic cross section explaining a problem cause by RTA.
Figure 87:
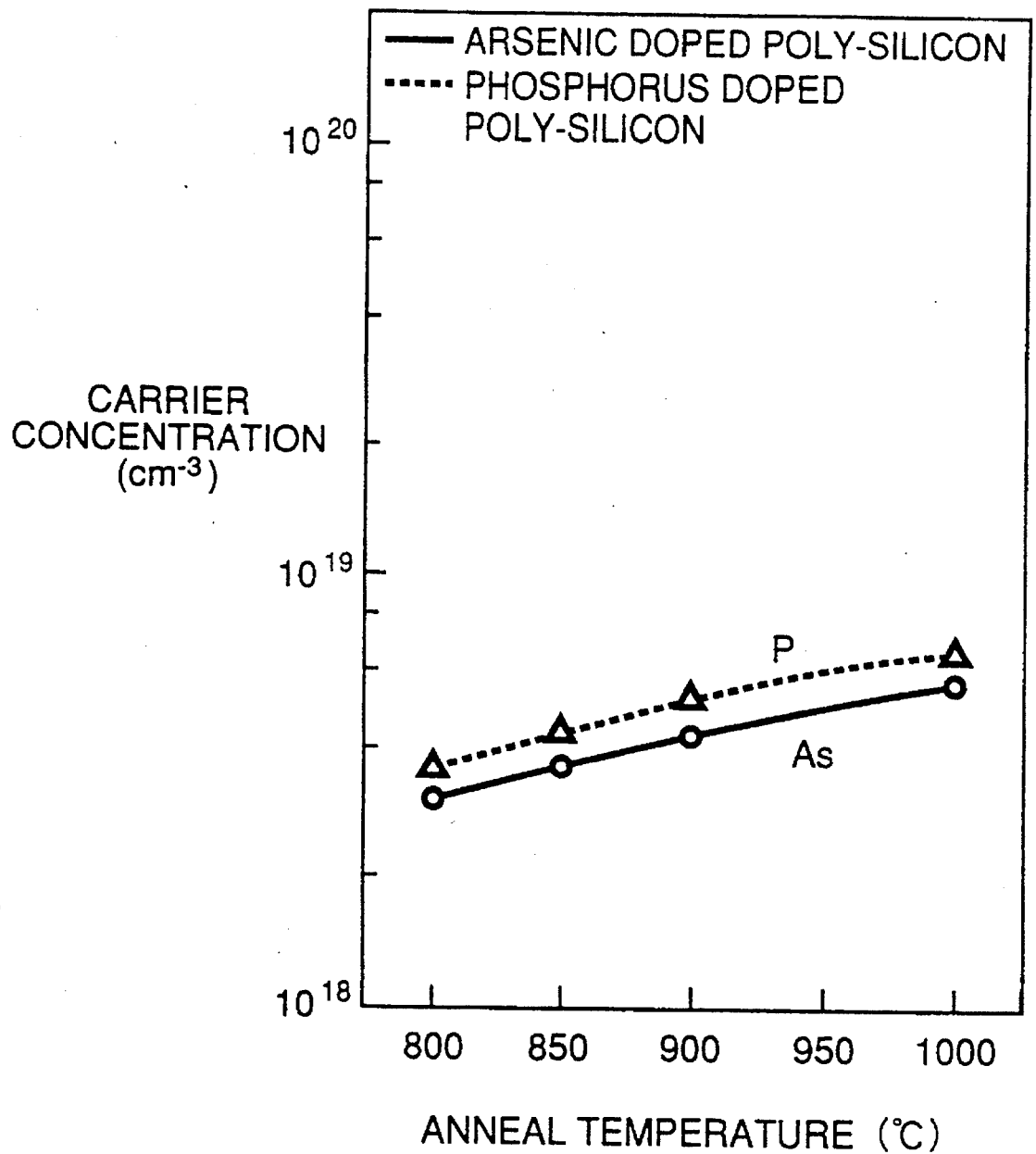
FIG. 87 shows a relationship between an annealing temperature and a carrier concentration in the case where arsenic and phosphorus are individually introduced into polycrystalline silicon at a concentration of $2\times10^{19}$ cm$^{-3}$.
Figure 88:
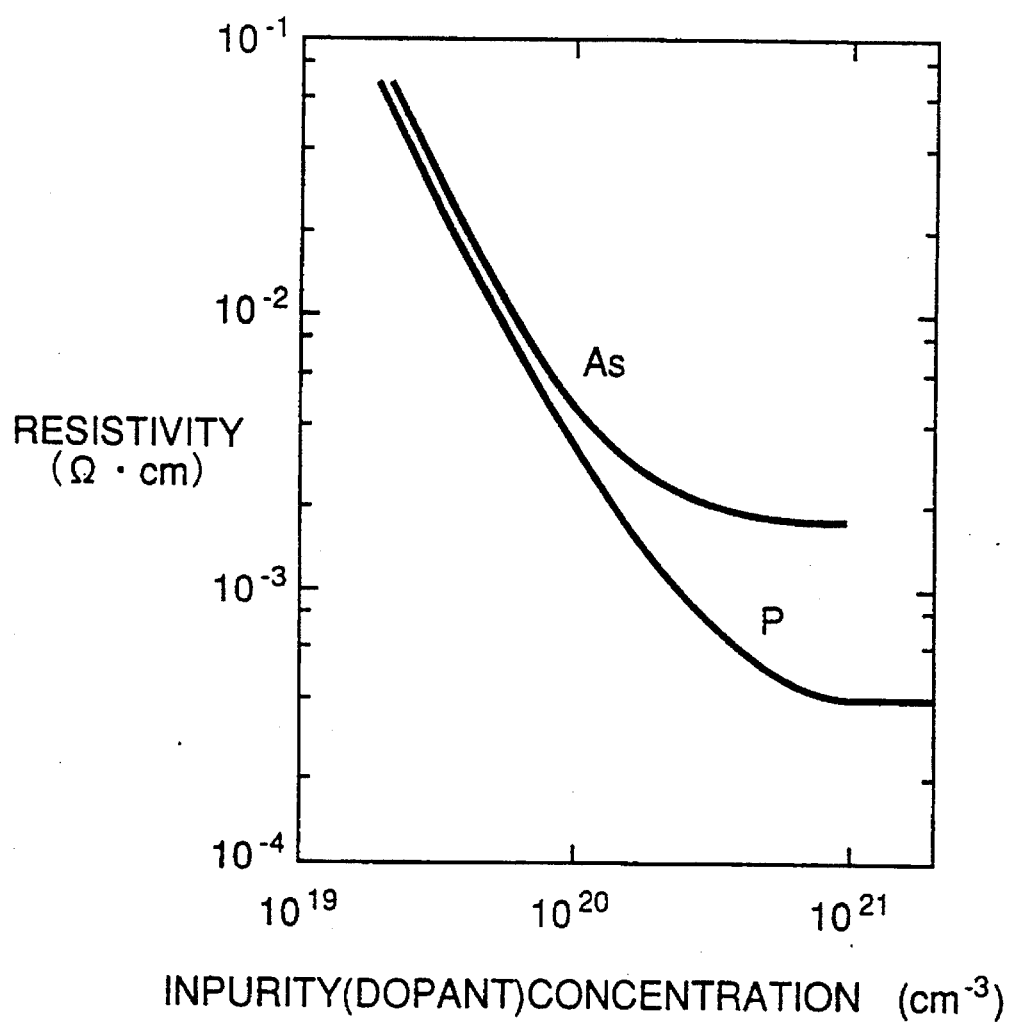
FIG. 88 shows a relationship between an impurity concentration and a resistivity in the case where arsenic and phosphorus are individually introduced into polycrystalline silicon.
Figure 89:
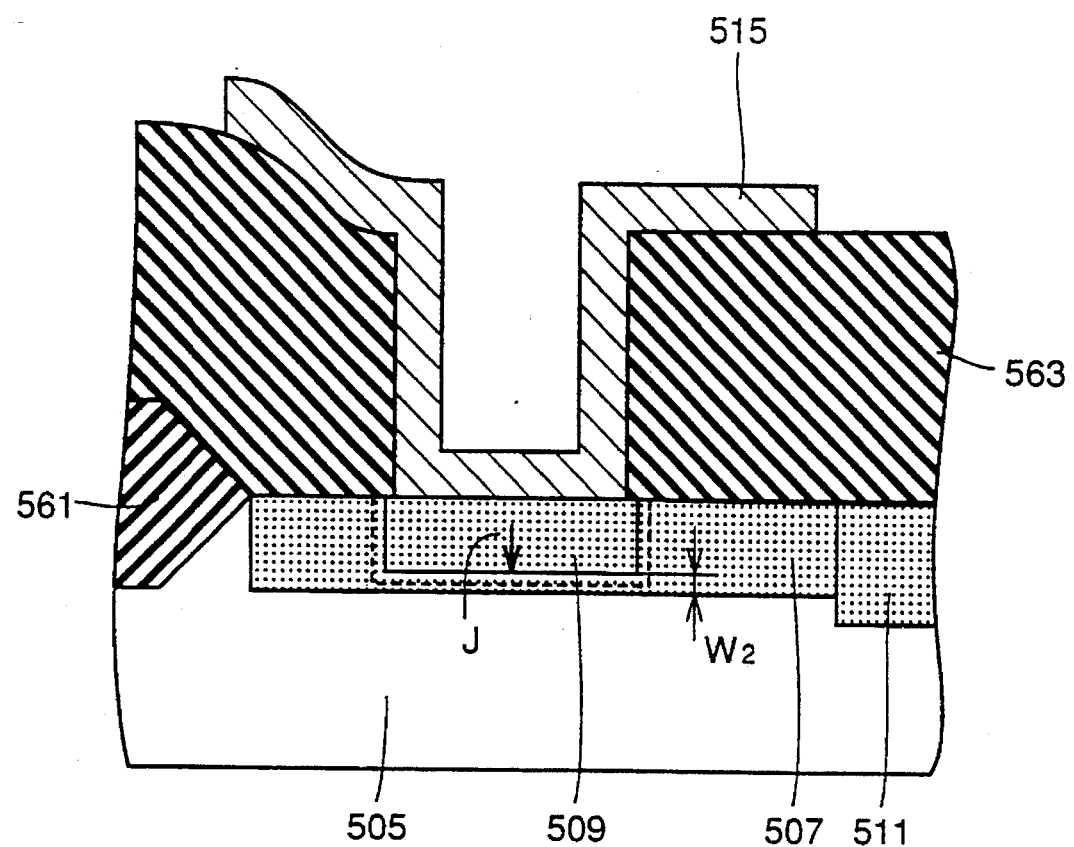
FIG. 89 is a fragmentary cross section explaining the fact that a base width of a base region decreases.

Referring first to FIG. 2, the steps from the first step to that in FIG. 2 are the same as the steps in the conventional manufacturing process shown in FIG. 69, and thus, will not be described below.

Figure 3:
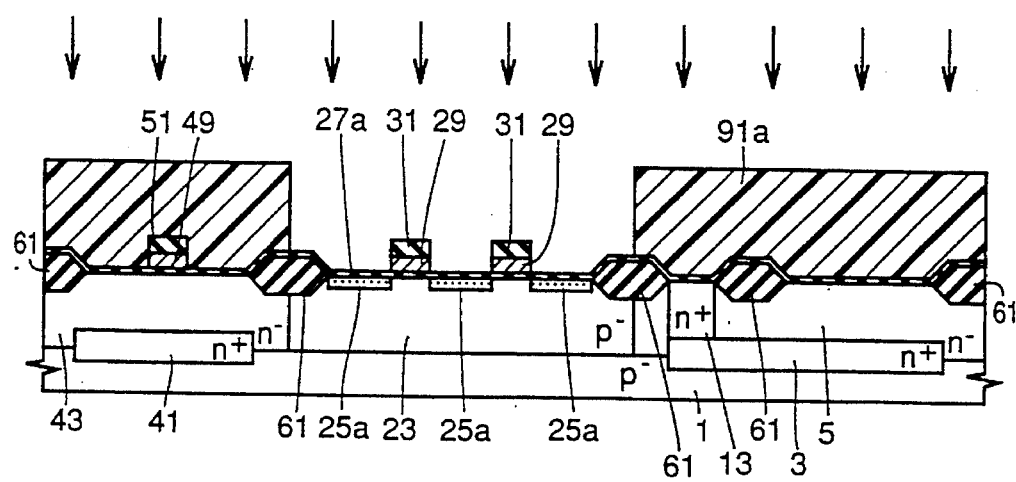

Referring to FIG. 3, photoresist 91a is applied to the whole surface, and is exposed and developed. Thereby, a resist pattern 91a exposing the nMOS transistor region is formed. Using resist pattern 91a as a mask, impurity such as phosphorus is implanted at about 50 keV and about $2.0\times10^{13}$ cm$^{-2}$. By this implantation, n$^-$ impurity region 25a is formed at the surface of p$^-$ well region 23. Thereafter, resist pattern 91a is removed.

Figure 4:
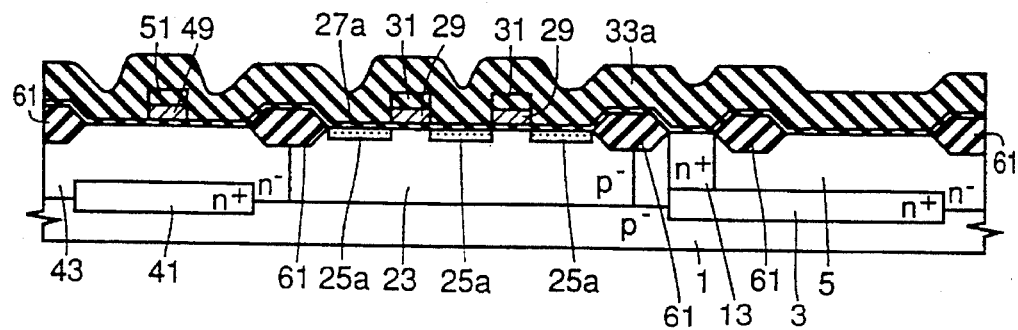

Referring to FIG. 4, an LPCVD method is executed to form a silicon oxide film 33a of about 1500 Å in thickness on the whole surface. Processing such as RIE is effected on silicon oxide film 33a.

Figure 5:
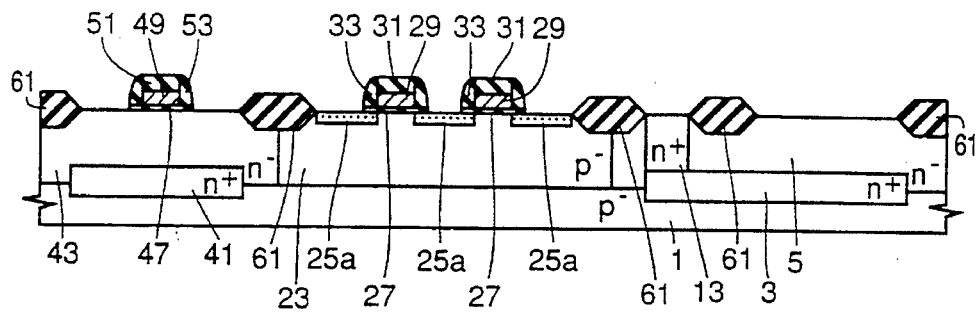

Thereby, sidewall oxide films 33 are formed to cover the sidewalls of gate electrodes 29, as shown in FIG. 5. By the above RIE, a thin silicon oxide film 27a at a lower level is simultaneously etched to form gate oxide films 27 and 47.

Figure 6:
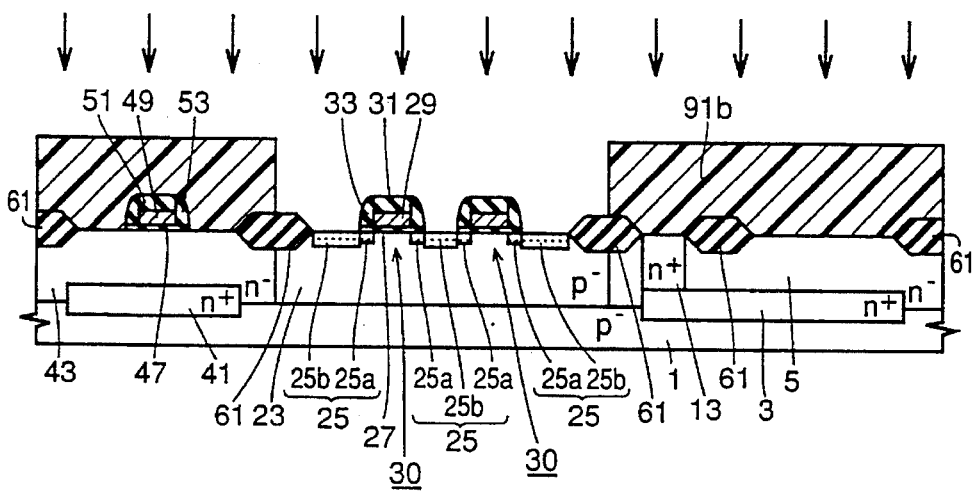

Referring to FIG. 6, photoresist 91b is applied to the whole surface, and is exposed and developed. Thereby, resist pattern 91b exposing the nMOS transistor region is formed. Using resist pattern 91b, gate electrodes 29 and side wall oxide films 33 as a mask, impurity such as arsenic is implanted into p$^-$ well region 23 at about 50 keV and $4.0\times10^{15}$ cm$^{-2}$. By this implantation n$^+$ impurity regions 25b are formed. The n$^+$ impurity regions 25a and n$^+$ impurity regions 25b form n-type source/drain regions 25 having the LDD structure. The n-type source/drain regions 25, gate oxide film 27 and gate electrode 29 form nMOS transistor 30. Thereafter, resist pattern 91b is removed.

Figure 7:
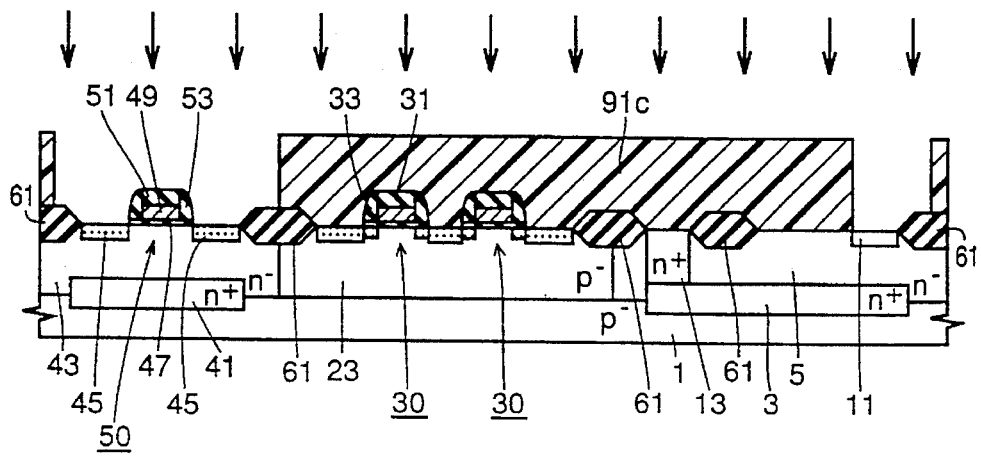

Referring to FIG. 7, photoresist 91c is applied to the whole surface, and is exposed and developed. Thereby, resist pattern 91c exposing predetermined portions of the pMOS transistor region and bipolar transistor region is formed. Using resist pattern 91c, gate electrode 49 and side wall oxide film 53 as a mask, impurity such as boron fluoride (BF$_2$) is implanted at about 20 keV and $4.0\times10^{15}$ cm$^{-2}$. By this implantation and others, paired p$^+$ source/drain regions 45 are formed on the surface of n$^-$ well region 43 and also p$^+$ external base region 11 is formed on the surface of n$^+$ epitaxial growth layer 5. The p$^+$ source/drain regions 45, gate oxide film 47 and gate electrode 49 form pMOS transistor 50. Thereafter, resist pattern 91c is removed. Then, heat treatment is executed, for example, at 850° C. for about 30 minutes, whereby implanted impurity is activated.

Figure 8:
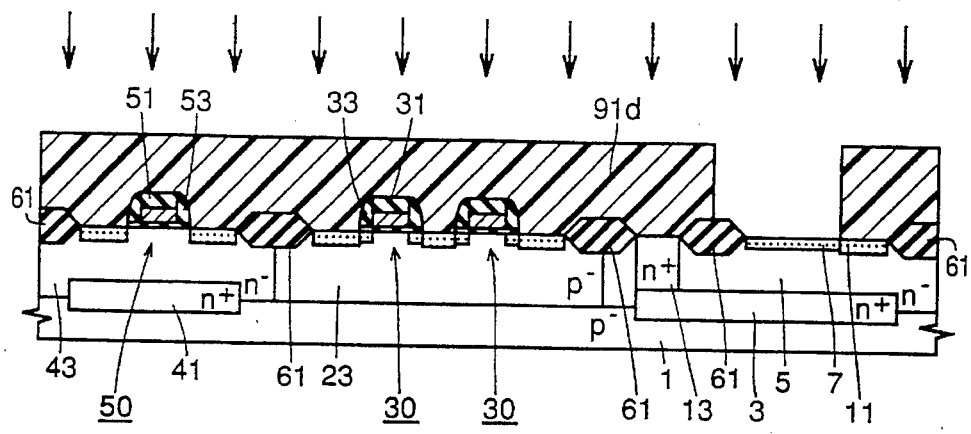

Referring to FIG. 8, photoresist 91d is applied to the whole surface, and is exposed and developed. Thereby, resist pattern 91d exposing a predetermined portion of bipolar transistor region is formed. Using resist pattern 91d as a mask, impurity such as boron fluoride is implanted at about 50 keV and $1.0\times10^{14}$ cm$^{-2}$. Owing to this implantation and others, p$^-$ base region 7 adjoining to p$^+$ external base region 11 is formed at the surface of n$^+$ epitaxial growth layer 5. Thereafter, resist pattern 91d is removed.

Figure 9:
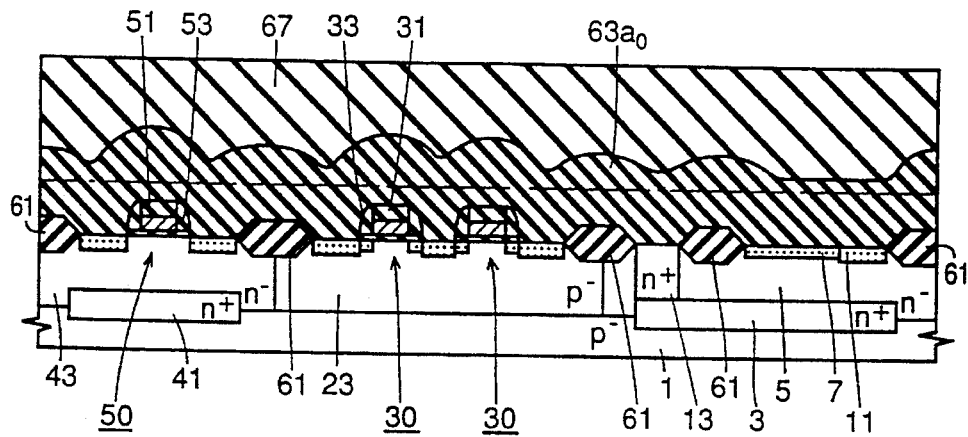

Referring to FIG. 9, a silicon oxide film 63a$_0$ having a thickness from about 6000 Å to about 12000 Å is formed on the whole surface by the LPCVD method. A film such as an SOG (Spin On Glass) film 67 is applied to the whole surface of silicon oxide film 63a$_0$. When applying SOG film 67, SOG film 67 is in the form of liquid, so that the liquid is likely to be collected at concavities in stepped portions of the base, if any. Therefore, SOG film 67 thus formed has thick portions above the concavities. Thus, SOG film 67 has a substantially flat top surface. Thereafter, SOG film 67 and silicon oxide film 63a$_0$ are etched up to a level indicated by alternate long and short dash line by the RIE method. This etching is carried out under the conditions that etching rates of SOG film 67 and silicon oxide film 63a$_0$ are equal to each other.

Figure 10:
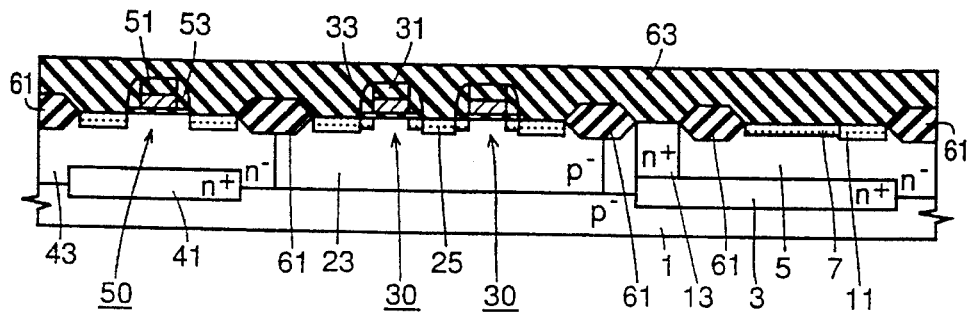

Referring to FIG. 10, the above etching forms first interlayer insulating film 63 which has a thickness A$_1$ from about 500 Å to about 3000 Å at a position above the gate part and has a substantially flat top surface.

Figure 11:
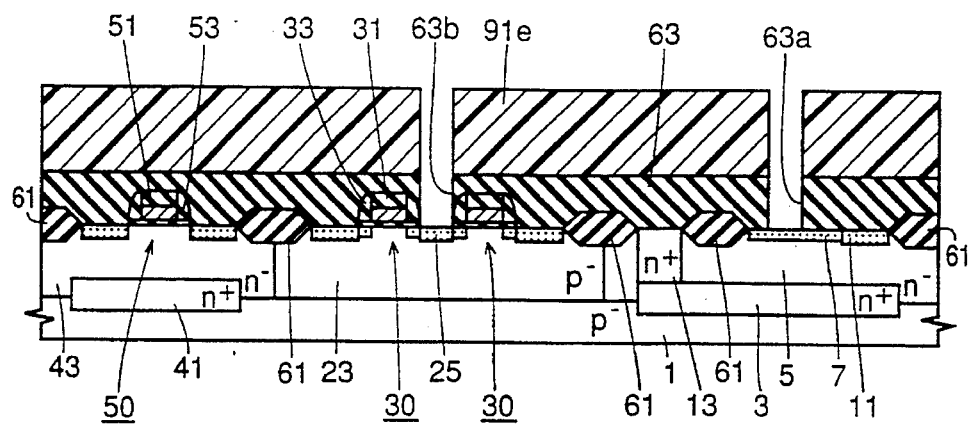

Referring to FIG. 11, a resist pattern 91e having a predetermined patterned configuration is formed on the surface of first interlayer insulating film 63b. Using this resist pattern 91e as a mask, processing such as RIE is effected. Thereby, emitter aperture 63a, which partially exposes the surface of p$^-$ base region 7, and aperture 63b, which partially exposes the surface of n-type source/drain region 25, are formed in first interlayer insulating film 63.

Figure 12:
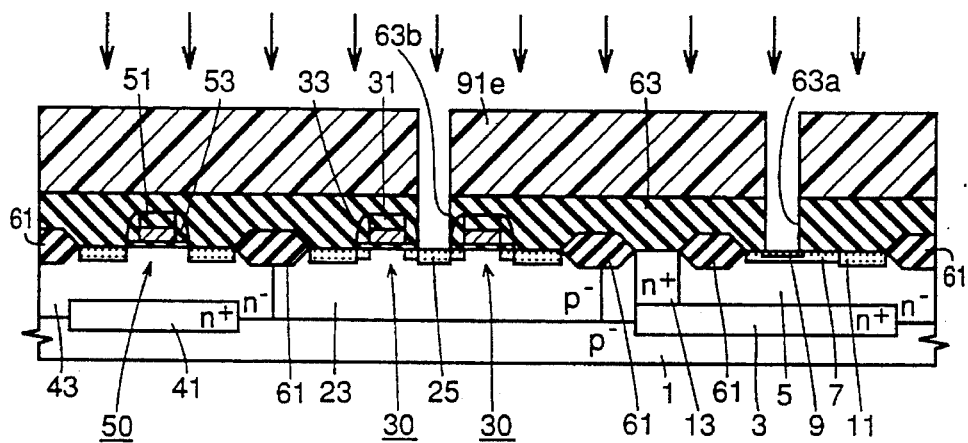

Referring to FIG. 12, arsenic is implanted, for example, at about 60 keV and $1.0\times10^{15}$ cm$^{-2}$ before removing resist pattern 91e. By this implantation, n$^+$ emitter region 9 is formed at the surface portion of p-base region 7 at the bottom of emitter aperture 63a. Thereafter, resist pattern 91e is removed.

Figure 13:
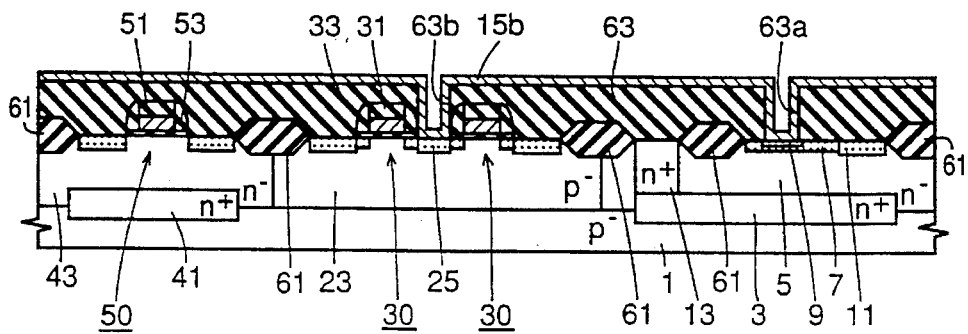

Referring to FIG. 13, LPCVD is executed at a temperature of 590° C. under a pressure from 0.3 to 0.5 Torr with gas of silane (SiH$_4$) and phosphine (PH$_3$). Thus a polycrystalline silicon film 15b which contains phosphorus introduced into its whole surface and has a thickness from about 1000 to about 3000 Å is formed. The concentration of phosphorus in polycrystalline silicon film 15b is in a range from about $1.0\times10^{20}$ to about $6.0\times10^{20}$ cm$^{-3}$. Thereafter, polycrystalline silicon film 15b doped with phosphorus is patterned into a predetermined configuration by photolithography and etching.

Figure 14:
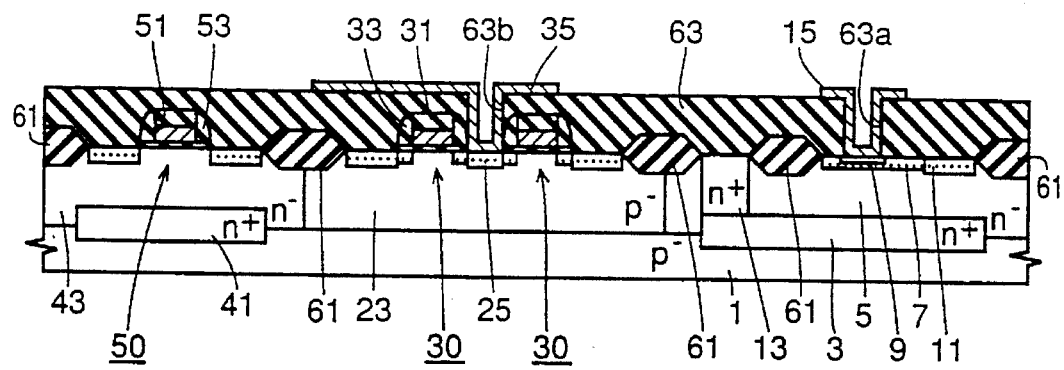

Referring to FIG. 14, by this patterning, emitter electrode 15 is formed which is in contact with n$^+$ emitter region 9 through emitter aperture 63a, and interconnection layer 35 is formed which is in contact with n-type source/drain region 25 through aperture 63b.

Figure 15:
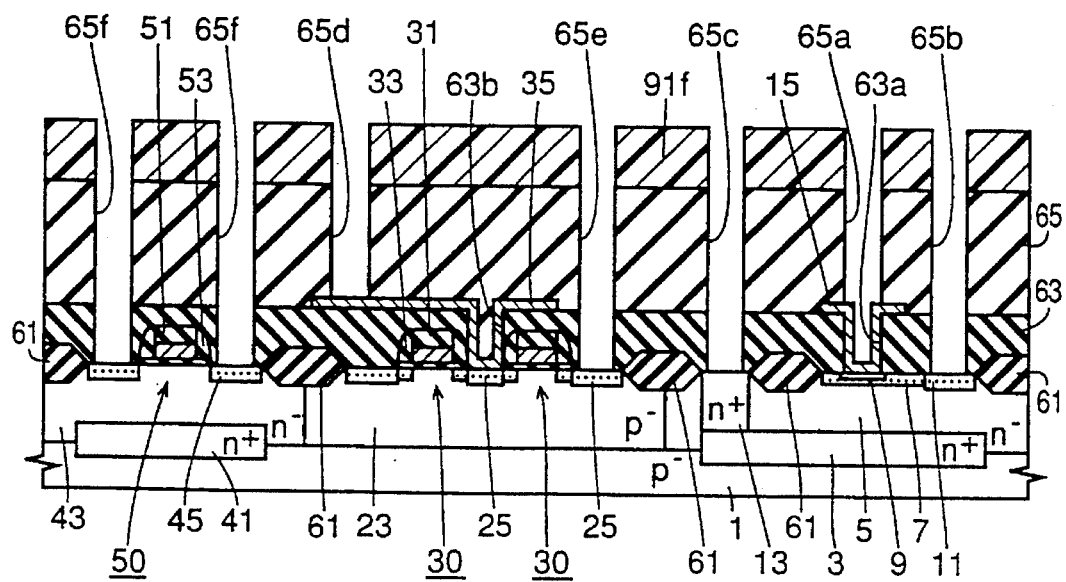

Referring to FIG. 15, second interlayer insulating film 65 is formed on first interlayer insulating film 63 to cover emitter electrode 15 and interconnection layer 35. A resist pattern 91f having a predetermined patterned configuration is formed on the surface of second interlayer insulating film 65. Using resist pattern 91f as a mask, anisotropic etching is effected on first and second interlayer insulating films 63 and 65. Thereby, contact holes 65a, 65b, 65c, 65d, 65e and 65f each reaching the conductive layer or conductive region are formed. Thereafter, resist pattern 91f is removed.

Figure 16:
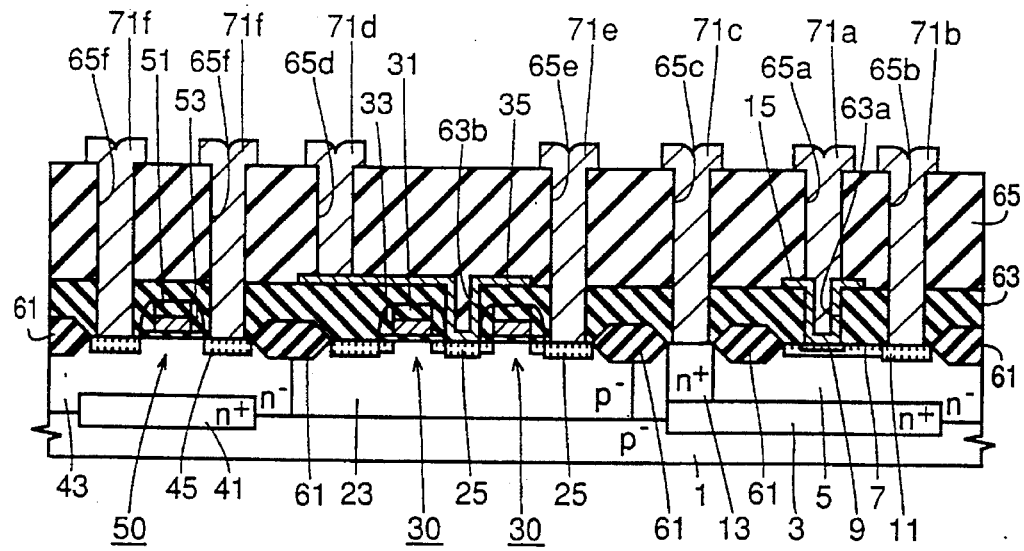

Referring to FIG. 16, conductive layers 71a, 71b, 71c, 71d, 71e and 71f are formed to be in contact with conductive regions and others at the lower level through contact holes 65a, 65b, 65c, 65d, 65e and 65f, respectively.

In this embodiment, as shown in FIG. 1, emitter electrode 15 and interconnection layer 35 are each made of a single layer of polycrystalline silicon doped with phosphorus. Emitter electrode 15 and interconnection layer 35 according to the invention may have other structures such as a polycide structure as shown in FIG. 17.

Figure 17:
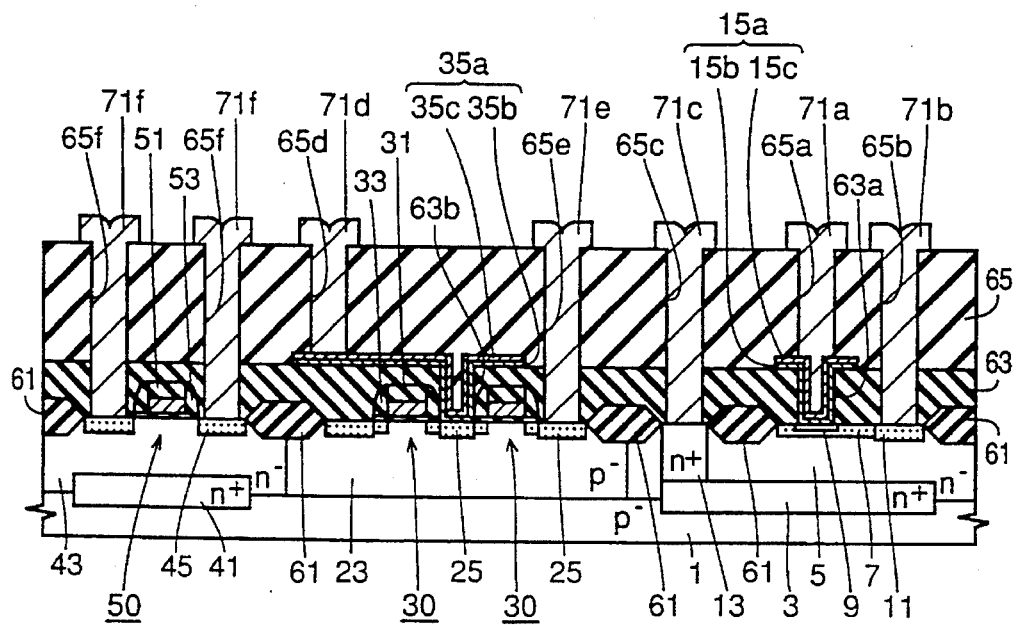
FIG. 17 is a schematic cross section showing a structure in which an emitter electrode and an interconnection layer have a polycide structure in the first embodiment of the invention.

Referring to FIG. 17, emitter electrode 15a is formed of polycrystalline silicon film 15b doped with phosphorus and a silicide layer 15c formed thereon. Interconnection layer 35a is formed of polycrystalline silicon film 35b doped with phosphorus and a silicide layer 35c formed on the surface thereof. Polycrystalline silicon films 15b and 35b are doped with phosphorus at a concentration from $1\times10^{20}$ cm$^{-3}$ to $1\times10^{-21}$ cm$^{-3}$.

More specifically, silicide layers 15c and 35c are made of material such as WSi$_2$ (tungsten silicide) or TiSi$_2$ (titanium silicide).

Structures other than those described above are the same as those shown in FIG. 1, and thus will not be described below.

In this embodiment, emitter electrode 15 and interconnection layer 35 shown in FIG. 1 are obtained by patterning polycrystalline silicon film 15b doped with phosphorus. Polycrystalline silicon film 15b is formed by the LPCVD method in such a manner that phosphorus is introduced thereinto during formation of the film. Phosphorus is diffused uniformly and entirely into polycrystalline silicon film 15b formed in this manner. Therefore, uniform diffusion of impurity into polycrystalline silicon can be achieved without requiring heat treatment at a high temperature by RTA.

Since the high temperature heat treatment by RTA can be eliminated, it is possible to prevent spreading of n$^+$ impurity region 25b forming the LDD structure particularly in nMOS transistor 30. Therefore, disadvantages in the nMOS transistor 30 such as punch through and deterioration of characteristics relating to the resistance against hot electrons can be prevented. Therefore, it is possible to reduce various sizes such as a gate length of nMOS transistor 30, and thus the degree of integration can be improved easily.

Since the heat treatment by RTA can be eliminated, it is possible to prevent diffusion of impurity from emitter electrode 15 into p$^-$ base region 7, which may be caused by the heat treatment by RTA. Therefore, such a disadvantage can be prevented that n$^+$ emitter region 9 is formed deep in p$^-$ base region 7 due to the diffusion and thereby a width of p$^-$ base region 7 is reduced. Accordingly, even if the concentration of phosphorus in emitter electrode 15 is increased, the collector-emitter breakdown voltage is not deteriorated, and thus a good breakdown voltage characteristic can be maintained. It is possible to increase the concentration of phosphorus in the emitter electrode 15, and therefore, the interconnection resistance of emitter electrode 15 can be reduced while maintaining a good breakdown voltage characteristic.

As stated above, the concentration of phosphorus contained in emitter electrode 15 and interconnection layer 35 shown in FIG. 1 can be increased according to the semiconductor device formed by the manufacturing method of this embodiment. Therefore, it is possible to increase the concentration of phosphorus contained in emitter electrode 15 and interconnection layer 35 to at least $1\times10^{20}$ cm$^{-3}$, which cannot be achieved in the prior art.

Since the concentration of phosphorus in the polycrystalline silicon forming emitter electrode 15 and interconnection layer 35 can be $1\times10^{20}$ cm$^{-3}$ or more, remarkable effects can be obtained, for example, in the following case.

Description will be made on the case where nMOS transistor 30 shown in FIG. 1 is used as a driver transistor of an SRAM (Static Random Access Memory), and interconnection layer 35 is used as a ground line connected to a memory cell in the SRAM.

Figure 18:
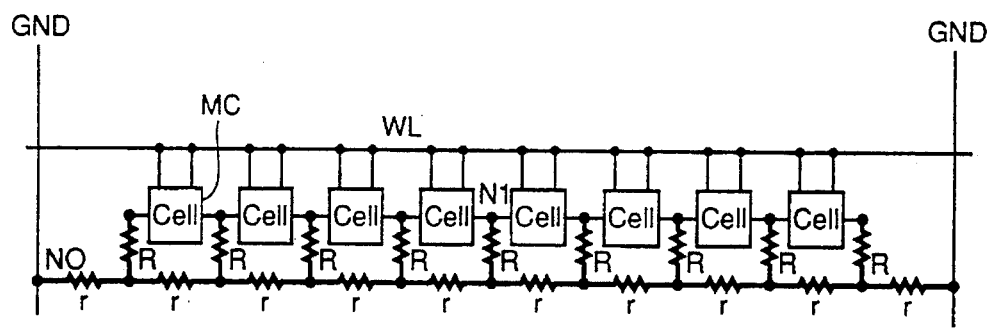
FIG. 18 an equivalent circuit diagram showing a partial structure within a memory cell array of an SRAM.
Figure 19:
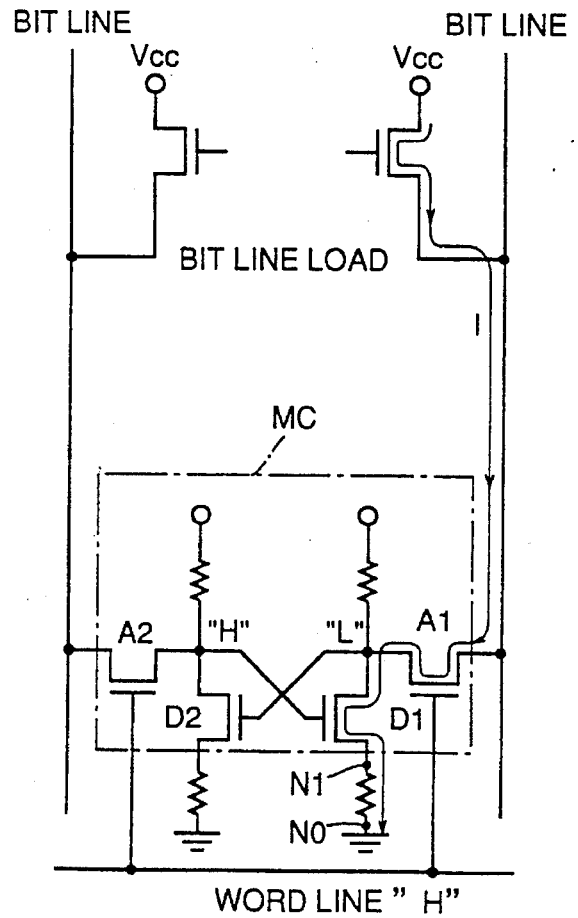
FIG. 19 shows a structure of a memory cell in the SRAM.

Referring to FIGS. 18 and 19, when a word line WL is activated (i.e., selected to become high), access transistors A1 and A2 are turned on. Source/drains of access transistor A1 are connected to "L" of a storage node and, via a bit line load, to Vcc (High), respectively. Since a potential difference between "L" of the storage node and Vcc is large, a so-called column current flows in a direction indicated by an arrow in the figure.

Access transistor A2 is also turned on. However, its source/drains are connected to "H" of the storage node and Vcc (High), respectively, and a potential difference therebetween is small. Therefore, a column current hardly flows through access transistor A2.

As described above, column current I flows through the path of Vcc→bit line load→bit line→access transistor A1 of memory cell→storage node "L"→driver transistor D1 of memory cell→N1→N0→GND.

When column current I flows through the above path, the potential at "L" of the storage node rises if there is an interconnection resistance between N0 and N1. Thus, the potential of storage node rises to a value which is higher than the GND potential by a product of column current I and interconnection resistance between N0 and N1. As the potential of storage node rises, the level at "L" of the storage node approaches to "H".

The memory cell in the SRAM stores data by setting one of the storage nodes to "L" and setting the other storage node to "H". If one of the storage nodes rises from "L" toward "H", both of the storage nodes may be determined as "H". In this case, stored data is broken. Therefore, the rise of "L" potential of the storage node must be suppressed, and therefore, it is necessary to reduce the interconnection resistance between N0 and N1.

More specifically, if column current I is, for example, about 200 μA and the potential at N1 is to be lower than about 0.20 V, the resistance between N0 to N1 must be lower than 1000Ω. Therefore, if the interconnection has a length of about 10 μm and a width of about 1 μm (10 sheets), it is necessary to employ a sheet resistance not more than about 100 Ω/□.

Figure 20:
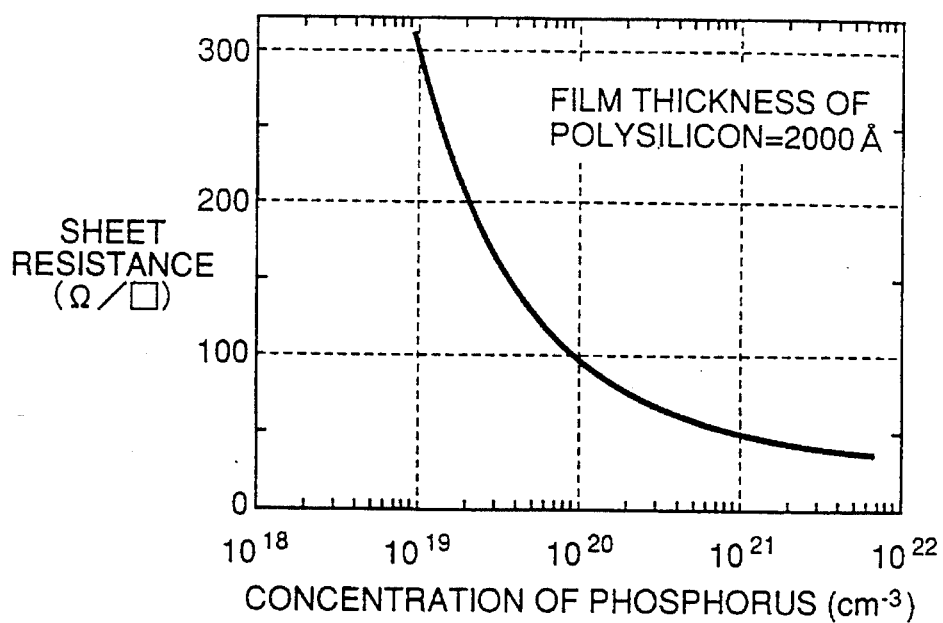
FIG. 20 shows a relationship between a phosphorus concentration and a sheet resistance in the case where an emitter electrode and an interconnection layer are each formed of a single polycrystalline silicon film layer of 2000 Å in thickness doped with phosphorus.

FIG. 20 is a graph showing relation between phosphorus concentration and sheet resistance when phosphorus is introduced to a polycrystalline silicon film having the thickness of 2000 Å. As can be seen from FIG. 20, the sheet resistance must be at most about 100Ω/□, so that the phosphorus concentration must be at least about $1\times10^{20}$ cm$^{-3}$.

Referring to FIG. 1 again, interconnection layer 35 connected to nMOS transistor 30 in this embodiment has the phosphorus concentration not less than $1\times10^{20}$ cm$^{-3}$. Therefore, even if nMOS transistor 30 is applied to the SRAM described above, breakage of data stored in the memory cell of the SRAM can be prevented.

In this embodiment, polycrystalline silicon forming emitter electrode 15 is doped with phosphorus at a concentration not more than $6\times10^{20}$ cm$^{-3}$. Therefore, a good collector-emitter breakdown voltage $BV_{CEO}$ can be ensured. The reason of this is as follows.

Collector-emitter breakdown voltage $BV_{CEO}$ is one of important electrical parameters of the bipolar transistor. If breakdown voltage $BV_{CEO}$ were lower than a voltage applied across the collector and emitter, it would not operate as a bipolar transistor.

Figure 21:
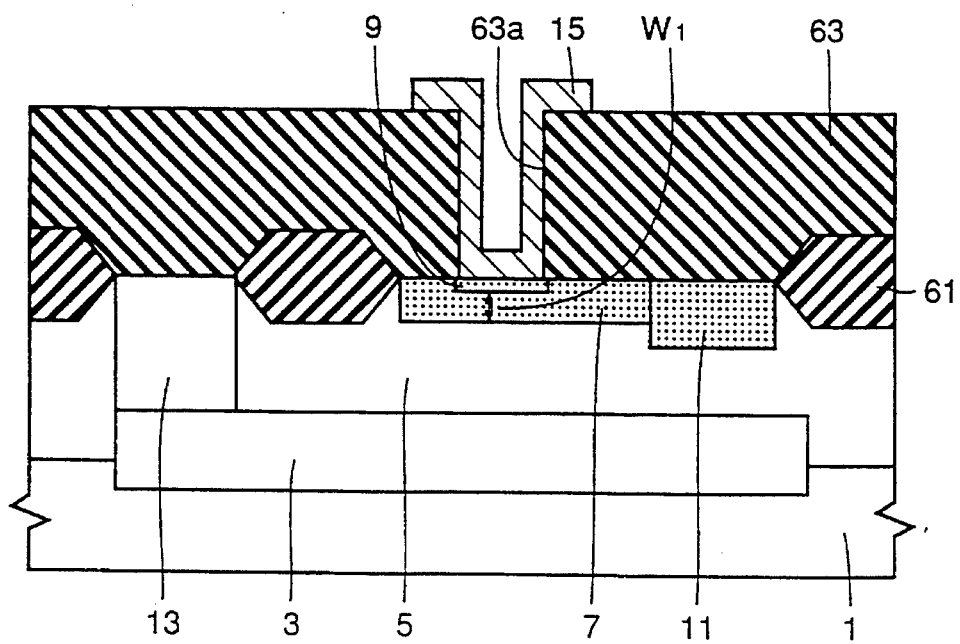
FIG. 21 is an enlarged schematic cross section of a bipolar transistor region shown in FIG. 1 for showing reduction of a collector-emitter breakdown voltage.

Referring to FIG. 21, collector-emitter breakdown voltage $BV_{CEO}$ depends on a pn junction breakdown voltage across collector 5 and base 7 if base width $W_1$ is wide. However, if base width $W_1$ is narrow, collector-emitter breakdown voltage $BV_{CEO}$ depends on a punch through breakdown voltage across collector 5 and emitter 9. Punch through breakdown voltage across the collector and emitter is a voltage at the time when a large current flows due to the fact that a depletion layer between collector 5 and base 7 continues to a depletion layer between emitter 9 and base 5, and thereby a collector electric field reduces a diffusion potential between emitter 5 and base 7.

Figure 22:
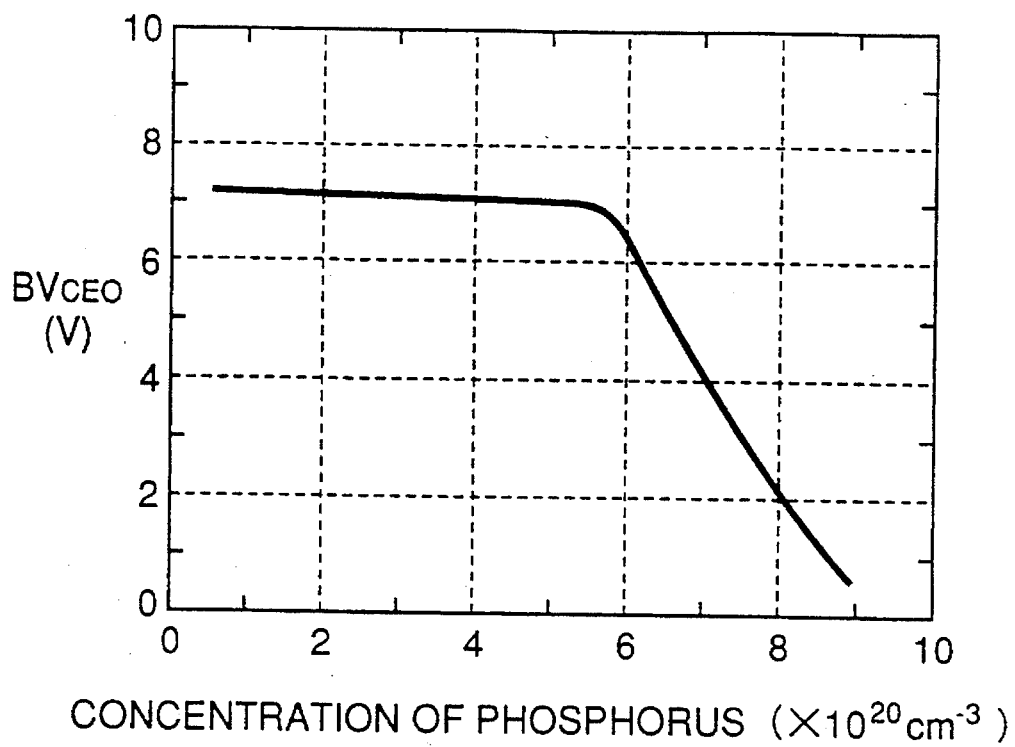
FIG. 22 shows a relationship between a phosphorus concentration and a collector-emitter breakdown voltage $BV_{CEO}$ in the case where an emitter electrode and an interconnection layer are each formed of a single polycrystalline silicon film layer doped with phosphorus.

Referring to FIG. 22, if the phosphorus concentration is not more than $6\times10^{20}$ cm$^{-3}$, a relatively small amount of phosphorus is diffused from the emitter electrode to the substrate. Therefore, collector-emitter breakdown voltage $BV_{CEO}$ is maintained at about 7 V. If the phosphorus concentration exceeds $6\times10^{20}$ cm$^{-3}$, a relatively large amount of phosphorus is diffused from the emitter electrode to the substrate. Thereby, the emitter region is formed deep, and thus the base width decreases. Therefore, collector-emitter breakdown voltage $BV_{CEO}$ decreases to a value not more than 7 V. Accordingly, the concentration of phosphorus in the polycrystalline silicon must be at most $6\times10^{20}$ cm$^{-3}$.

A reference value of collector-emitter breakdown voltage $BV_{CEO}$ is 7 V. This is determined taking into account the fact that a power supply voltage currently used in semiconductor devices is generally 5 V. Thus, the breakdown voltage not less than 5 V is required, and the reference value is set to 7 V leaving a margin.

Description will be made on the case where emitter electrode 15a and interconnection layer 35a are made of a polycide structure as shown in FIG. 17.

Emitter electrode 15a and interconnection layer 35a including the polycide structure shown in FIG. 17 can be formed also by the manufacturing method of the embodiment. Therefore, polycrystalline silicon films 15b and 35b can be doped with phosphorus at a concentration not less than $1\times10^{20}$ cm$^{-3}$. Thereby, the structure shown in FIG. 17 can achieve a remarkable effect that destruction of data stored in the SRAM can be prevented, similarly to the structure shown in FIG. 1.

However, if metal silicide is used as the silicide forming the polycide structure, the metal silicide layer has a low resistance. Therefore, a relationship shown in FIG. 23 exists between the concentration of phosphorus in the polycrystalline silicon forming the polycide structure and the sheet resistance of the polycide structure.

Figure 23:
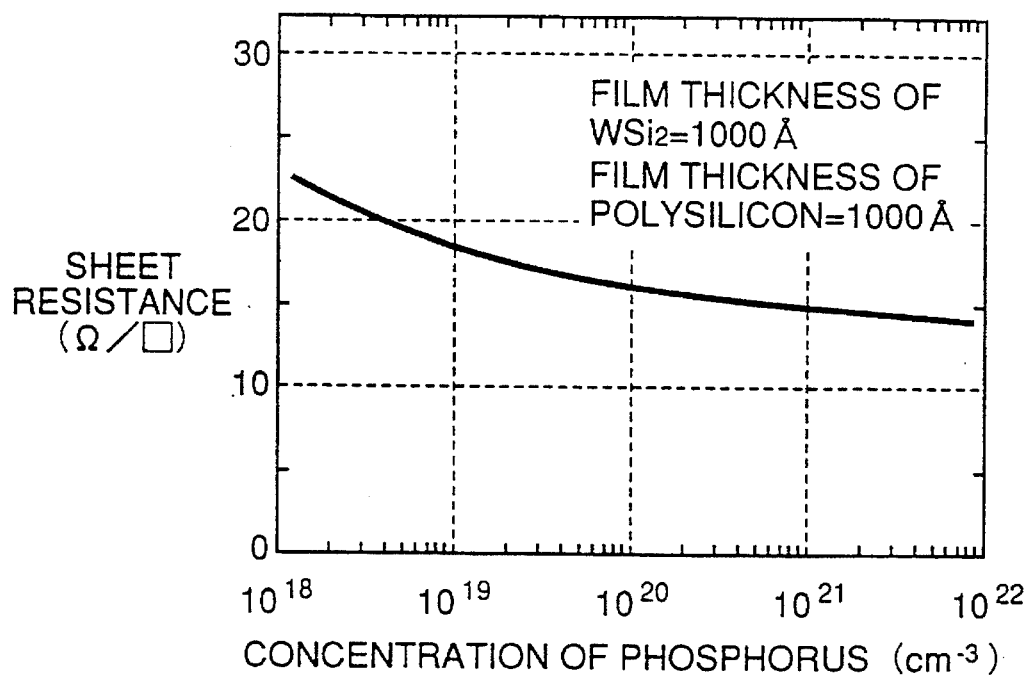
FIG. 23 shows a relationship between a phosphorus concentration and a sheet resistance in the case where an emitter electrode and an interconnection layer each have a polycide structure.
Figure 24:
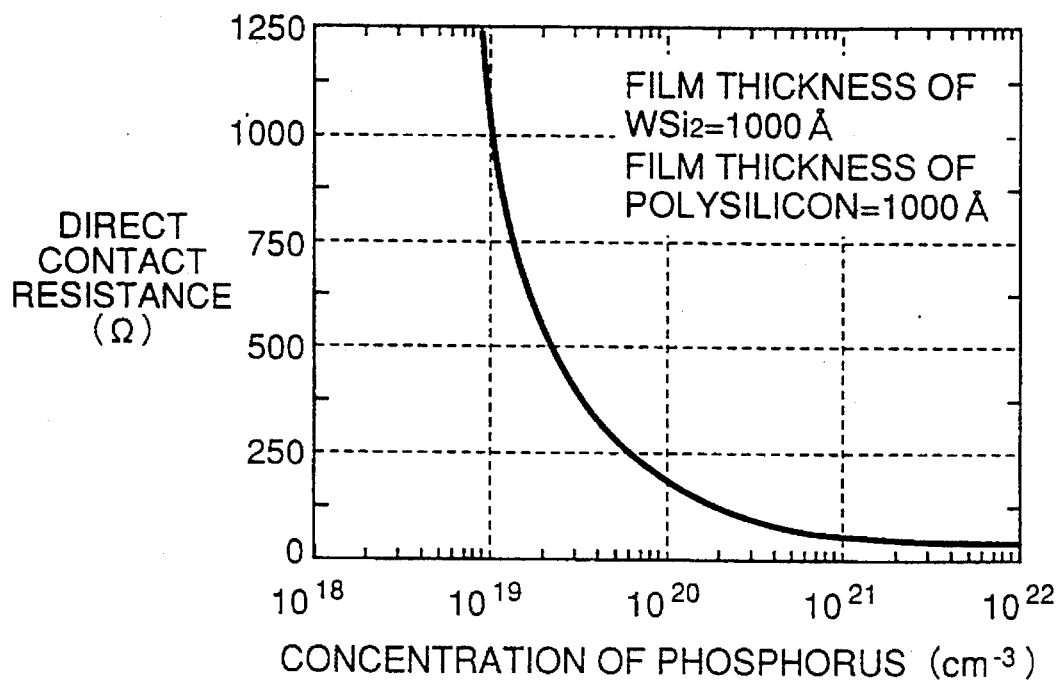
FIG. 24 shows a relationship between a phosphorus concentration and a direct contact resistance in the case where an emitter electrode and an interconnection layer have a polycide structure.

FIG. 23 shows a case where the polycide structure is formed of polycrystalline silicon having a film thickness of 1000 Å and $WSi_2$ having a film thickness of 1000 Å.

Referring to FIG. 23, the sheet resistance of polycide is not more than 30 Ω/58 regardless of the concentration of phosphorus, and thus is lower than the above value of about 1000Ω/58. Therefore, the concentration of phosphorus in polycrystalline silicon forming the polycide structure can be substantially negligible from only the viewpoint of the interconnection resistance of the polycide structure.

However, the polycide structure generally has such a nature that metal silicide tends to absorb dopant in the polycrystalline silicon. Therefore, there is a remarkably high resistance at a direct contact portion to N1 in FIGS. 18 and 19, i.e., at contact portion between emitter electrode 35a and n-type source/drain region 25 in FIG. 11. More specifically, the direct contact resistance remarkably increases above 1000 Ω if the concentration of phosphorus lowers below $1 \times 10^{19}$ cm$^{-3}$.

In the example stated with reference to FIGS. 18 and 19, the resistance between N0 and N1 must be at less about 1000 Ω. However, if the polycide structure is employed, and the concentration of phosphorus is not more than $1 \times 10^{19}$ cm$^{-3}$, even the direct contact resistance itself exceeds 1000 Ω.

In order to reduce the direct contact resistance to 1000 Ω or less, the concentration of phosphorus in the polycrystalline silicon must be $1 \times 10^{19}$ cm$^{-3}$ or more. It is necessary to take not only the direct contact resistance but also the interconnection resistance of polycide into consideration. Taking them into consideration, the concentration of phosphorus in the polycrystalline silicon forming the polycide structure must be $1 \times 10^{20}$ cm$^{-3}$ or more in order to prevent destruction of data stored in a memory cell in the SRAM.

In connection with this, the concentration of phosphorus in the polycrystalline silicon forming the polycide structure is not smaller than $1 \times 10^{20}$ cm$^{-3}$ in the embodiment. Therefore, the structure shown in FIG. 17 has a remarkable advantage that destruction of data stored in the memory cell of the SRAM can be prevented.

In the case where emitter electrode 15a and interconnection layer 35a use the polycide structure as shown in FIG. 17, the upper limit of concentration of phosphorus in the polycrystalline silicon forming polycide is $1 \times 10^{21}$ cm$^{-3}$.

The reason is substantially the same as that relating to the upper limit already described with reference to FIG. 1. However, the polycide structure has the nature that the metal silicide tends to absorb dopant in the polycrystalline silicon as state before. Therefore, the amount of phosphorus diffused into the substrate from the emitter electrode having the polycide structure is smaller than that in the structure shown in FIG. 1 by the amount of absorbed dopant.

Figure 25:
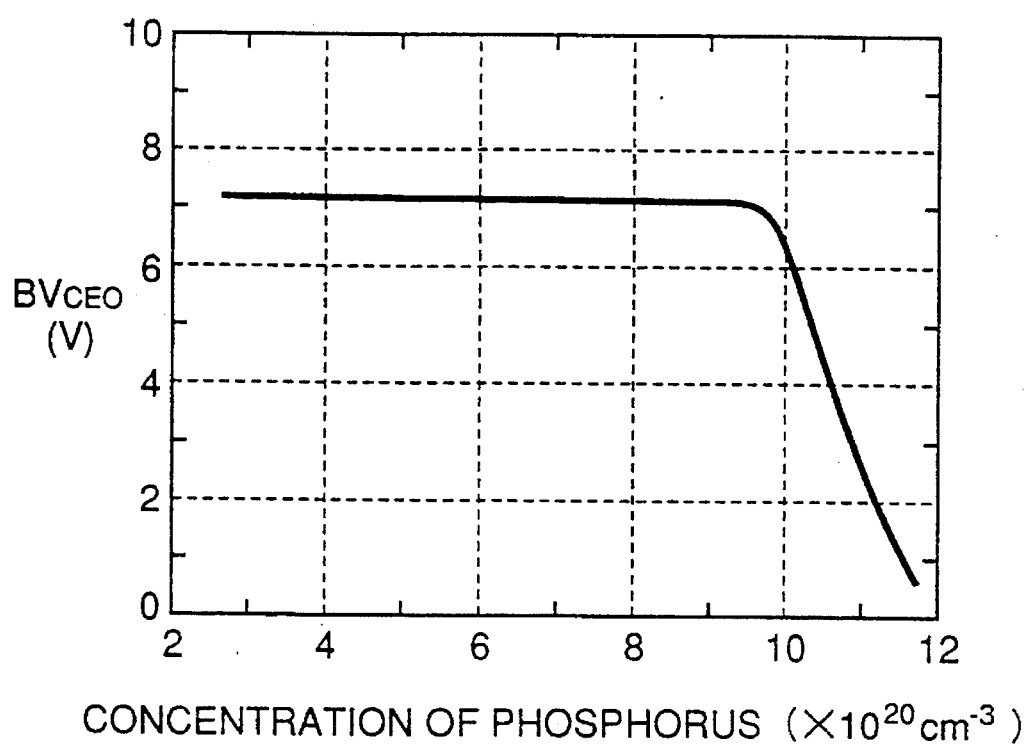
FIG. 25 shows a relationship between a phosphorus concentration and a collector-emitter breakdown voltage in the case where an emitter electrode and an interconnection layer have a polycide structure.

Therefore, collector-emitter breakdown voltage $BV_{CEO}$ does not lower below 7 V unless the concentration of phosphorus in the polycrystalline silicon forming the polycide structure as shown in FIG. 25 exceeds $1 \times 10^{21}$ cm$^{-3}$. Therefore, phosphorus can be introduced into the polycrystalline silicon at the concentration up to $1 \times 10^{21}$ cm$^{-3}$.

By the reasons described above, the upper limit of concentration of phosphorus in the polycrystalline silicon forming the polycide structure is not more than $1 \times 10^{21}$ cm$^{-3}$.

Embodiment 2

Figure 26:
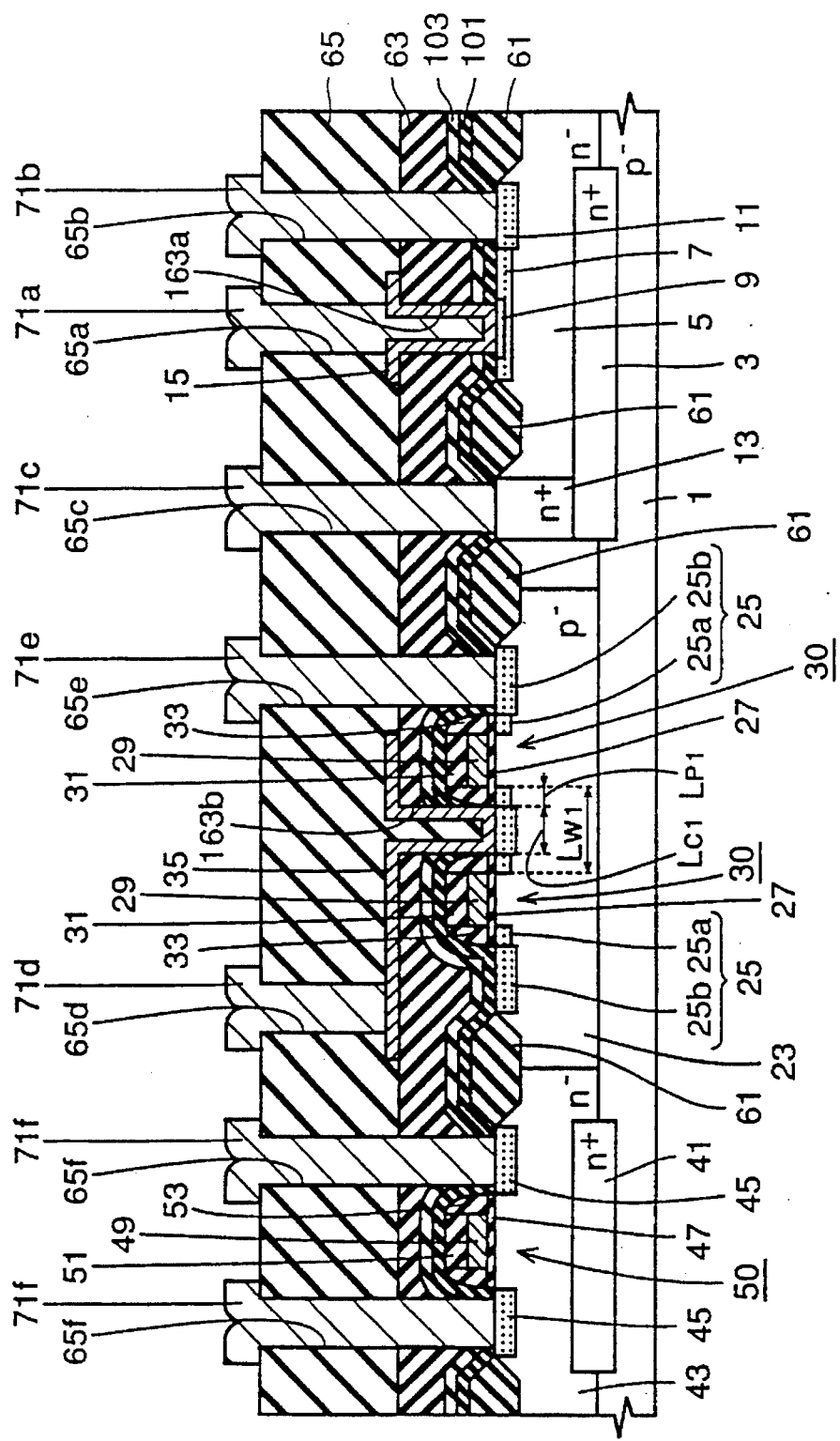
FIG. 26 is a schematic cross section showing a structure of a semiconductor device of a second embodiment of the invention.

Referring to FIG. 26, a semiconductor device of a second embodiment includes a silicon oxide film 101 and a silicon nitride film 103 in addition to the structure of the first embodiment.

Silicon oxide film 101 has a thickness of about 300 Å and is formed at the whole surface of substrate provided with the bipolar transistor, nMOS transistor 30 and pMOS transistor 50. Silicon nitride film 103 is formed on the whole surface of silicon oxide film 101 and has a thickness from about 500 to about 1000 Å. Structures other than the above are substantially the same as those of the semiconductor device of the first embodiment, and thus will not be described.

A method of manufacturing the semiconductor device of the second embodiment will be described below.

According to the manufacturing method of this embodiment, the same steps as those of the first embodiment shown in FIGS. 2 to 8 are first executed. Then, silicon oxide film 101 of about 300 Å in thickness and silicon nitride film 103 from about 500 to about 1000 Å in thickness are sequentially deposited on the whole surface by the LPCVD method. A silicon oxide film $63a_0$ from about 6000 to about 12000 Å in thickness is formed on the whole surface of silicon nitride film 103 by the LPCVD method. A film such as SOG film 67 is applied to the whole surface of silicon oxide film $63a_0$, and its top surface is substantially flattened to form the structure shown in FIG. 27.

Figure 27:
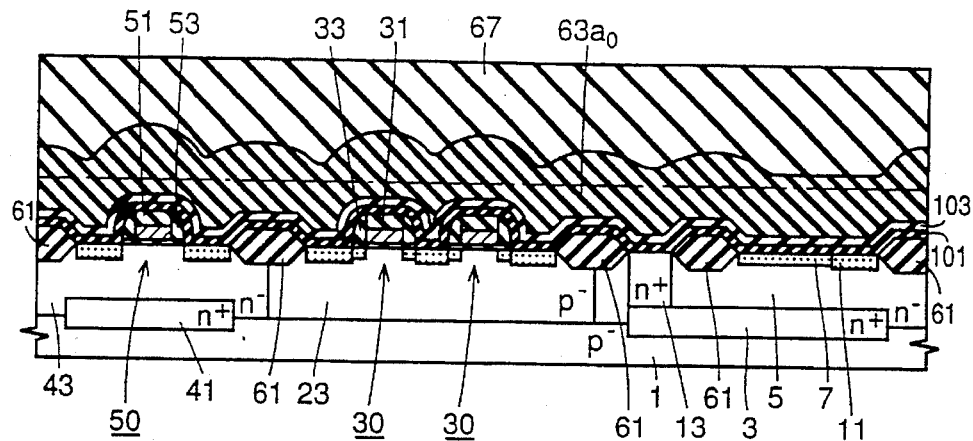
FIGS. 27 to 34 are schematic cross sections showing a process of manufacturing the semiconductor device of the second embodiment of the invention in accordance with the order of process steps.

Referring to FIG. 27, etching, for example, by the RIE method is effected on SOG film 67 and silicon oxide film $63a_0$ under the conditions that etching rates of SOG film 67 and silicon oxide film $63a_0$ are equal to each other.

Figure 28:
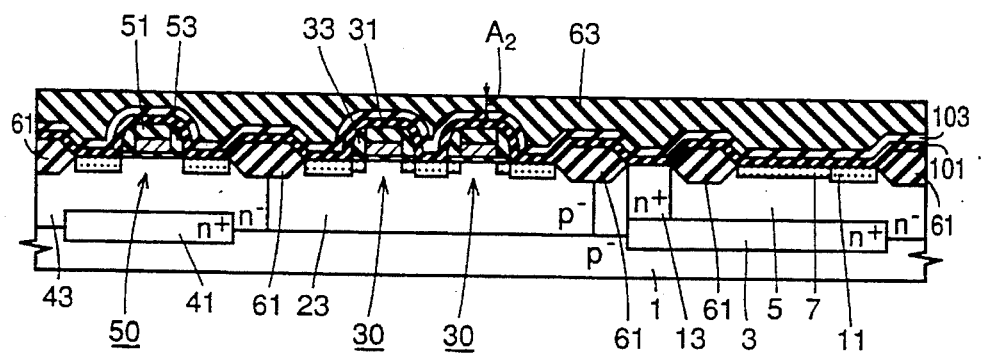

Referring to FIG. 28, by this etching first interlayer insulating film 63 is formed which has a thickness from about 500 Å to about 3000 Å at a position above the gate part and has the substantially flat top surface.

Figure 29:
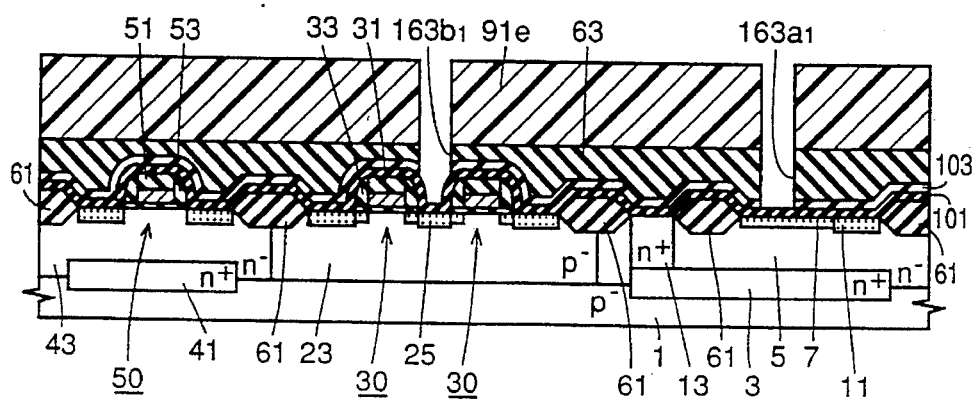

Referring to FIG. 29, photoresist 91e is applied to the whole surface of first interlayer insulating film 63, and is exposed and developed. Thereby, resist pattern 91e having a predetermined patterned configuration is formed. Using this resist pattern 91e as a mask, first interlayer insulating film 63 is etched by RIE. This etching is carried out under the conditions that an etch selectivity, for example, with respect to silicon nitride film 103 is high. By this etching, apertures reaching the surface of silicon nitride film 103 are formed at predetermined regions. Then, silicon nitride film 103 exposed at bottoms of the apertures are etched by RIE under the conditions that the etch selectivity with respect to the silicon oxide film is high. Thereafter, portions of silicon oxide film 101 exposed at the bottoms of apertures $163b_1$ and $163a_1$ are etched by RIE to expose the surface of substrate under the conditions that the etch selectivity with respect to silicon is high.

Figure 30:
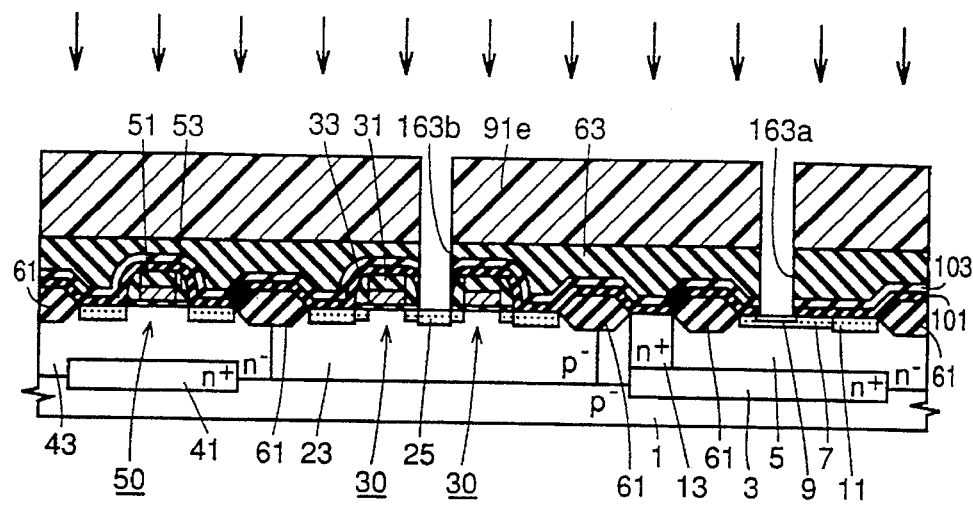

Referring to FIG. 30, by the above etching, an emitter aperture 163a exposing the surface of n$^+$ emitter region 9 and an aperture 163b partially exposing the surface of n-type source/drain region 25 are formed. Thereafter, impurity such as arsenic is implanted at about 60 keV and $1.0 \times 10^{15}$ cm$^{-2}$. By this implantation and others, n$^+$ emitter region 9 is formed within p$^-$ base region 7. Thereafter, resist pattern 91e is removed.

Figure 31:
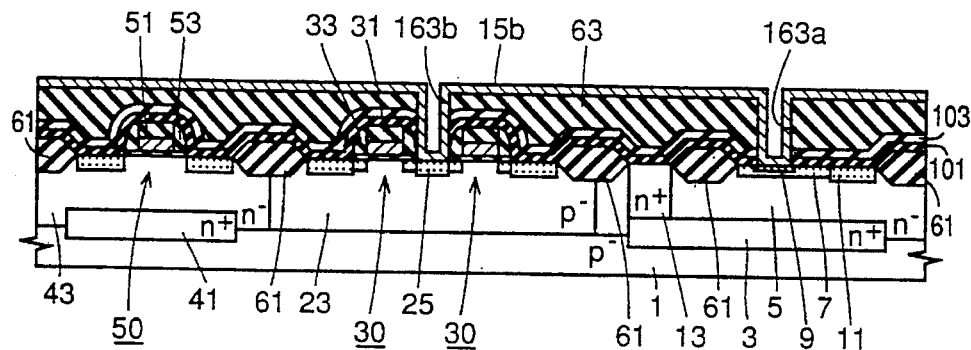

Referring to FIG. 31, LPCVD is executed at a temperature of 590° C. under a pressure from 0.3 to 0.5 Torr with gas of silane and phosphine. Thereby, a polycrystalline silicon film 15b is doped with phosphorus is formed on the whole surface. Polycrystalline silicon film 15b is substantially uniformly doped with phosphorus at a concentration from $1.0 \times 10^{20}$ cm$^{-3}$ to $6.0 \times 10^{20}$ cm$^{-3}$. Thereafter, polycrystalline silicon film 15b is patterned into a predetermined configuration.

Figure 32:
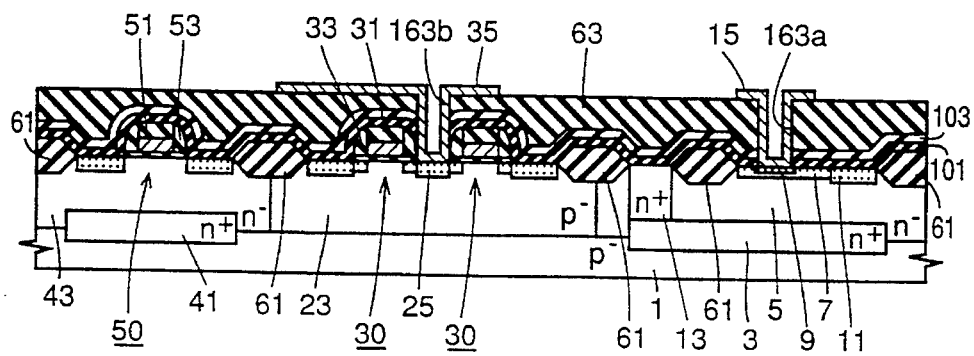

Referring to FIG. 32, by this patterning, emitter electrode 15 being in contact with the $n^+$ emitter region through emitter aperture 163a and interconnection layer 35 being in contact with n-type source/drain region 25 through aperture 163b are formed.

Figure 33:
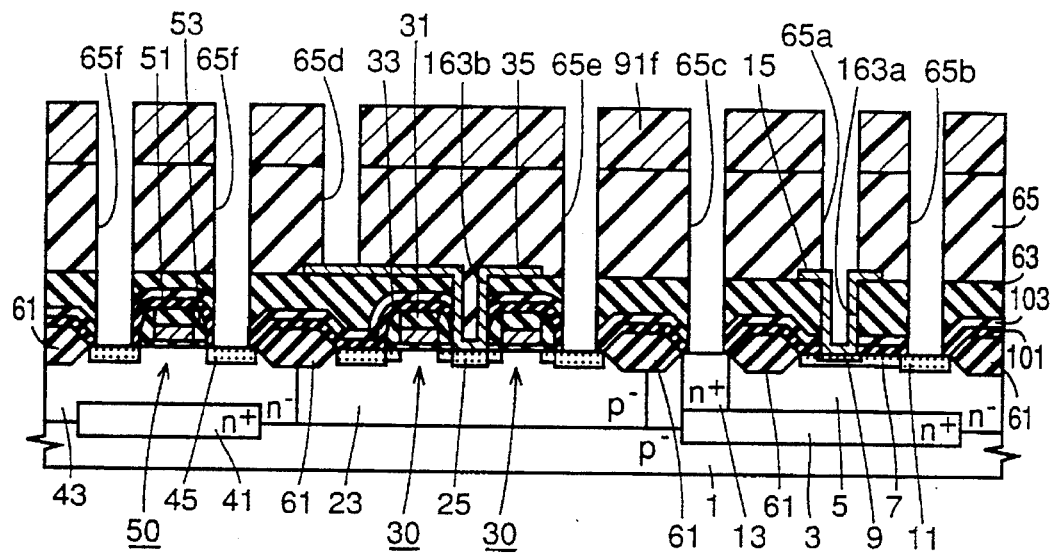

Referring to FIG. 33, second interlayer insulating film 65 covering emitter electrode 15 and interconnection layer 35 is formed on the whole surface of first interlayer insulating film 63. Resist pattern 91f having a predetermined patterned configuration is formed on the surface of second interlayer insulating film 65. Using this resist pattern 91f as a mask, etching is successively effected on first and second interlayer insulating films 63 and 65. By this etching, contact holes 65a, 65b, 65c, 65d, 65e and 65f are formed which reach the conductive layers or conductive regions at the lower level. Thereafter, resist pattern 91f is removed.

Figure 34:
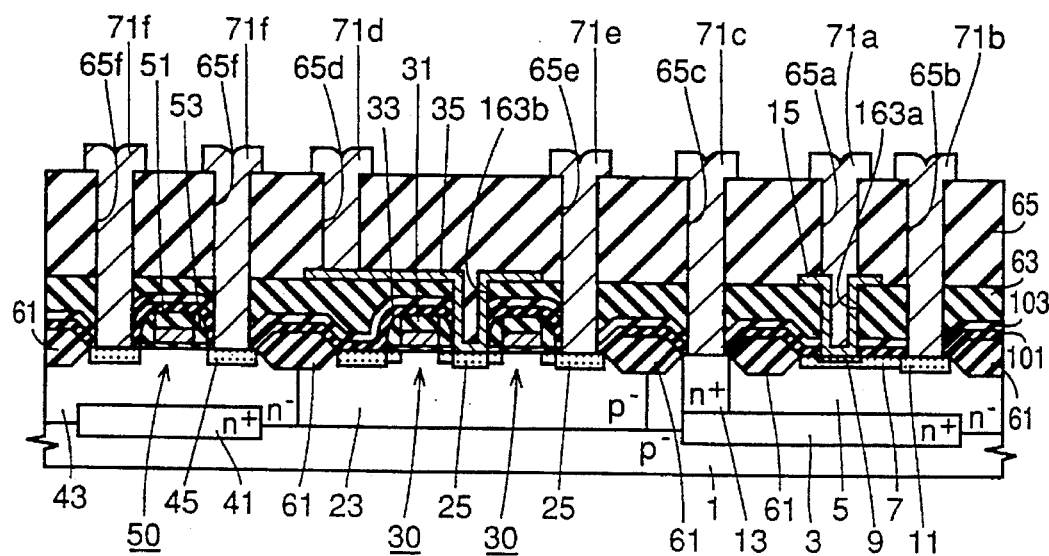

Referring to FIG. 34, contact holes 71a, 71b, 71c, 71d, 71e and 71f are formed, which are in contact with the conductive layers or conductive regions at the lower level through contact holes 65a, 65b, 65c, 65d, 65e and 65f, respectively.

The second embodiment has been described in connection with the case where each of emitter electrode 15 and interconnection layer 35 is formed of a single polycrystalline silicon film layer doped with phosphorus. This embodiment, however, is not restricted thereto, and it may employ emitter electrode 15 and interconnection layer 35 having a polycide structure as shown in FIG. 35.

Figure 35:
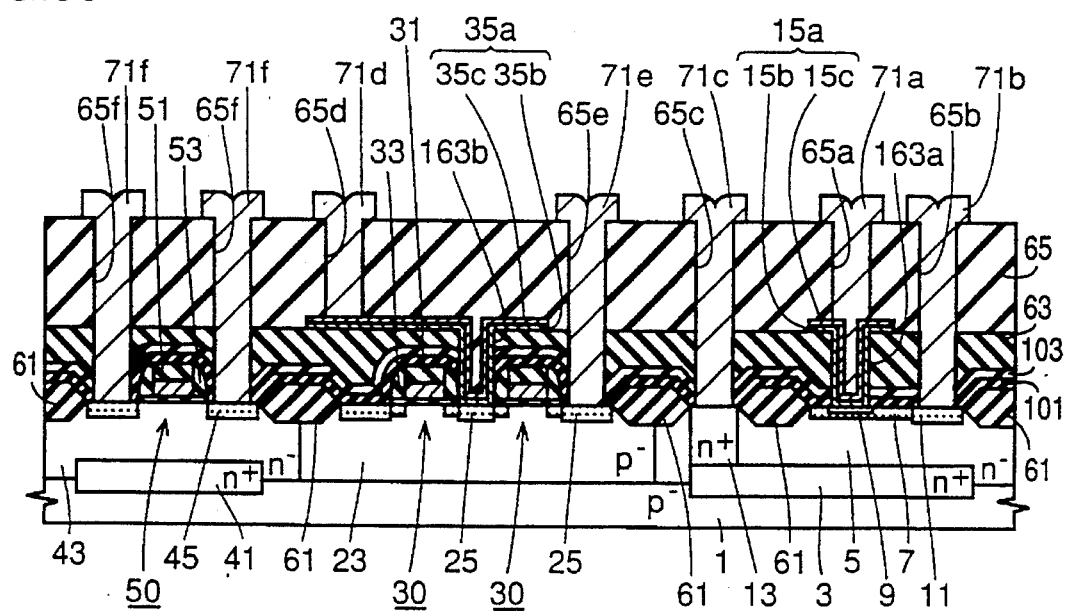
FIG. 35 is a schematic cross section showing a structure in which an emitter electrode and an interconnection layer have a polycide structure in the second embodiment of the invention.

Referring to FIG. 35, an emitter electrode 15a and an interconnection layer 35a have a polycide structure. Specifically, emitter electrode 15a and interconnection layer 35a each have a polycrystalline silicon film 15b or 35b doped with phosphorus and a silicide layer 15c or 35c formed thereon.

Polycrystalline silicon films 15b and 35b are doped with phosphorus at a concentration of $1.0 \times 10^{20}$ cm$^{-3}$ from $1.0 \times 10^{21}$ cm$^{-3}$. Silicide layers 15c and 35c are made of, for example, TiSi$_2$ (titanium silicide), WSi$_2$ (tungsten silicide) or CoSi$_2$ (cobalt silicide).

According to the manufacturing method of this embodiment, a polycrystalline silicon film forming emitter electrode 15 shown in FIG. 26 is formed to contain phosphorus by the LPCVD method, which is similar to the first embodiment. Therefore, heat treatment at a high temperature by RTA is not required, and thus the degree of integration can be improved easily.

Since the heat treatment by RTA can be eliminated, the concentration of phosphorus in the polycrystalline silicon forming emitter electrode 15 can be increased, so that the interconnection resistance can be reduced.

Therefore, the Bi-CMOS structure manufactured by the manufacturing method of this embodiment can increase the concentration of phosphorus in the polycrystalline silicon, which forms emitter electrode 15 and interconnection layer 35, to a value not less than $1 \times 10^{20}$ cm$^{-3}$. Therefore, this embodiment can achieve a remarkable effect, for example, that destruction of data stored in a memory cell in the SRAM can be prevented similarly to the first embodiment.

According to the Bi-CMOS structure of this embodiment, if each of emitter electrode 15 and interconnection layer 35 is formed of a single polycrystalline silicon layer (see FIG. 26), the concentration of phosphorus in the polycrystalline silicon film is not more than $6 \times 10^{20}$ cm$^{-3}$. If emitter electrode 15a and interconnection layer 35a have the polycide structure (see FIG. 35), the concentration of phosphorus in the polycrystalline silicon film forming the polycide structure is not more than $1 \times 10^{20}$ cm$^{-3}$. Therefore, a good collector-emitter breakdown voltage can be obtained similarly to the first embodiment.

This embodiment is additionally provided with silicon oxide film 101 and silicon nitride film 103. Owing to this, (i) a good collector-emitter breakdown voltage can be maintained, and (ii) the degree of integration can be improved easily. The reason will be described below.

(i) Maintenance of the collector-emitter breakdown voltage

Figure 36:
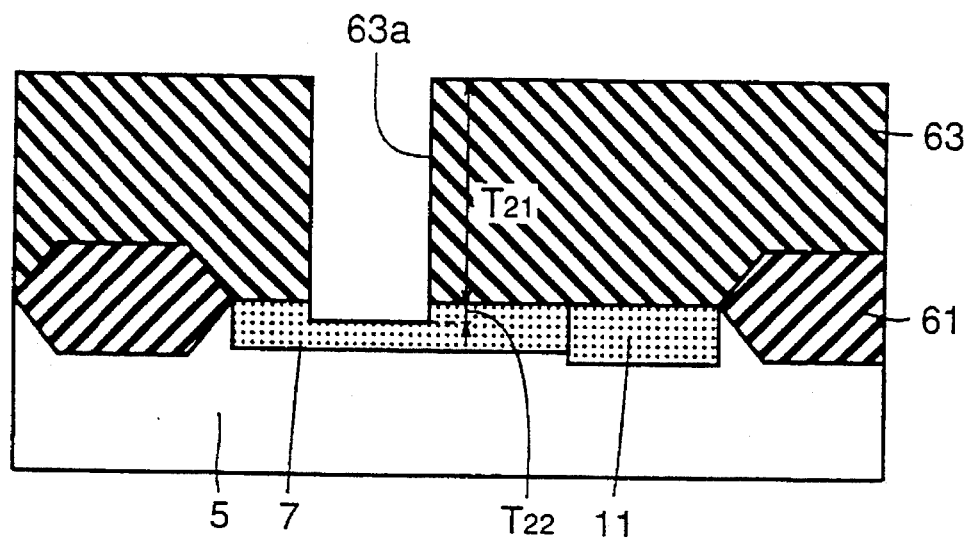
FIGS. 36 and 37 show a process of forming an n$^+$ emitter region in the first embodiment of the invention in accordance with the order of process steps.

Referring first to FIG. 36, etching is effected on first interlayer insulating film 63 with a mask so as to form aperture 163a. Since a film thickness $T_{21}$ of first interlayer insulating film 63 is not initially uniform, first interlayer insulating film 63 is generally overetched to an extent of about 10% of its film thickness. This over-etches the surface of $p^-$ base region 7, so that a deep groove having a thickness $T_{22}$ is formed at the surface of $p^-$ base region 7.

Figure 37:
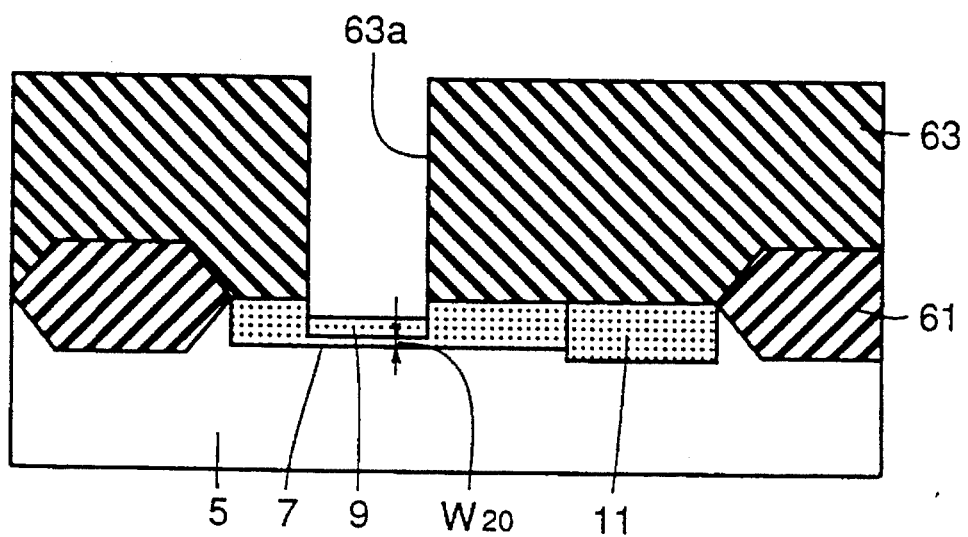

Referring to FIG. 37, $n^+$ emitter region 9 is formed in the structure provided with the groove. Formation of $n^+$ emitter region 9 is effected, for example, by ion implantation with a predetermined implantation energy. Therefore, $n^+$ emitter region 9 is formed deeper by the depth $T_{22}$ of the groove, and thereby a base width $W_{20}$ of $p^-$ base region 7 is reduced. Accordingly, the first embodiment may not ensure a good collector-emitter breakdown voltage.

Figure 38:
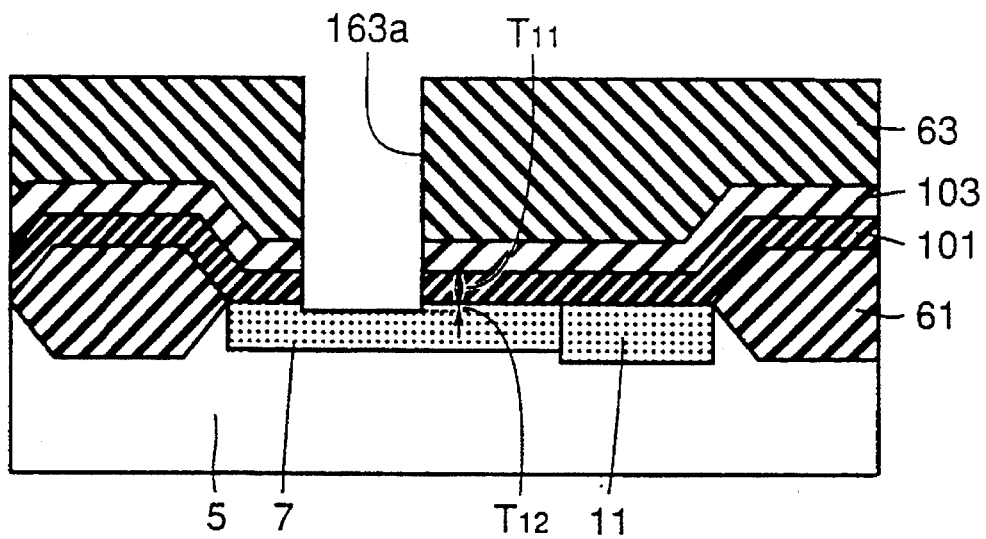
FIGS. 38 and 39 show a process of forming an n$^+$ emitter region in the second embodiment of the invention in accordance with the order of process steps.

Referring to FIG. 38, the second embodiment is provided with silicon oxide film 101 and silicon nitride film 103. Silicon nitride film 103 serves as an etch stopper when etching first interlayer insulating film 63. Silicon oxide film 101 serves as an etch stopper in etching silicon nitride film 103.

Opening 163a is extended to the surface of $p^-$ base region 7 by the etching of silicon oxide film 101. Silicon oxide film 101 has a film thickness $T_{11}$ which is set to be remarkably smaller than film thickness $T_{21}$ of first interlayer insulating film 63 shown in FIG. 36.

More specifically, film thickness $T_{11}$ of silicon oxide film 101 is 300 Å while film thickness $T_{21}$ of first interlayer insulating film 63 is from 4500 to 7000 Å. Therefore, even if over-etching of 10% is effected on the silicon oxide film 101, a depth $T_{12}$ of the groove formed at the surface of $p^-$ base region 7 is much smaller than depth $T_{22}$ of the groove formed in the first embodiment.

Figure 39:
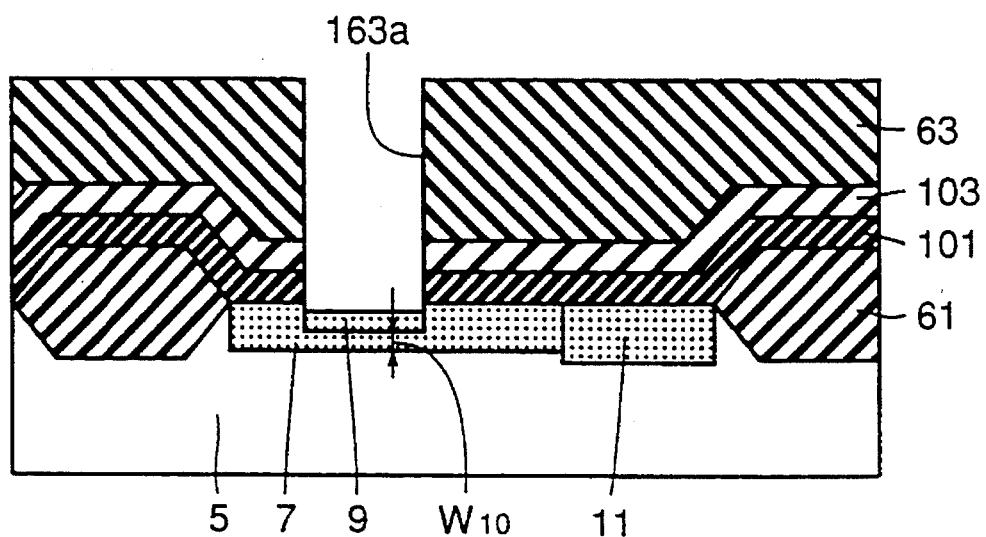

Accordingly, $n^+$ emitter region 9 is not formed at so deep a position as shown in FIG. 39, and an intended base width $W_{20}$ can be obtained. Therefore, a good collector-emitter breakdown voltage can be maintained.

(ii) Improvement of degree of integration

Since this embodiment is provided with silicon oxide film 101 and silicon nitride film 103, it is possible to form, e.g., an aperture 163b shown in FIG. 26 in a self-aligned manner.

Figure 40:
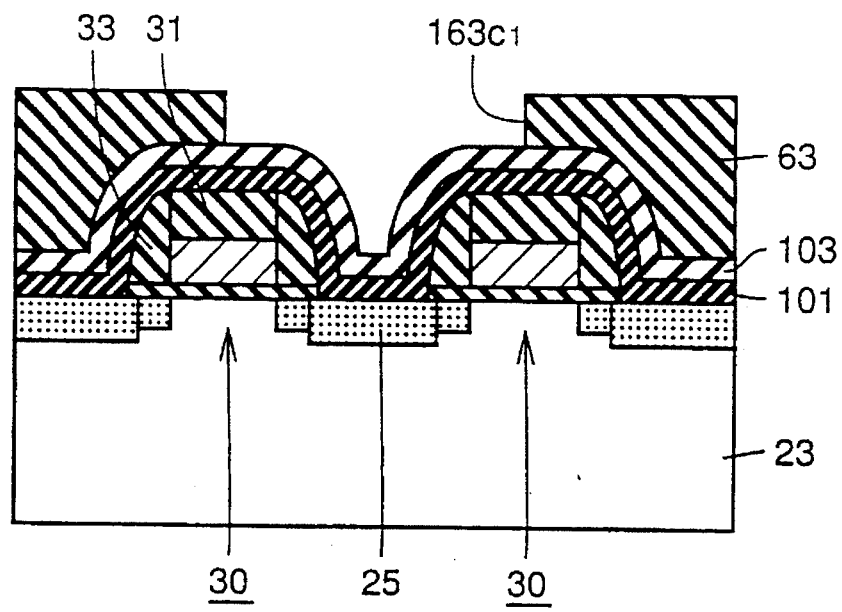
FIGS. 40 to 42 show a process of forming an aperture in a self-aligned manner in the second embodiment of the invention in accordance with the order of process steps.

Referring to FIG. 40, a first opening $163c_1$ is formed at first interlayer insulating film 63 using photolithography and etching. During this etching, silicon nitride film 103 serves as an etching stopper. Thereafter, wet etching is successively effected on silicon nitride film 103 and silicon oxide film 101.

Figure 41:
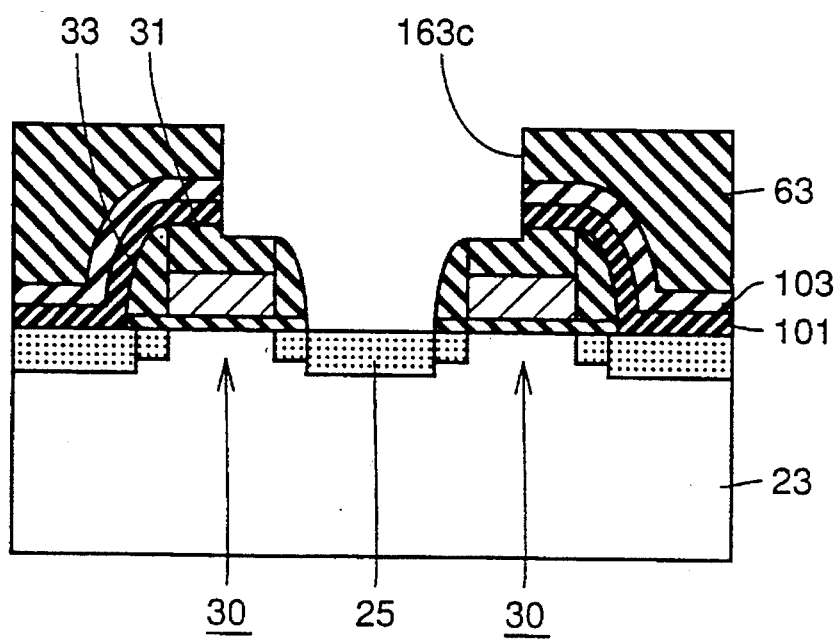

Referring to FIG. 41, by this wet etching, aperture 163c is formed exposing the surface of n-type source/drain region 25.

Figure 42:
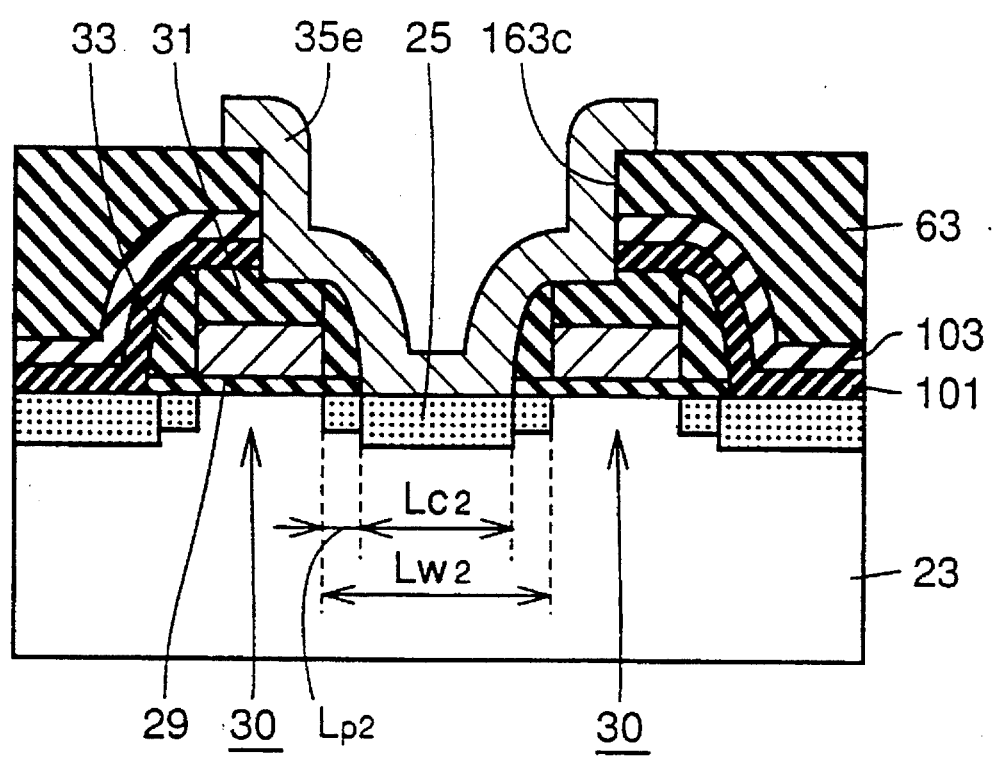

Referring to FIG. 42, interconnection layer 35e is formed to be in contact with the exposed surface of n-type source/drain region 25 through the aperture 163c.

If aperture 163c is formed in the self-aligned manner as described above, a distance $L_{P2}$ between the gate electrode 29 and interconnection layer 35e can be made shorter than a distance of possible misalignment of the mask.

Meanwhile, as to aperture 163b shown in FIG. 26, a side surface of gate electrode 29 may be exposed at a side wall of aperture 163b due to misalignment of the mask at the process shown in FIGS. 29 and 30. In this case, gate electrode 29 and polycrystalline silicon film 15b are short-circuited when polycrystalline silicon 15b is formed at the process in FIG. 31.

In order to prevent the short-circuit, distance between gate electrode 29 and interconnection layer 35 shown in FIG. 26 must be larger than a distance (from about 0.1 to about 0.2 µm) of possible misalignment of the mask. Meanwhile, an inner diameter $L_{c1}$ of aperture 63b cannot be reduced below a predetermined size (about 0.4 to about 0.5 µm) due to limitation by photolithography. Therefore, as distance $L_{P1}$ between gate electrode 29 and interconnection layer 35 increases, a distance $L_{w1}$ between gate electrodes 29 inevitably increases. Consequently, it is difficult to attain high integration with the aperture 63b shown in FIG. 26.

Meanwhile, according to the self-aligned manner described before, a mask is not required when etching the silicon nitride film and silicon oxide film 101. Therefore, it is not necessary to take into account the misalignment of the mask. Therefore, as shown in FIG. 42, a distance $L_{P2}$ between gate electrode 29 and interconnection layer 35e can be made smaller than the distance of possible misalignment of the mask. Accordingly, a distance $L_{w2}$ between gate electrodes 29 can be reduced in accordance with reduction of distance $L_{p2}$, and thus high integration can be achieved.

Embodiment 3

Figure 43:
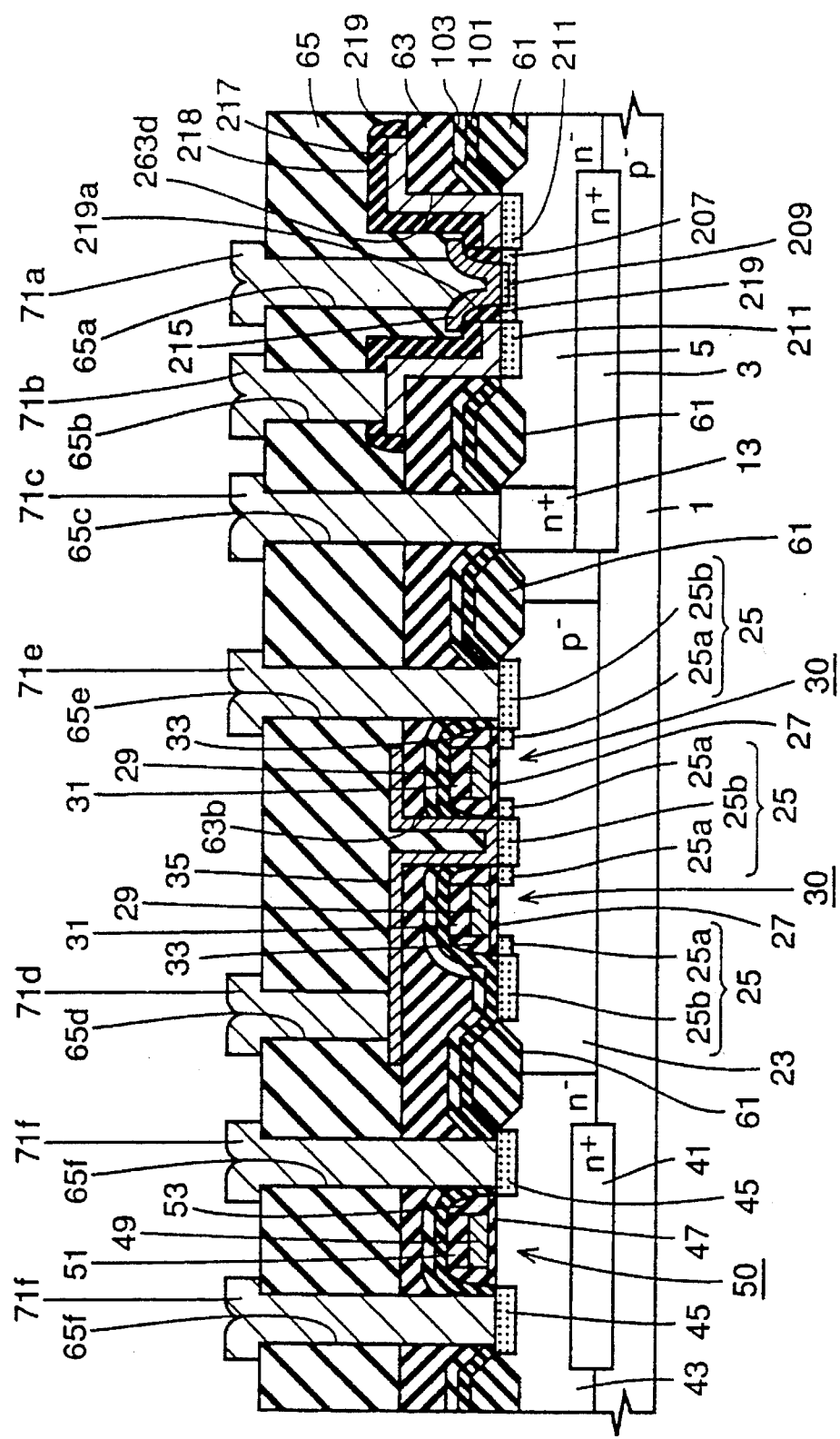
FIG. 43 is a schematic cross section showing a structure of a semiconductor device of a third embodiment of the invention.

Referring to FIG. 43, a Bi-CMOS structure has a bipolar transistor region 210, an nMOS transistor region 220 and pMOS transistor region 240 all of which are formed on the same semiconductor substrate.

The Bi-CMOS structure in this embodiment differs from the second embodiment in the structure of bipolar transistor region 210.

In bipolar transistor region 210, $n^+$ buried layer 3 is formed on the surface of $p^-$ semiconductor substrate 1 made of silicon doped with impurity. The $n^-$ epitaxial growth layer 5 and $n^+$ diffusion layer 13 for leading the collector are formed on the surface of $n^+$ buried layer 3.

A $p^-$ base region 207 and a $p^+$ external base region 211 adjoining to each other are formed on the surface of $n^-$ epitaxial growth layer 5. An $n^+$ emitter region 209 is formed within $p^-$ base region 207. Bipolar transistor region 210 is covered with first interlayer insulating film 63. First interlayer insulating film 63 is provided with an aperture 263d communicated with $p^-$ base region 207, $n^+$ emitter region 209 and $p^-$ external base region 211.

A base leading electrode 217 is formed on the surface of first interlayer insulating film 63 and is in contact with $p^+$ external base region 211 through aperture 263d. A silicon oxide film 218 is formed on base electrode 217. An end surface (i.e., side surface) of base leading electrode 217 is covered with a sidewall oxide film 219. An emitter aperture 219a, which has a configuration defined by sidewall oxide film 219 and reaches the surface of $n^+$ emitter region 209, is formed in base aperture 263d.

An emitter electrode 215 is in contact with $n^+$ emitter region 209 through emitter aperture 219a. Emitter electrode 215 is made of polycrystalline silicon which is doped with phosphorus at a concentration from $1 \times 10^{20}$ cm$^{-3}$ to $6 \times 10^{20}$ cm$^{-3}$.

Emitter electrode 215 and base electrode 217 are covered with second interlayer insulating film 65 formed on the surface of first interlayer insulating film 63. Second interlayer insulating film 65 is provided with contact holes 65a and 65b reaching emitter electrode 215 and base electrode 217, respectively. Conductive layers 71a and 71b are in contact with emitter electrode 215 and base electrode 217 through contact holes 65a and 65b, respectively.

First and second interlayer insulating films 63 and 65 are also provided with a contact hole 65c reaching $n^+$ diffusion layer 13. A conductive layer 71c is in contact with $n^+$ diffusion layer 13 through contact hole 65c.

Structures other than those in bipolar transistor region 210 is substantially the same as those of the second embodiment, and thus will not be described below.

A method of manufacturing the semiconductor device of the third embodiment of the invention will be described below.

Figure 44:
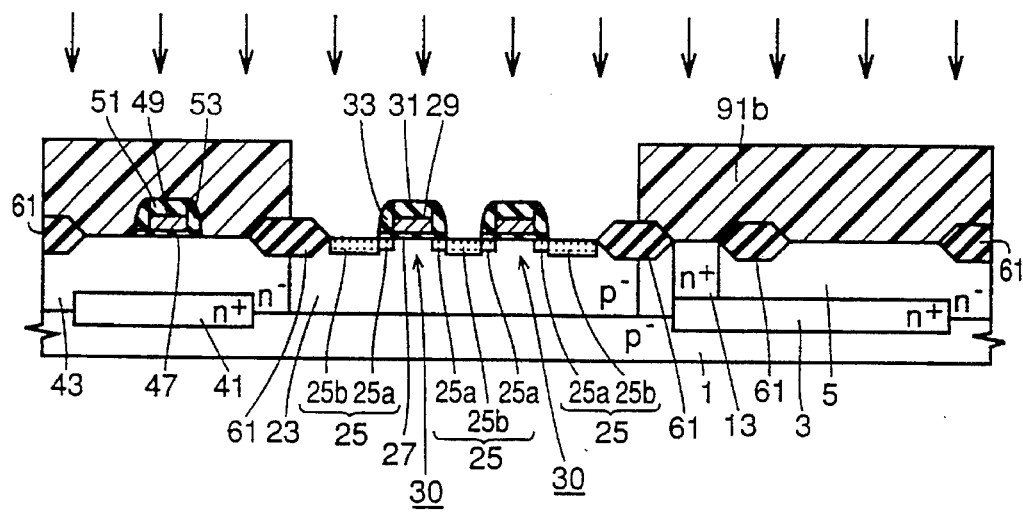
FIGS. 44 to 58 are schematic cross section showing a process of manufacturing the semiconductor device of the third embodiment of the invention in accordance with the order of process steps.

Referring to FIG. 44, a process from the first step to the step shown in FIG. 44 is the same as that in the manufacturing method of the first embodiment shown in FIG. 6, and thus will not be described below.

Figure 45:
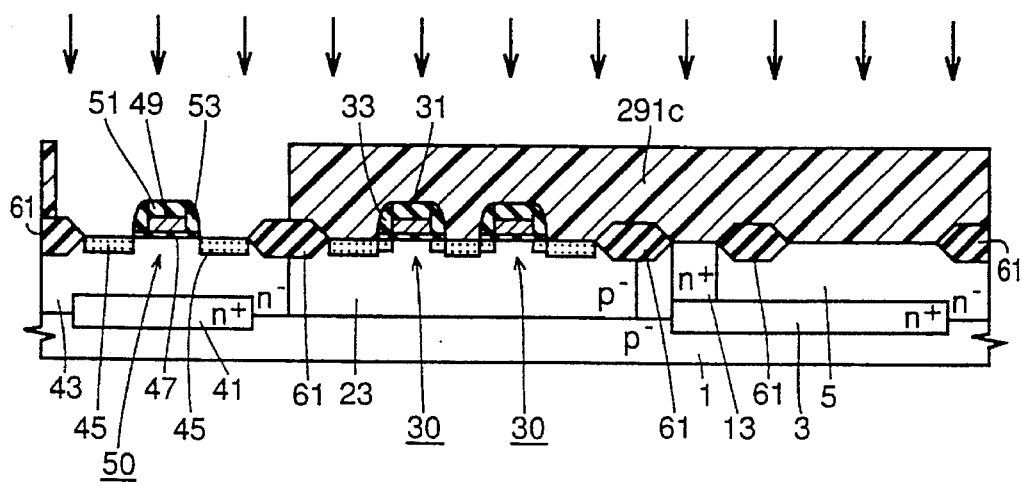

Referring to FIG. 45, photoresist is applied to the whole surface, and is exposed and developed. Thereby, a resist pattern 291c exposing the pMOS transistor region is formed. Using resist pattern 291c as a mask, impurity such as $BF_2$ is implanted at about 20 keV and $4.0 \times 10^{15}$ cm$^{-2}$. Thereby, a pair of $p^+$ source/drain regions 45 are formed at the surface of n- well region 43. A pair of source/drain regions 45, gate oxide film 47 and gate electrode 49 form pMOS transistor 50. Thereafter, resist pattern 291c is removed.

Figure 46:
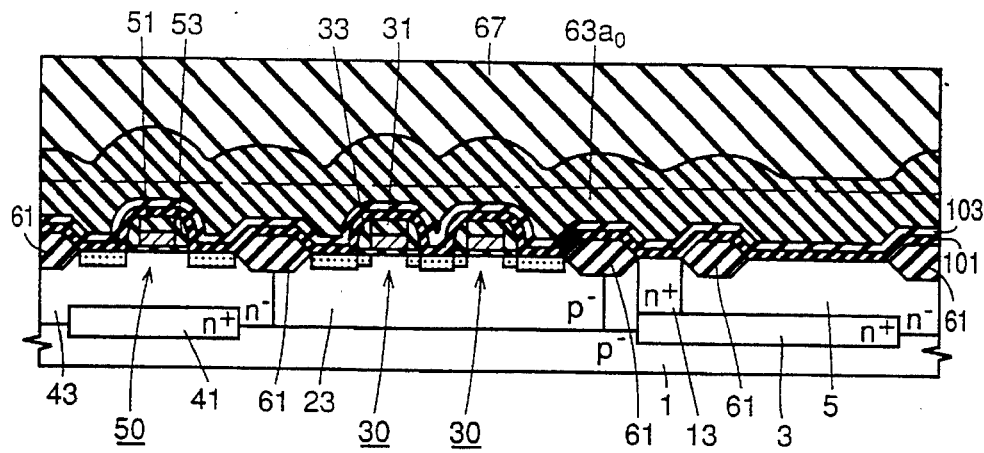

Referring to FIG. 46, silicon oxide film 101 of about 300 Å in thickness and silicon nitride film 103 from about 500 to about 1000 Å in thickness are formed on the whole surface by the LPCVD method. Silicon oxide film $63a_0$ from about 6000 to about 12000 Å in thickness is formed on the whole surface of silicon nitride film 103 by the LPCVD method. A film such as SOG film 67 is applied to the surface of silicon oxide film 63a. Since SOG film 67 is liquid, it tends to be collected in cavities at stepped portions on the base, if any. Therefore, SOG film 67 has thick portions above the cavities, and has a substantially flat top surface. Thereafter, SOG film 67 and silicon oxide film 63a are etched up to a level indicated by alternate long and short dash line, by e.g. the RIE method under the conditions that etching rates of SOG film 67 and silicon oxide film 63a are equal to each other.

Figure 47:
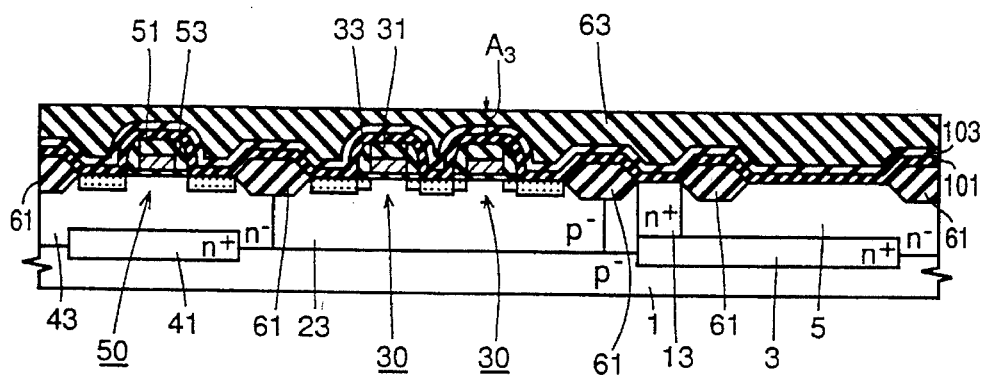

Referring to FIG. 47, by the above etching, first interlayer insulating film 63 is formed which has a thickness $A_3$ from about 500 Å to about 3000 Å at a position above the gate part and has a substantially flat top surface.

Figure 48:
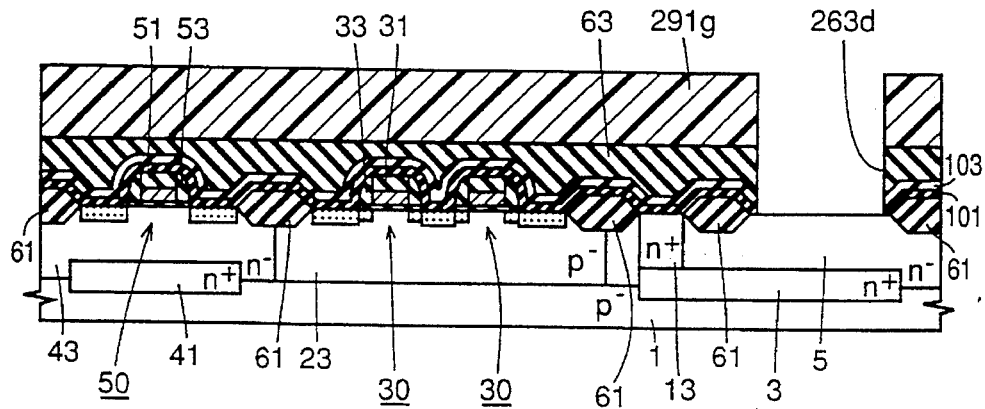

Referring to FIG. 48, photoresist is applied to the whole surface of first interlayer insulating film 63, and is exposed and developed. Thereby, a resist pattern 291g having a hole pattern located above a predetermined region of the bipolar transistor region is formed. Using this resist pattern 291g as a mask, first interlayer insulating film 63 is etched by the RIE method to expose the top surface of silicon nitride film 103. This etching is carried out under the conditions that the etching selection ratio, for example, with respect to silicon nitride film 103 is high. Then, silicon nitride film 103 is etched by RIE to expose the top surface of silicon oxide film 101 under the conditions that the etch selectivity with respect to silicon oxide film 101 is high. Further, silicon oxide film 101 is etched by RIE to expose the surface of $n^+$ epitaxial growth layer 5 under the conditions that the etch selectivity with respect to silicon is high. Thus a base aperture 263d is formed partially exposing the surface of n+ epitaxial growth layer 5. Thereafter, resist pattern 291g is removed.

Figure 49:
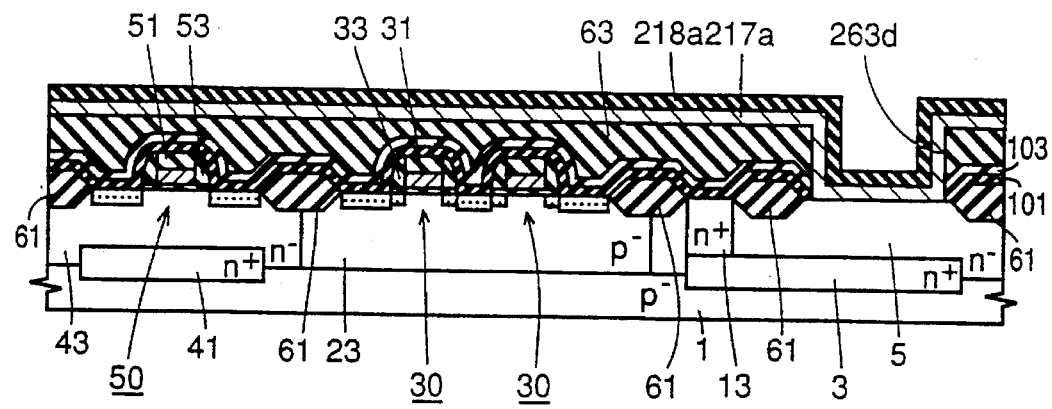

Referring to FIG. 49, a polycrystalline silicon film 217a of about 2000 Å in thickness is formed on the whole surface by the LPCVD method. Impurity such as $BF_2$ is implanted into the whole surface of polycrystalline silicon film 217a at about 40 keV and about $4.0 \times 10^{15}$ cm$^{-2}$. A silicon oxide film 218a of about 2000 Å in thickness is formed by the LPCVD method on the whole surface of polycrystalline silicon film 217a.

Figure 50:
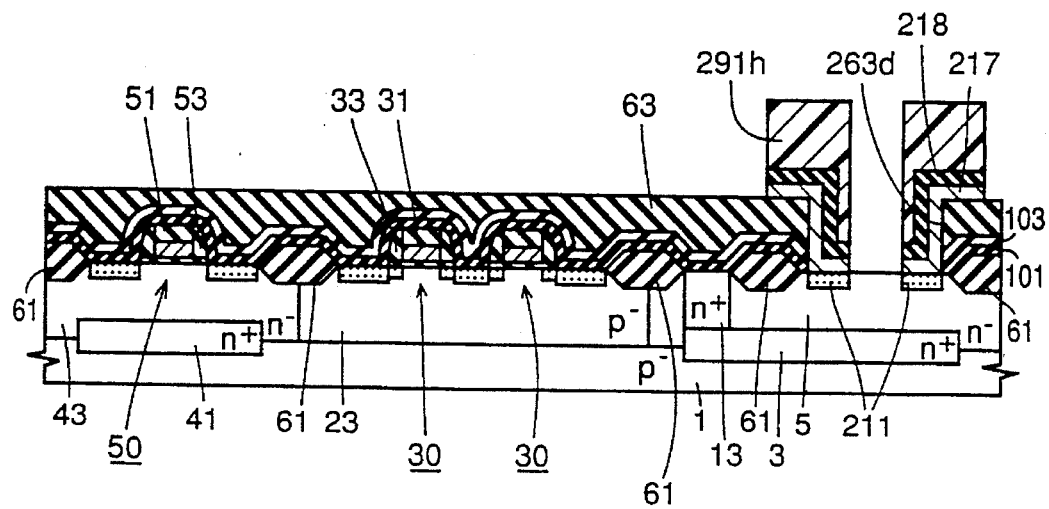

Referring to FIG. 50, a resist pattern 291h having an intended configuration is formed on a predetermined region of silicon oxide film 218a. Using resist pattern 291h as a mask, etching is successively effected on silicon oxide film 218a and polycrystalline silicon film 217a. By this etching, a base electrode 217 is formed which is in contact with the surface of n+ epitaxial growth layer 5 through base aperture 263d. An emitter aperture results from the formation of base electrode 217. Thereafter, a predetermined heat treatment is effected, whereby boron in base electrode 217 is diffused into n+ epitaxial growth layer 5 and thereby p+ external base region 211 is formed.

Figure 51:
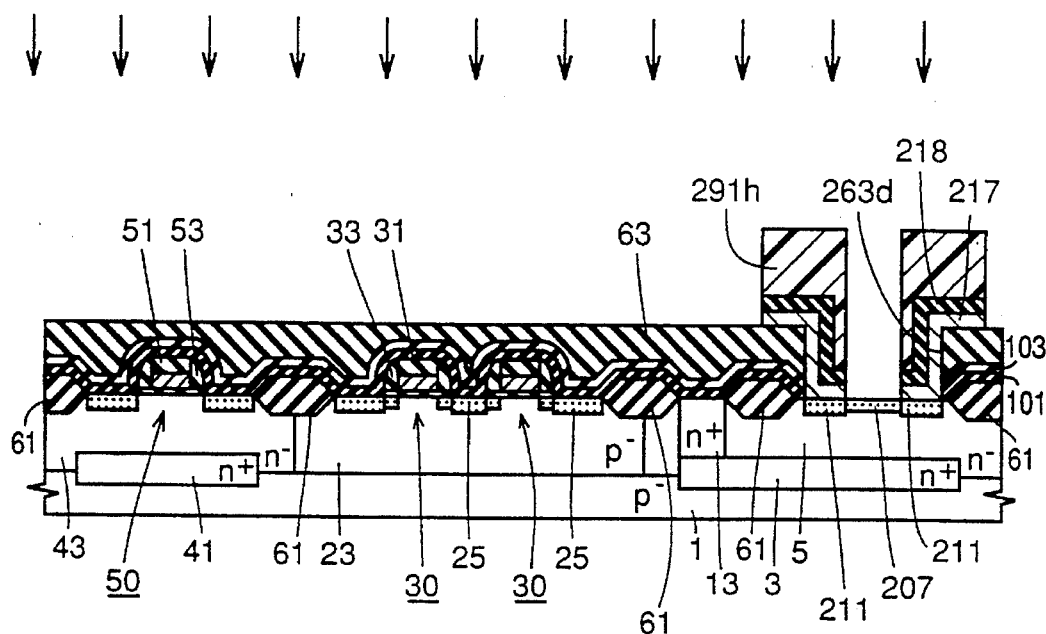

Referring to FIG. 51, impurity such as $BF_2$ is implanted at about 50 kev and $1.0 \times 10^{14}$ cm$^{-2}$. By this implantation and others, p− base region 207 is formed which adjoins to p+ external base region 211, on the surface of n+ epitaxial growth layer 5. Thereafter, resist pattern 291h is removed.

Figure 52:
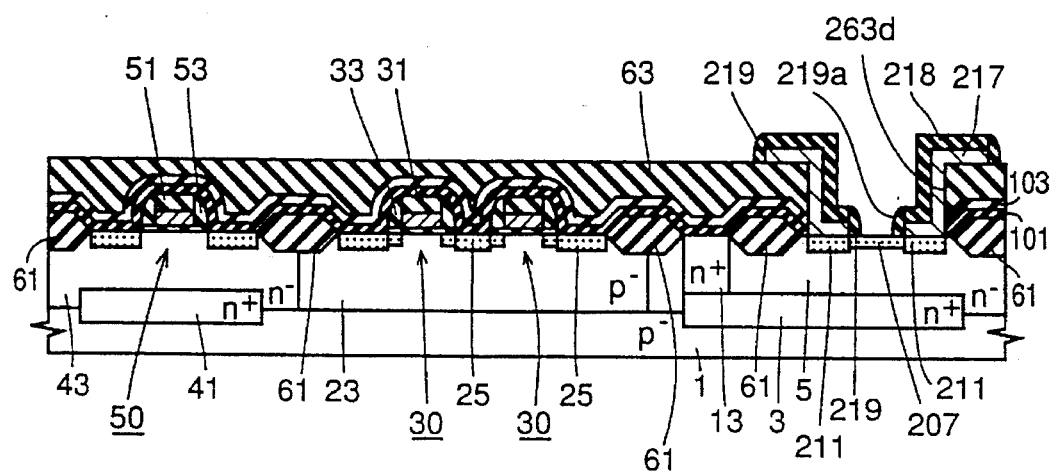

Referring to FIG. 52, a silicon oxide film (not shown) of about 2000 Å in thickness is formed on the whole surface by the LPCVD method, and then the whole surface of this silicon oxide film is etched, for example, by RIE. By this etching, the sidewall oxide film 219 covering the end surface (side surface) of base electrode 217 is formed. Also emitter aperture 219a is formed and defined by the surface of sidewall oxide film 219.

Figure 53:
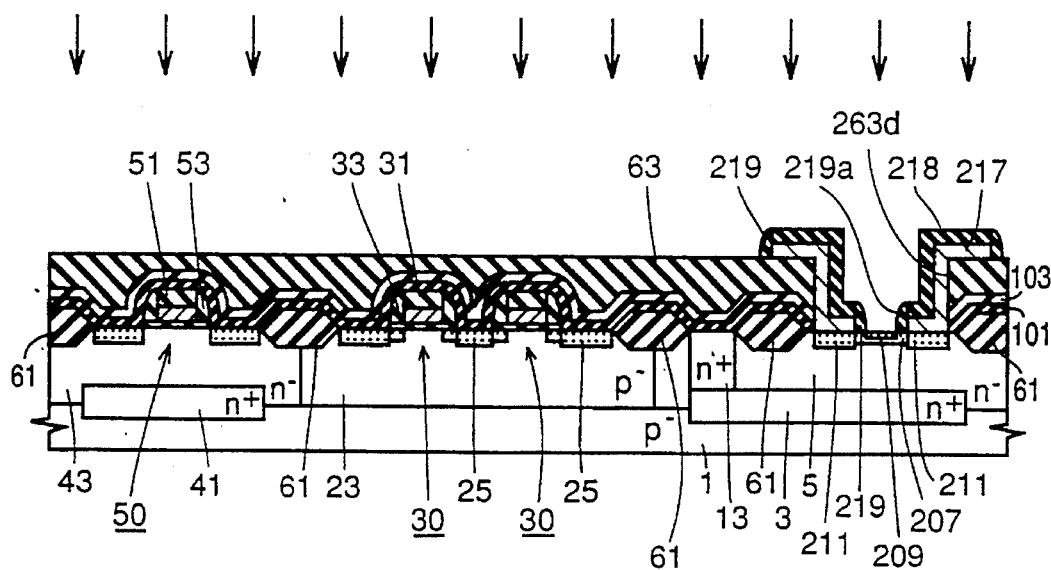

Referring to FIG. 53, using sidewall oxide film 219 as a mask, impurity such as arsenic is implanted at about 60 keV and $1.0 \times 10^{15}$ cm$^{-2}$. This implantation forms n+ emitter region 209 at the surface of p− base region 207.

Figure 54:
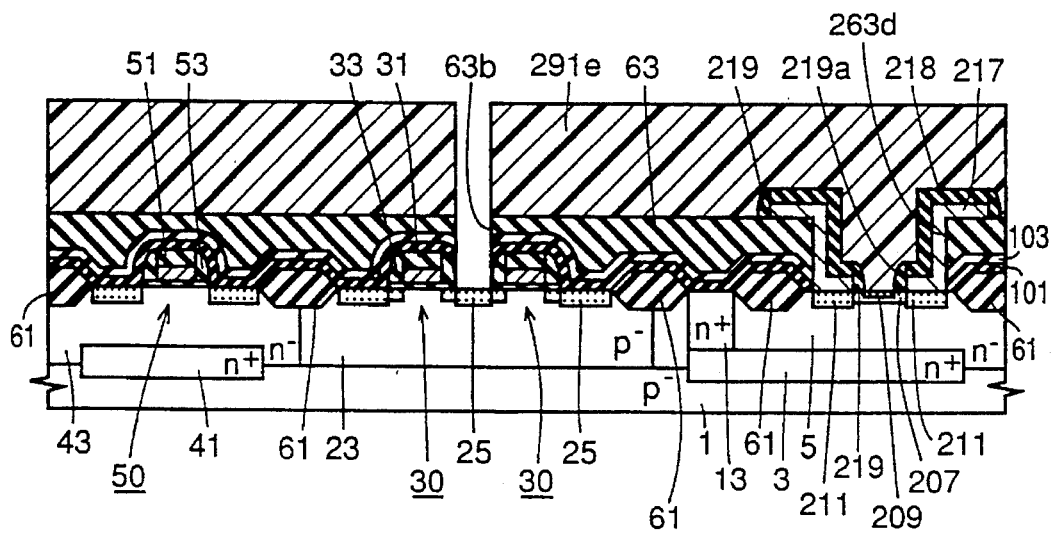

Referring to FIG. 54, photoresist is applied to the whole surface, and is exposed and developed. Thereby, a resist pattern 291e having an intended configuration is formed. Using resist pattern 291e as a mask, first interlayer insulating film 63, silicon nitride film 103 and silicon oxide film 101 are sequentially etched, for example, by RIE. This etching forms aperture 163b partially exposing the surface of n-type impurity region 25. Thereafter, resist pattern 291e is removed.

Figure 55:
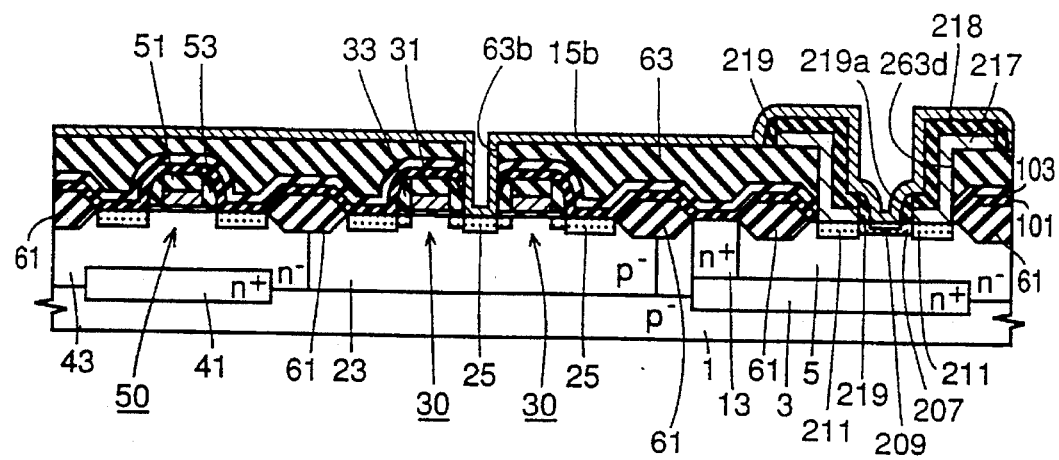

Referring to FIG. 55, LPCVD is executed at a temperature of 590° C. under a pressure from 0.3 to 0.5 Torr with gas of silane and phosphine. Thus polycrystalline silicon film 15b doped with phosphorus and having a thickness of about 2000 Å is formed. The concentration of phosphorus in polycrystalline silicon film 15b is in a range from about $1.0 \times 10^{20}$ cm$^{-3}$ to about $6.0 \times 10^{20}$ cm$^{-3}$. Thereafter, polycrystalline silicon film 15b is patterned by photolithography and etching.

Figure 56:
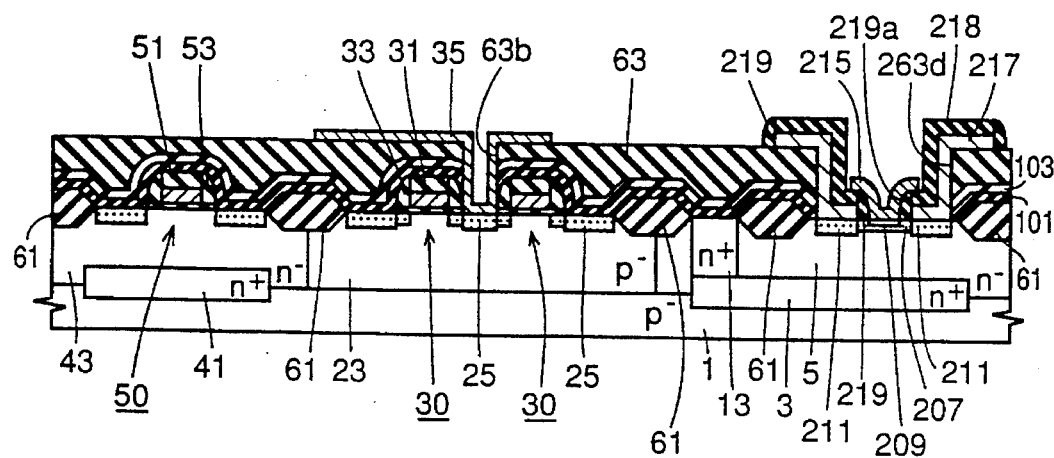

Referring to FIG. 56, by this patterning, emitter electrode 215, which is in contact with n+ emitter region 209 through emitter aperture 219a, and interconnection layer 35 which is in contact with n-type source/drain region 25 through aperture 163b are formed.

Figure 57:
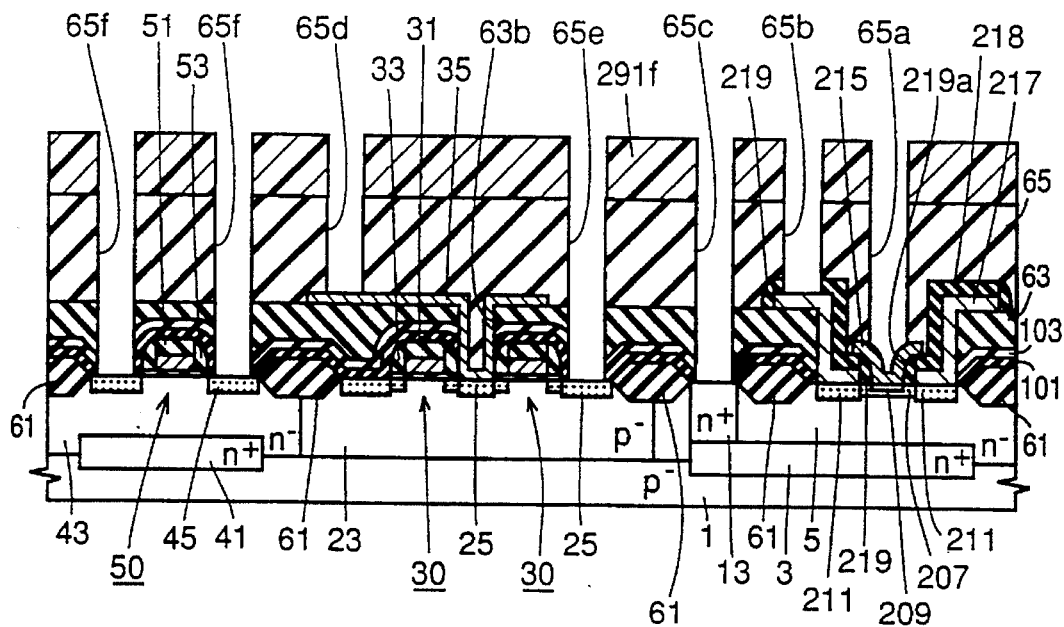

Referring to FIG. 57, second interlayer insulating film 65 is formed on the whole surface of first interlayer insulating film 63 to cover emitter electrode 215 and interconnection layer 35. A resist pattern 291f having a predetermined configuration is formed on second interlayer insulating film 65. Using resist pattern 291f as a mask, etching is effected on first and second interlayer insulating films 63 and 65, e.g., by RIE. Thereby, contact holes 65a, 65b, 65c, 65d, 65e and 65f are formed in the first and second interlayer insulating films. Thereafter, resist pattern 291f is removed.

Figure 58:
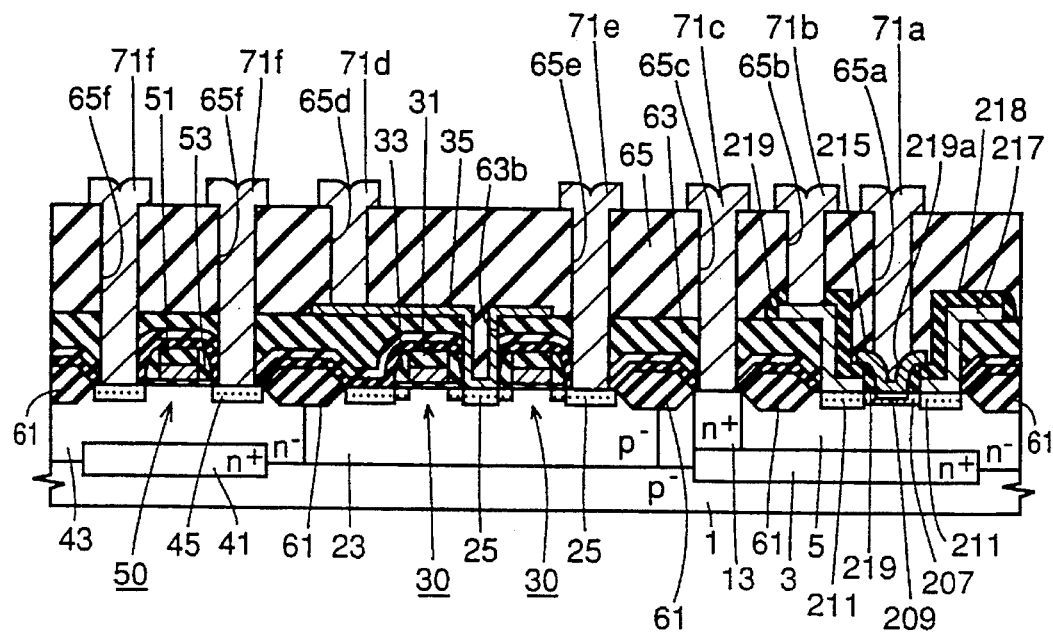

Referring to FIG. 58, conductive layers 71a, 71b, 71c, 71d, 71e and 71f are formed to be in contact with conductive layers or conductive regions through contact holes 65a, 65b, 65c, 65d, 65e or 65f, respectively.

In this embodiment, emitter electrode 15 and interconnection layer 35 are each made of a single polycrystalline silicon film layer doped with phosphorus. Emitter electrode 15 and interconnection layer 35 may have different structure, and specifically may have a polycide structure as shown in FIG. 59.

Figure 59:
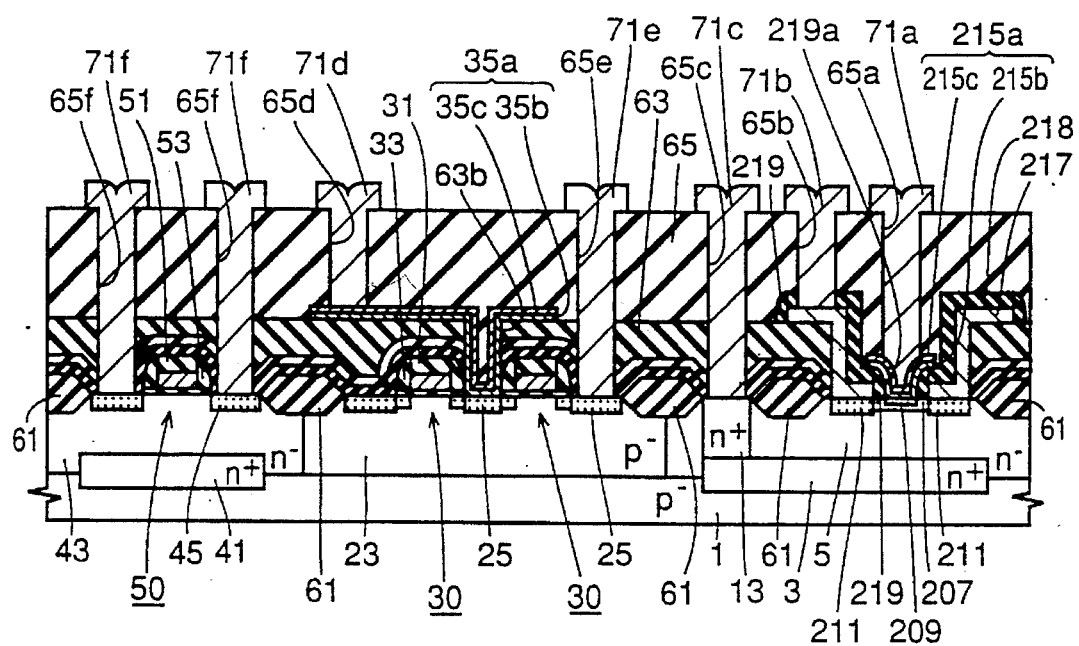
FIG. 59 is a schematic cross section showing a structure in which an emitter electrode and an interconnection layer have a polycide structure in the third embodiment of the invention.

Referring to FIG. 59, an emitter electrode 215a has the polycide structure, and is formed of a polycrystalline silicon film 215b and a metal silicide layer 215c formed thereon. Polycrystalline silicon film 215b is doped with phosphorus at a concentration from $1 \times 10^{20}$ cm$^{-3}$ to $1 \times 10^{21}$ cm$^{-3}$.

Interconnection layer 35a also has a polycide structure and is formed of polycrystalline silicon film 35b and metal silicide layer 35c formed thereon. Polycrystalline silicon film 35b is doped with phosphorus at a concentration from $1 \times 10^{20}$ cm$^{-3}$ to $1 \times 10^{21}$ cm$^{-3}$.

According to the manufacturing method of this embodiment, the polycrystalline silicon film which forms emitter electrode 215 and interconnection layer 35 and contains phosphorus is formed by the LPCVD method after n+ emitter region 209 is formed in p− base region 207, similarly to the first embodiment. Therefore, heat treatment at a high temperature by RTA is not required, and thus the degree of integration can be improved easily. Since the heat treatment by RTA can be eliminated, the concentration of phosphorus in the polycrystalline silicon forming emitter electrode 215 and interconnection layer 35 can be increased, so that the interconnection resistance can be reduced.

Therefore, the Bi-CMOS structure manufactured by the manufacturing method of this embodiment can increase the concentration of phosphorus in the polycrystalline silicon forming emitter electrode 215 and interconnection layer 35 to at least $1 \times 10^{20}$ cm$^{-3}$. Therefore, it can achieve a remarkable effect. For example, the destruction of data stored in a memory cell in the SRAM can be prevented, similarly to the first embodiment.

If each of emitter electrode 215 and interconnection layer 35 is formed of a single polycrystalline silicon film layer (see FIG. 43), the concentration of phosphorus in the polycrystalline silicon film is not more than $6 \times 10^{20}$ cm$^{-3}$. If emitter electrode 215a and interconnection layer 35a have the polycide structure (see FIG. 59), the concentration of phosphorus in the polycrystalline silicon film forming the polycide structure is not more than $1 \times 10^{21}$ cm$^{-3}$. Therefore, a good collector-emitter breakdown voltage can be obtained similarly to the first embodiment.

This embodiment is additionally provided with silicon oxide film 101 and silicon nitride film 103. Owing to this, a good collector-emitter breakdown voltage can be maintained, and the degree of integration can be improved easily, similarly to the second embodiment.

Since this embodiment is additionally provided with sidewall oxide film 219a, the base resistance can be reduced and the degree of integration can be further improved.

Figure 60:
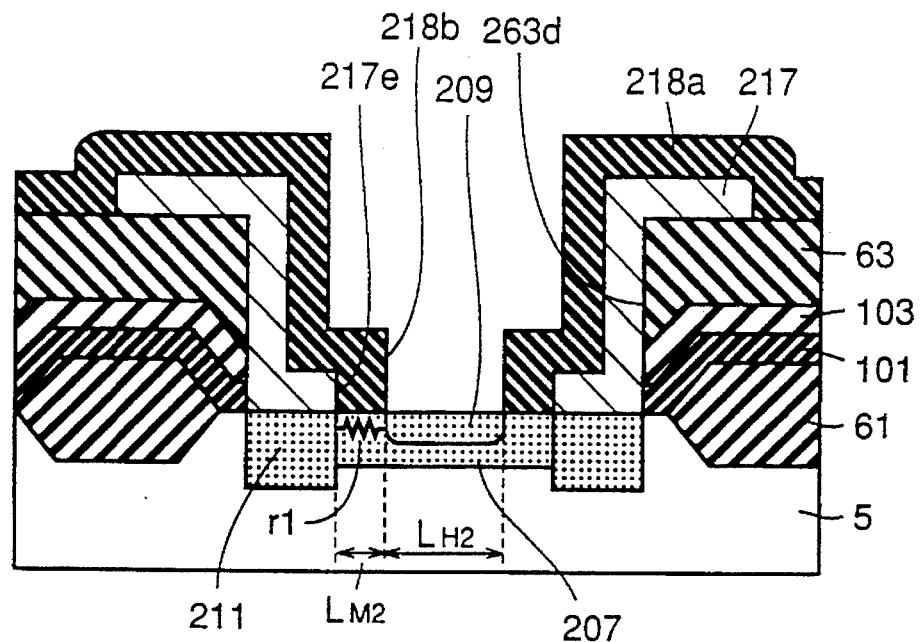
FIG. 60 is a schematic cross section showing a manner in which in emitter aperture is formed in an insulating film on a base electrode by photolithography without providing a sidewall oxide film.

Referring to FIG. 60, the process for forming emitter aperture 218b by photolithography must be executed, taking into account the possible misalignment of the mask. If the mask were misaligned, emitter aperture 218b would not be not formed at a predetermined position and would be dislocated. If misaligned, the end surface (side surface) 217e of base electrode 217 might be exposed at the side wall of emitter aperture 218b. If the emitter electrode were formed while the end surface (side surface) 217e of base electrode 217 was exposed, base electrode 217 and the emitter electrode would be short-circuited.

In order to prevent this short-circuit, a distance $L_{M2}$ between base electrode 27 and emitter aperture 218b must be larger than a distance of possible misalignment of the mask. The large distance $L_{M2}$ increases a distance between p$^+$ external base region 211 and n$^+$ emitter region 209, resulting in a disadvantage that a large parasitic capacitance $r_1$ is produced therebetween.

Figure 61:
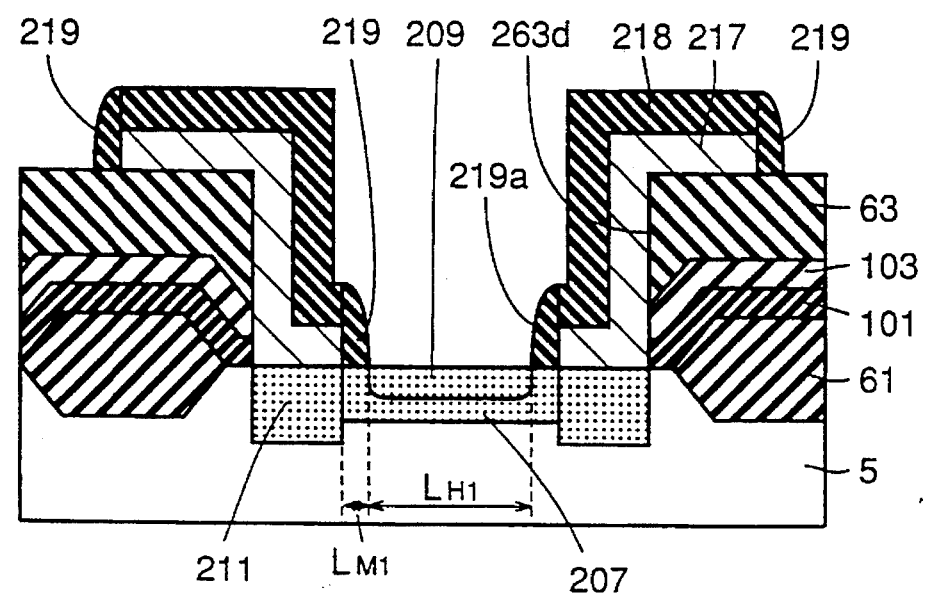
FIG. 61 is a schematic cross section showing a manner in which a side wall oxide film is formed in the third embodiment of the invention.
Figure 62:
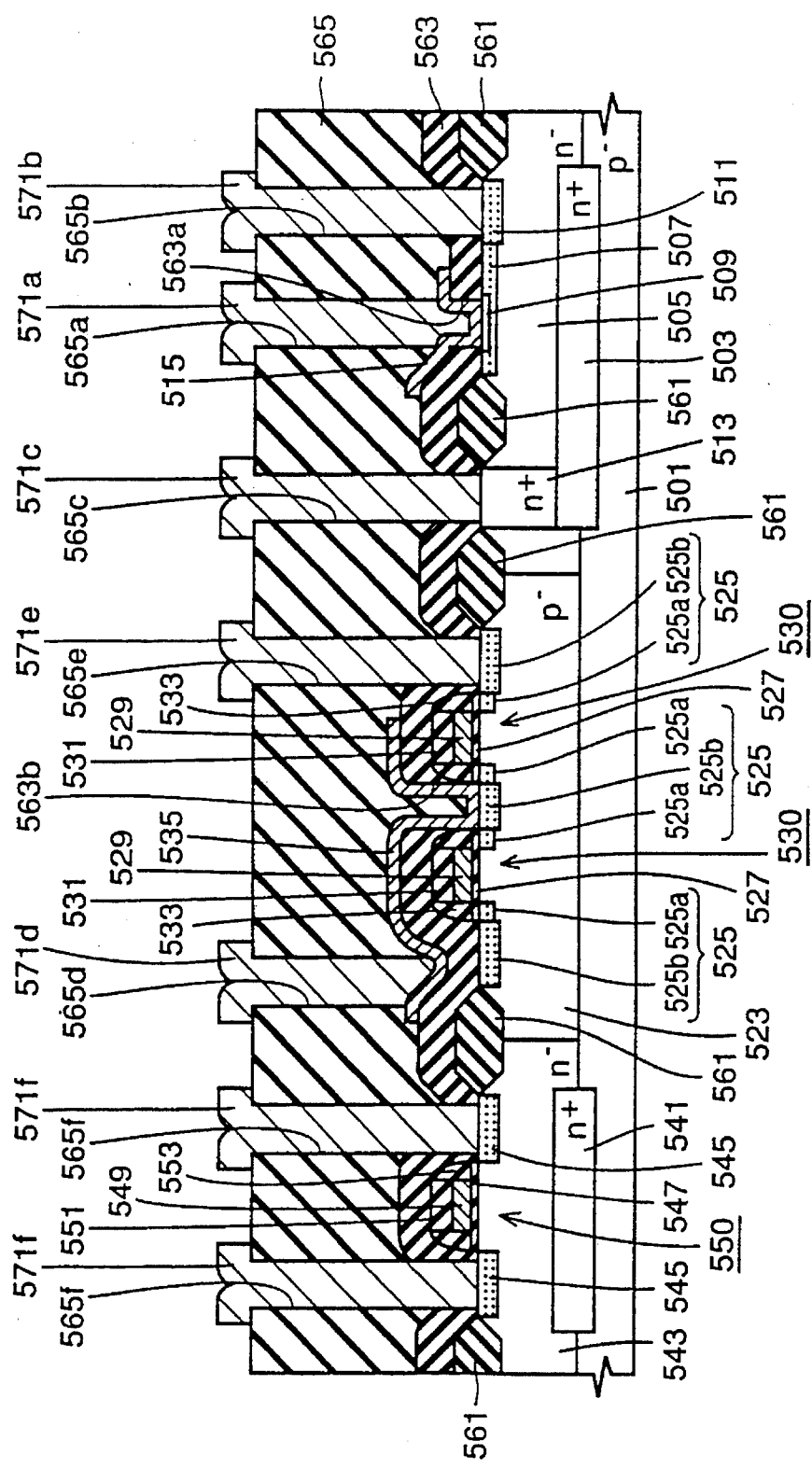
FIG. 62 is a schematic cross section showing a structure of a conventional semiconductor device.
Figure 63:
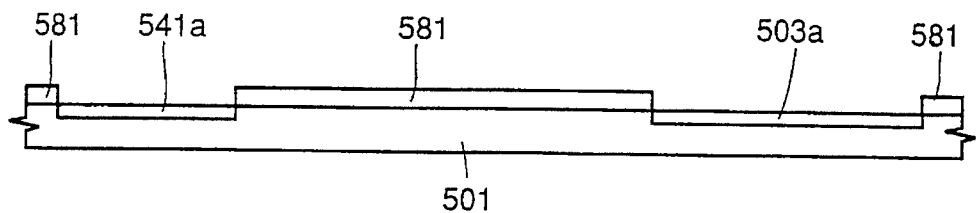
FIGS. 63 to 82 are schematic cross sections showing a process of manufacturing the conventional semiconductor device in accordance with the order of process steps.
Figure 64:
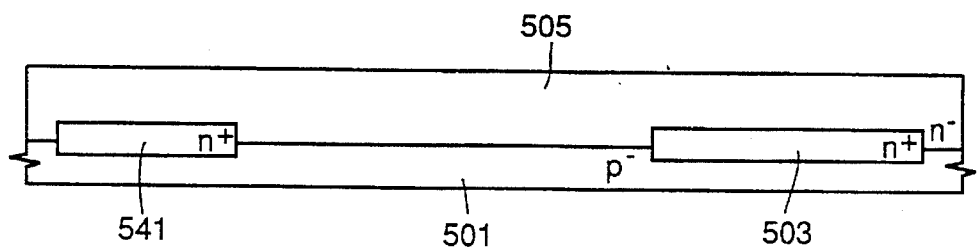
Figure 65:
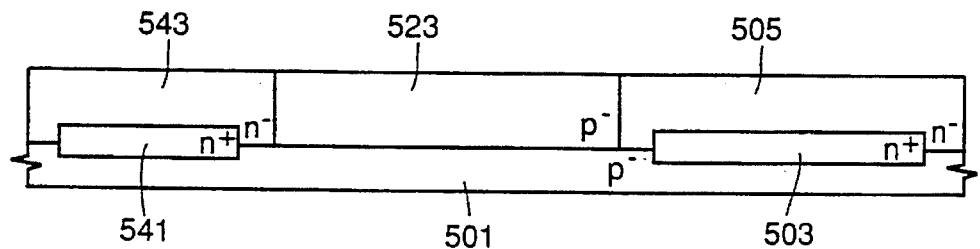
Figure 66:
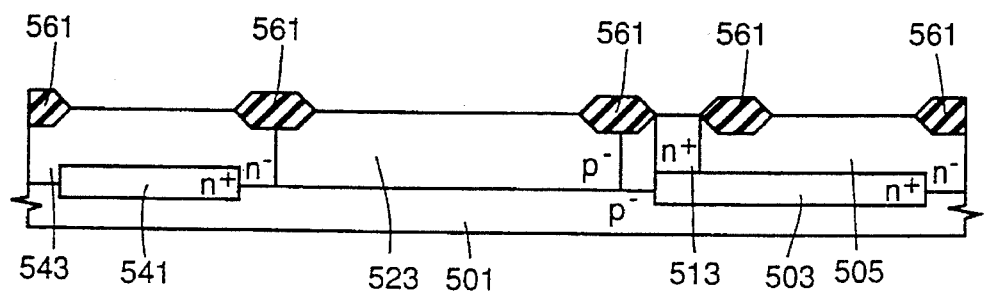
Figure 67:
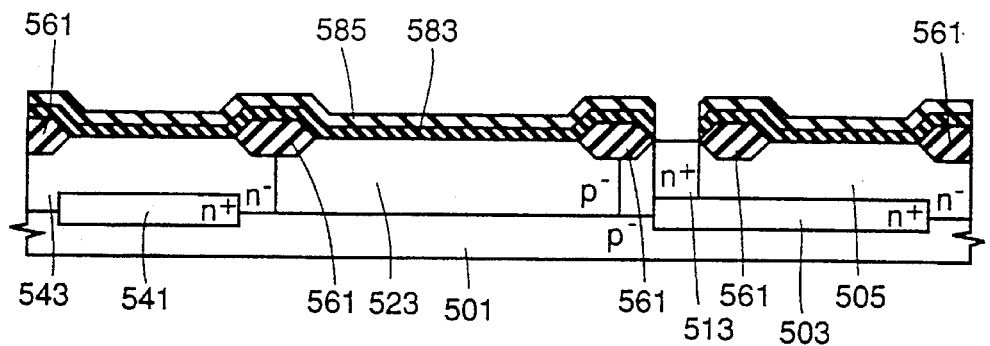
Figure 68:
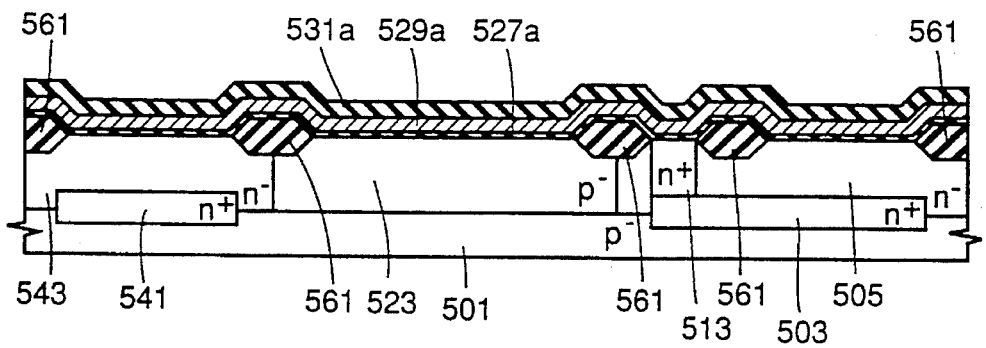

According to this embodiment, however, the end surface (side surface) 217e of base electrode 217 is covered with sidewall oxide film 219 as shown in FIG. 61. In forming sidewall oxide film 219, a mask is not required as already stated in connection with the process shown in FIG. 52, so that it is not necessary to take into account the misalignment of the mask. Therefore, distance $L_{M1}$ between base electrode 217 and emitter aperture 219a can be made smaller than the distance of possible misalignment of the overlapped mask.

Since n$^+$ emitter region 209 is formed using side wall oxide film 219 as a mask, a distance between p$^+$ external base region 211 and n$^+$ emitter region 209 decreases as distance $L_{m1}$ decreases. Therefore, a parasitic resistance (base resistance) generated between p$^+$ external base region 211 and n$^+$ emitter region 209 can be made small.

Since distance $L_{M1}$ between p$^+$ external base region 211 and n$^+$ emitter region 209 can be reduced, the degree of integration can be improved corresponding to the reduction of distance.

The first, second and third embodiments have been described in connection with the cases where emitter electrodes 15 and 215 and interconnection layer 35 are each formed of the single polycrystalline silicon film layer doped with phosphorus and where they are formed of the polycide structures each including the single polycrystalline silicon film layer doped with phosphorus. However, other structures may be employed. Emitter electrode 215 and interconnection layer 15 are required only to include polycrystalline silicon films doped with phosphorus at a predetermined concentration.

In the first, second and third embodiments, n$^+$ emitter regions 9 and 209 are formed by introducing impurity into p$^-$ base region 7 by ion implantation. However, different process may be employed. The n$^+$ emitter regions 9 and 209 may be formed by any method provided that they are formed prior to formation of emitter electrodes 15 and 215.

Further, the first, second and third embodiments, which have been described in connection with the Bi-CMOS structure, are not restricted to this. The invention can be applied to any semiconductor device including bipolar transistors.

The method of manufacturing the semiconductor device of the invention can prevent disadvantages such as punch through and deterioration of characteristics relating to resistance against hot electrons in the MOS transistor. Therefore, sizes of various portions such as a gate length in the MOS transistor can be reduced, and thus the degree of integration can be improved easily.

Since heat treatment by RTA can be eliminated, a disadvantage caused by the heat treatment can be prevented, and specifically it is possible to prevent a disadvantage that the emitter impurity region is formed deep in the base impurity region, and thereby the width of base impurity region decreases. Accordingly, the interconnection resistance of emitter electrode can be reduced while maintaining a good breakdown voltage characteristic.

According to the semiconductor device of the invention manufactured by the method described above, the concentration of phosphorus in the polycrystalline silicon film can be large. Accordingly, the concentration of phosphorus in the emitter electrode can be increased to at least $1 \times 10^{20}$ cm$^{-3}$, which cannot be attained in the prior art, and thus the interconnection resistance of emitter electrode can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate having a main surface;

a collector impurity region of a first conductivity type formed at the main surface of said semiconductor substrate;

a base impurity region of a second conductivity type formed at the main surface of said semiconductor substrate within said collector impurity region;

an emitter impurity region of the first conductivity type formed at the main surface of said semiconductor substrate within said base impurity region; and a conductive layer adjoining to said emitter impurity region, said conductive layer having a polycrystalline silicon layer substantially uniformly doped with phosphorus at a concentration of at least $1 \times 10^{20}$ cm$^{-3}$.

2. The semiconductor device according to claim 1, wherein said conductive layer is formed of a polycrystalline silicon layer doped with phosphorus, and said phosphorus is contained in said polycrystalline silicon layer at a concentration of at most $6 \times 10^{20}$ cm$^{-3}$.

3. The semiconductor device according to claim 1, wherein said conducive layer has a polycrystalline silicon layer doped with phosphorus and a silicide layer formed on said polycrystalline silicon layer, and said phosphorus is contained in said polycrystalline silicon layer at a concentration of at most $1 \times 10^{21}$ cm$^{-3}$.

4. The semiconductor device according to claim 1, further comprising:

a first insulating layer formed on the main surface of said semiconductor substrate;

a second insulating layer formed on said first insulating layer and having a different etch characteristic from said first insulating layer; and a third insulating layer formed on said second insulating layer having a different etch characteristic from said second insulating layer; wherein said first, second and third insulating layers have an aperture reaching said emitter impurity region, and said conductive layer is in contact with said emitter impurity region through said aperture.

5. The semiconductor device according to claim 4, wherein said first and third insulating layers each include a silicon oxide film, and said second insulating layer includes a silicon nitride film.

* * * * *